United States Patent
Kaneko et al.

(10) Patent No.: US 12,509,484 B2
(45) Date of Patent: Dec. 30, 2025

(54) METHOD OF PRODUCING NUCLEIC ACID COMPOUND, AND NUCLEIC ACID COMPOUND

(71) Applicant: FUJIFILM CORPORATION, Tokyo (JP)

(72) Inventors: Kazuhei Kaneko, Kanagawa (JP); Motomasa Takahashi, Kanagawa (JP)

(73) Assignee: FUJIFILM CORPORATION, Tokyo (JP)

( * ) Notice: Subject to any disclaimer, the term of this patent is extended or adjusted under 35 U.S.C. 154(b) by 865 days.

(21) Appl. No.: 17/679,104

(22) Filed: Feb. 24, 2022

(65) Prior Publication Data
US 2022/0259255 A1    Aug. 18, 2022

Related U.S. Application Data

(63) Continuation of application No. PCT/JP2020/032476, filed on Aug. 27, 2020.

(30) Foreign Application Priority Data

Aug. 29, 2019   (JP) ................. 2019-157402

(51) Int. Cl.
| | | |
|---|---|---|
| C07H 21/02 | (2006.01) | |
| C07H 1/00 | (2006.01) | |
| C07H 19/073 | (2006.01) | |

(52) U.S. Cl.
CPC .............. *C07H 21/02* (2013.01); *C07H 1/00* (2013.01); *C07H 19/073* (2013.01)

(58) Field of Classification Search
None
See application file for complete search history.

(56) References Cited

U.S. PATENT DOCUMENTS

| | | |
|---|---|---|
| 2,825,734 A | 3/1958 | Speeter et al. |
| 3,957,288 A | 5/1976 | Lemahieu et al. |
| 9,284,344 B2 | 3/2016 | Kim et al. |
| 2009/0299103 A1 | 12/2009 | Chiba et al. |
| 2010/0029904 A1 | 2/2010 | Chiba et al. |
| 2010/0240867 A1 | 9/2010 | Takahashi |
| 2010/0249374 A1 | 9/2010 | Takahashi |
| 2011/0160433 A1 | 6/2011 | Takahashi |
| 2012/0296074 A1 | 11/2012 | Hirai et al. |
| 2014/0046022 A1 | 2/2014 | Takahashi |
| 2014/0213761 A1 | 7/2014 | Takahashi |
| 2015/0112053 A1 | 4/2015 | Kim et al. |
| 2015/0315229 A1 | 11/2015 | Monogawa |
| 2016/0060198 A1 | 3/2016 | Takahashi |
| 2017/0320904 A1 | 11/2017 | Hirai et al. |
| 2018/0282365 A1* | 10/2018 | Hirai .......... C07H 1/00 |
| 2019/0023726 A1 | 1/2019 | Yano et al. |
| 2019/0031702 A1 | 1/2019 | Rohloff |
| 2019/0135852 A1 | 5/2019 | Monogawa et al. |
| 2019/0263842 A1 | 8/2019 | Yano et al. |
| 2021/0380633 A1 | 12/2021 | Yamamoto et al. |

(Continued)

FOREIGN PATENT DOCUMENTS

| | | |
|---|---|---|
| CN | 108473526 A | 8/2018 |
| EP | 4006045 A1 | 6/2022 |

(Continued)

OTHER PUBLICATIONS

English language translation of the following: Decision of Refusal dated Aug. 8, 2023 from the JPO in a Japanese patent application No. 2021-543021 corresponding to the instant patent application.
Office Action dated Oct. 12, 2022, issued by the CIPO in corresponding Canadian Patent Application No. 3,131,774.
Office Action dated Oct. 21, 2022, issued by the CIPO in corresponding Canadian Patent Application No. 3,131,772.
English language translation of the following: Decision of Refusal dated Nov. 22, 2022 from the JPO in a Japanese patent application No. 2021-502270 corresponding to the instant patent application.
Office action dated Jun. 15, 2022 from the IPO in a Indian patent application No. 202247000909 corresponding to the instant patent application.

(Continued)

*Primary Examiner* — Traviss C Mcintosh, III

(74) *Attorney, Agent, or Firm* — SOLARIS Intellectual Property Group, PLLC

(57) ABSTRACT

There are provided a method of producing a nucleic acid compound, in which a nucleic acid compound in which any one of a 3-position or a 5-position of a ribose structure is protected by a structure represented by Formula (1), and the nucleic acid compound. In Formula (1), a ring A represents a condensed polycyclic aromatic hydrocarbon ring or an aromatic heterocyclic ring, $Y^A$'s each independently represent $-OCR_2-$, $-NRCR_2-$, or $-SCR_2-$, R's each independently represent a hydrogen atom, an alkyl group, an aromatic group, or an aromatic group-substituted alkyl group, k represents an integer of 1 to 5, $R^A$'s are each independently an aliphatic hydrocarbon group or an organic group having an aliphatic hydrocarbon group, at least one aliphatic hydrocarbon group in k pieces of $R^A$'s has 12 or more carbon atoms, and the ring A may further have a substituent in addition to $Y^A$ and $R^A$.

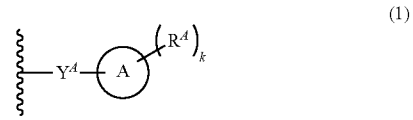

(1)

15 Claims, No Drawings

(56) References Cited

U.S. PATENT DOCUMENTS

| | | |
|---|---|---|
| 2021/0380634 A1 | 12/2021 | Yamamoto et al. |
| 2022/0112233 A1 | 4/2022 | Yamamoto et al. |

FOREIGN PATENT DOCUMENTS

| | | | |
|---|---|---|---|
| JP | S49-98642 A | 9/1974 | |
| JP | S60-252441 A | 12/1985 | |
| JP | H06-271577 A | 9/1994 | |
| JP | 2000-44493 A | 2/2000 | |
| JP | 2009-185063 A | 8/2009 | |
| JP | 5979139 B2 | 8/2016 | |
| JP | 2016-179993 A | 10/2016 | |
| JP | 2019-035775 A | 3/2019 | |
| JP | 2019-0122489 A | 7/2019 | |
| TW | 201734030 A | 10/2017 | |
| WO | 9732837 A1 | 9/1997 | |
| WO | 2004/067522 A1 | 8/2004 | |
| WO | 2007/034812 A1 | 3/2007 | |
| WO | 2010/104169 A1 | 9/2010 | |
| WO | 2010/113939 A1 | 10/2010 | |
| WO | 2011/078295 A1 | 6/2011 | |
| WO | 2012/157723 A1 | 11/2012 | |
| WO | 2013/159863 A1 | 10/2013 | |
| WO | 2013/179412 A1 | 12/2013 | |
| WO | 2014/077292 A1 | 5/2014 | |
| WO | 2015168461 A2 | 11/2015 | |
| WO | 2016/117663 A1 | 7/2016 | |
| WO | 2017/038650 A1 | 3/2017 | |
| WO | 2017/104836 A1 | 6/2017 | |
| WO | 2018/021233 A1 | 2/2018 | |
| WO | 2018/203574 A1 | 11/2018 | |
| WO | 2018/212236 A1 | 11/2018 | |
| WO | 2020175472 A1 | 9/2020 | |
| WO | 2020175473 A1 | 9/2020 | |
| WO | 2020/262258 A1 | 12/2020 | |

OTHER PUBLICATIONS

Murayama et al., "Enantioselective Synthesis, Crystal Structure, and Photophysical Properties of a 1, 1'-Bitriphenylene-Based Sila[7]helicene", Eur. J. Org. Chem., 2015, pp. 1409-1414.

Takahashi et al., "Evaluation of energy transfer in perylene-cored anthracene dendrimers", Chem. Commun., 2006, pp. 3084-3086.

Non-Final Office Action issued by USPTO on Sep. 14, 2023, in related U.S. Appl. No. 17/408,474.

Notice to comply with requirements for patent applications containing nucleotide and/or amino acid sequence disclosures issued by USPTO on Jul. 3, 2023, in related U.S. Appl. No. 17/409,692.

English language translation of the following: Office action dated May 10, 2022 from the JPO in a Japanese patent application No. 2021-502269 corresponding to the instant patent application.

Bolsinger, Michael et al., "Poly (3,6-carbazolylmethylene)s with flourinated and nonflourinated tapered building side groups", Polymer Bulletin 38, pp. 117-124, 1997, Germany.

English language translation of the following: Office action dated Feb. 15, 2024 from the TIPO in a Taiwan patent application No. 109106449 corresponding to the instant patent application.

English language translation of the following: Office action dated Feb. 23, 2024 from the KIPO in a Korean patent application No. 10-2021-7027562 corresponding to the instant patent.

Office Action dated Jun. 27, 2024, issued by the EPO in corresponding EP Patent Application No. 20763669.7.

Extended European Search Report dated Sep. 15, 2022, issued in corresponding EP Patent Application No. 20858185.0.

English language translation of the following: Office action dated Sep. 27, 2022, from the JPO in a Japanese patent application No. 2021-526941 corresponding to the instant patent application.

Office Action dated Mar. 26, 2024, issued by the EPO in corresponding EP Patent Application No. 20763894.1.

English language translation of the following: Office action dated Apr. 18, 2024 from the TIPO in a Taiwan patent application No. 109129448 corresponding to the instant patent application.

English language translation of the following: Office action dated Apr. 22, 2024 from the TIPO in a Taiwan patent application No. 109121462 corresponding to the instant patent application.

English language translation of the following: Office action dated May 24, 2022 from the JPO in a Japanese patent application No. 2021-502270 corresponding to the instant patent application.

Murayama, K. et al., "Synthesis, Structure, and Photophysical/Chiroptical Properties of bBnzopicene-Based π-Conjugated Molecules", Journal of Organic Chemistry, 2017, vol. 82, No. 2, pp. 1136-1144.

Rasale, D. B. et al., "Lipase catalyzed inclusio of gastrodigenin for the evolution of blue light emitting peptide nanofibers", Chemical Communications, 2014, vol. 50, No. 63, pp. 8685-8688, Royal Society of Chemistry.

Kaucher, M. S. et al., "Selective Transport of Water Mediated by Porous Dendritic Dipeptides", Journal of the American Chemical Society, 2007, vol. 129, pp. 11698-11699.

Ishigaki, Y. et al., "Three-way output molecular response system based on tetrakis (3,4-dialkoxyphenyl)-3,4-dihydro [5] helicenes: Perturbation of properties by long alkyl chains", Heterocycles, 2015, vol. 90, No. 1, pp. 126-135.

International Search Report issued in International Application No. PCT/JP2020/024231 on Sep. 8, 2020.

Written Opinion of the ISA issued in International Application No. PCT/JP2020/024231 on Sep. 8, 2020.

Extended European Search Report dated Mar. 17, 2022, issued in corresponding EP Patent Application No. 20763669.7.

Registry (STN) [ online ] , Jan. 27, 1993 [ retrieval date: May 7, 2020 ] CAS: 145543-42-6 entire text, structural formulas.

Registry ( STN ) [ online ] , Jan. 27, 1993 [ retrieval date : May 7, 2020 ] CAS: 145543-43-7 entire text, structural formulas.

Registry ( STN ) [online] , Sep. 18, 2013 [Retrieval date: May 7, 2020] CAS: 1452164-35-0 entire text , structural formulas.

Torikai, K. et al. , "N (π)-2-Naphthylmethoxymethyl-Protected Histidines: Scalable, Racemizaion-Free Building Blocks for Peptide Synthesis", Organic Process Research & Development, Feb. 19, 2020 vol. 24, No. 3, p. 448-453.

International Search Report issued in International Application No. PCT/JP2020/007477 on Jun. 2, 2020.

Written Opinion of the ISA issued in International Application No. PCT/JP2020/007477 on Jun. 2, 2020.

International Search Report issued in International Application No. PCT/JP2020/007478 on Jun. 2, 2020.

Written Opinion of the ISA issued in International Application No. PCT/JP2020/007478 on Jun. 2, 2020.

Mizuno, Mamoru et al., "Fluorous Glycopeptide Synthesis without Protection of Sugar Hydroxy Groups", Laboratory of Glycoorganic Chemistry, The Noguchi Institute, Chemistry Letters vol. 34, No. 3, pp. 426-427, Feb. 22, 2005, retrieved from https://doi.org/10.1246/cl.2005.426.

Office action dated Oct. 28, 2021 from the IPO in a Indian patent application No. 202147038838 corresponding to the instant patent application.

Christiansen, Jan et al., "Amino-acids and peptides. Part 46. Synthesis of Bradykinin Analogues Modified in the Vicinity of the Carboxy-group", Journal of the Chemical Society, Perkin Transactions 1, Jan. 1, 1982, p. 1229, Cambridge, UK.

Mironov, A. F. et al., "Synthesis and some transformations of pyrroles with aliphatic acyl substituents", Chemistry of Heterocyclic Compounds, vol. 9, No. Jan. 1, 1973, pp. 22-25. Retrieved from URL:https://link.springer.com/content/pdf/10.1007/BF00476141.pdf>.

Treibs, Alfred et al., "Synthese von tert.-Butyl-und Octadecylätioporphyrin", Justus Liebigs Ann. Chem., Jan. 1, 1971, pp. 127-134, Retrieved from URL:https//chemistry-europe.onlinelibrary.wiley.com/doi/10.1002/jlac.19717510115.

Greenhouse, Robert et al., "Synthesis of Alkylpyrroles by the Sodium Borohydride Reduction of Acylpyrroles", Journal of Organic Chemistry, vol. 50, No. 16, Jan. 1, 1985, pp. 2961-2965, Retrieved from URL:https://pubs.acs.org/doi/pdf/10.1021/jo00216a030>.

Gypser, Andreas et al., "The solvent dependence of the diastereoselective hydrogenation of 2- and 2,5-substituted furylcarbinols on a Raney nickel contact", Synthesis, No. 3, Jan. 1, 1996, pp. 349-352.

(56) References Cited

OTHER PUBLICATIONS

Murali, Maluvadi G. et al., "Thiophene-based donor-acceptor conjugated polymer as potential optoelectronic and photonic material", Journal of Chemistry Science, Indian Academy of Sciences, Springer New Delhi, India, vol. 125, No. 2, Apr. 16, 2013, pp. 247-257.
Murashima, T. et al., "Highly Soluble Poly (1,3, 4-trisubstituted-2,5-pyrrolenevinylenes)", Tetrahedron Letters, Elsevier, Amsterdam, NL, vol. 39, No. 30, Jul. 23, 1998, pp. 5397-5400.
Niebel, Claude et al., "Bridged 3,3"-didodecylquaterthiophene-based dimers: design, synthesis, and optoelectronic properties", Tetrahedron, Elsevier, Science Publishers, Amsterdam, NL, vol. 68, No. 27, Apr. 19, 2012, pp. 5599-5605.
Extended European Search Report dated Feb. 18, 2022, issued in corresponding EP Patent Application No. 20763894.1.
International Search Report issued in International Application No. PCT/JP2020/032476 on Oct. 13, 2020.
Written Opinion of the ISA issued in International Application No. PCT/JP2020/032476 on Oct. 13, 2020.
English language translation of the following: Decision of Refusal dated Jun. 4, 2024 from the JPO in a Japanese patent application No. 2023-026563 corresponding to the instant patent application.
Non-Final Office Action issued by USPTO on Jan. 28, 2025, in related U.S. Appl. No. 17/408,474.
Final Office Action issued by USPTO on Aug. 15, 2024, in related U.S. Appl. No. 17/409,692.
Office action dated Nov. 15, 2023 from the IPO in a Indian patent application No. 202247000909 corresponding to the instant patent application.
Office action dated Jul. 11, 2022, from the IPO in a Indian patent application No. 202147038861 corresponding to the Instant patent application.
English language translation of the following: Office action dated Feb. 28, 2023 from the JPO in a Japanese patent application No. 2021-543021 corresponding to the instant patent application.
Restriction Requirement /Election issued by USPTO on Mar. 21, 2024, in related U.S. Appl. No. 17/409,692.
Extended European Search Report dated Jun. 23, 2022, issued in corresponding EP Patent Application No. 20831790.9.
English language translation of the following: Office action dated Nov. 19, 2024 from the TIPO in a Taiwan patent application No. 109106390 corresponding to the instant patent application.
Notice regarding a non-compliant or non-responsive amendment issued by USPTO on May 15, 2023, in related U.S. Appl. No. 17/408,474.
English language translation of the following: Office action dated Aug. 25, 2023 from the KIPO in a Korean patent application No. 10-2021-7027562 corresponding to the instant patent.
English language translation of the following: Office action dated Aug. 25, 2023 from the KIPO in a Korean patent application No. 10-2021-7028084 corresponding to the instant patent.
Non-Final Office Action issued by USPTO on Jun. 27, 2024, in related U.S. Appl. No. 17/409,692.
English language translation of the following: Office action dated Dec. 19, 2023 from the JPO in a Japanese patent application No. 2023-026563 corresponding to the instant patent application.
English language translation of the following: Notice of Termination of Reconsideration by Examiners before Appeal Proceedings dated May 9, 2023 from the JPO in a Japanese patent application No. 2021-502270 corresponding to the instant patent application.
Yen-Ju Cheng et al., "Carbazole-Based Ladder-Type Heptacylic Arene with Aliphatic Side Chains Leading to Enhanced Efficiency of Organic Photovoltaics", Chemistry of Materials, 23(9), 2011, pp. 2361-2369, XP055121925, Department of Applied Chemistry, National Chiao Tung University, Taiwan.
Ravi Kumar Cheedarala et al., "Ladder-type heteroacene polymers bearing carbazole and thiophene ring units and their use in field-effect transistors and photovoltaic cells", Journal of Materials Chemistry, 21(3), 2011, pp. 843-850, XP093048796.
Chia Juan Lim et al., "Synthesis and characterization of three thienopyridazine-based copolymers and their application in OFET", Tetrahedron Letters. 57(14), 2016, pp. 1523-1527, XP029442306, published by Elsevier Ltd.
Office Action dated May 30, 2023, issued by the EPO in corresponding EP Patent Application No. 20763894.1.
English language translation of the following: Office action dated Jan. 7, 2025 from the JPO in a Japanese patent application No. 2023-191159 corresponding to the instant patent application.
Final Office Action issued by USPTO on Jun. 26, 2025, in related U.S. Appl. No. 17/408,474.
Restriction Requirement issued by USPTO on Feb. 14, 2025, in related U.S. Appl. No. 17/558,540.
Ryall, R. P. et al., "Substituted Vitamin K Epoxide Analogues. New Competitive Inhibitors and Substrates of Vitamin K1 Epoxide Reductase", J. Med. Chem. 1990, 33, 1790-1797 (Year: 1990).
Machine translation of WO1997032837A1, Sep. 12, 1997, pp. 1-59 (Year: 1997).
Non-Final Office Action issued by USPTO on Apr. 15, 2025, in related U.S. Appl. No. 17/558,540.
Ryan, H. et al. "Montanic Acid and its Derivatives" Proc. Roy. Irish Acad. 1913, 30, 97-105; Abstract only and CAS registry obtained from SciFinder (Year: 1913).
Final Office Action issued by USPTO on Sep. 4, 2025, in related U.S. Appl. No. 17/558,540.
English language translation of the following: Office action dated Sep. 30, 2025 from the JPO in a Japanese patent application No. 2024-152735 corresponding to the instant patent application.

\* cited by examiner

METHOD OF PRODUCING NUCLEIC ACID COMPOUND, AND NUCLEIC ACID COMPOUND

CROSS-REFERENCE TO RELATED APPLICATIONS

This application is a continuation application of International Application No. PCT/JP2020/032476, filed Aug. 27, 2020, the disclosure of which is incorporated herein by reference in its entirety. Further, this application claims priority from Japanese Patent Application No. 2019-157402, filed Aug. 29, 2019, the disclosure of which is incorporated herein by reference in its entirety.

BACKGROUND OF THE INVENTION

1. Field of the Invention

The present disclosure relates to a method of producing a nucleic acid compound, and a nucleic acid compound.

2. Description of the Related Art

Methods of synthesizing an oligonucleotide include a phosphoric acid triester method, an H-phosphonate method, a phosphoramidite method, and the like, and at present, solid-phase synthesis using the phosphoramidite method (a solid-phase method) is most widely used.

The solid-phase method has been process-optimized and automated, which is advantageous in terms of speed. However, there have been restrictions on scale-up due to equipment restrictions, and there have also been problems in that excessive reagents and raw materials are used and that it is difficult to check the progress state of the reaction in the middle stage and analyze structures of intermediates.

A liquid phase method has advantages in that it is good in reactivity and that intermediates can be purified by extraction and washing, isolation, or the like after the condensation reaction. However, the operation thereof is complicated since an extraction and washing step for removing residual reagents and by-products, or an isolation and purification step such as crystallization is required, and furthermore, the yield is low. For these reasons, it has been difficult to massively and quickly synthesize oligonucleotides having a high degree of polymerization.

In addition, as the synthesis method in the related art, a method of synthesizing an oligonucleotide disclosed in JP2016-179993A or WO2014/077292A is known.

SUMMARY OF THE INVENTION

According to one aspect of the present invention, a method of producing a nucleic acid compound having an excellent yield is provided.

In addition, according to another aspect of the present invention, a novel nucleic acid compound is provided.

The means for achieving the above objects include the following aspects.

<1> A method of producing a nucleic acid compound, in which a nucleic acid compound in which any one of a 3-position or a 5-position of a ribose structure is protected by a structure represented by Formula (1) is used.

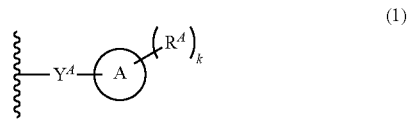

In Formula (1), a ring A represents a condensed polycyclic aromatic hydrocarbon ring or an aromatic heterocyclic ring,
$Y^A$ represents *—$OCR_2$—**, *—$NRCR_2$—**, or *—$SCR_2$—**, where R's each independently represent a hydrogen atom, an alkyl group, an aromatic group, or an aromatic group-substituted alkyl group,
k represents an integer of 1 to 5,
a wavy line portion and * represent a bonding position to another structure,
** represents a bonding position to the ring A,
$R^A$'s are each independently an aliphatic hydrocarbon group or an organic group having an aliphatic hydrocarbon group, where at least one aliphatic hydrocarbon group in k pieces of $R^A$'s has 12 or more carbon atoms, and
the ring A may further have a substituent in addition to $Y^A$ and $R^A$.

<2> The method of producing a nucleic acid compound according to <1>, in which the nucleic acid compound protected by the structure represented by Formula (1) is a compound represented by Formula (2).

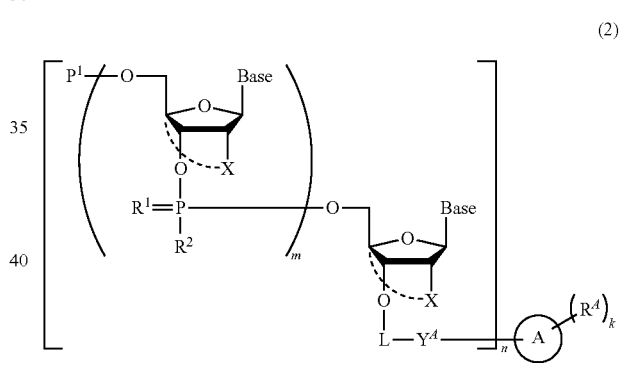

In Formula (2), m represents any integer of 0 or more,
n represents 1 to 6,
Bases each independently represent a nucleic acid base or a modified nucleic acid base,
$P^1$ represents a hydrogen atom or a hydroxy protective group,
$R^1$ represents an oxygen atom, a sulfur atom, or a borano group,
$R^2$ represents a hydrogen atom, a substituted or unsubstituted hydroxy group, a substituted or unsubstituted mercapto group, a substituted or unsubstituted alkyl group, or a substituted or unsubstituted amino group,
X's each independently represent a hydrogen atom, a hydroxy group, a halogen atom, or an organic group that is crosslinked to a carbon atom at a 4'-position of a ribose structure,
L's each independently represent a single bond or a divalent linking group,
the ring A represents a condensed polycyclic aromatic hydrocarbon ring or an aromatic heterocyclic ring,
$Y^A$'s each independently represent a single bond, *—$OCR_2$—**, *—$NRCR_2$—**, or *—$SCR_2$—**, where * represents a bonding position to L,
** represents a bonding position to the ring A,
R's each independently represent a hydrogen atom, an alkyl group, an aromatic group, or an aromatic group-substituted alkyl group,
k represents an integer of 1 to 5,
$R^A$'s are each independently an aliphatic hydrocarbon group or an organic group having an aliphatic hydrocarbon group, where at least one aliphatic hydrocarbon group in k pieces of $R^A$'s has 12 or more carbon atoms, and
the ring A may further have a substituent in addition to $Y^A$ and $R^A$.

<3> The method of producing a nucleic acid compound according to <2>, in which $R^1$ in Formula (2) is an oxygen atom or a sulfur atom, and $R^2$ is a hydroxy group.

<4> The method of producing a nucleic acid compound according to any one of <1> to <3>, in which $P^1$ represents a hydroxy protective group capable of being deprotected by a weak acid, and a liquid phase synthesis method is used, where the method includes in the following order;
a step A: a step of deprotecting a terminal protective group at a 5-position of a ribose structure in a nucleic acid compound in which the structure represented by Formula (1) is bonded to a terminal at a 3-position of the ribose structure,
a step B: a step of reacting the nucleic acid compound obtained in the step A and a nucleic acid compound in which a 3-position of a ribose structure is subjected to phosphoramidation and a hydroxy group at a 5-position of the ribose structure is protected by a protective group capable of being deprotected by a weak acid, to be condensed by a phosphite triester bond,
a step C: a step of reacting the nucleic acid compound obtained in the step B with an oxidizing agent or a sulfurizing agent to convert the phosphite triester bond of the nucleic acid compound into a phosphate triester bond or a thiophosphate triester bond, and
a step D: a step of precipitating the nucleic acid compound obtained in the step C.

<5> The method of producing a nucleic acid compound according to any one of <1> to <3>, in which P1 represents a hydrogen atom, and a liquid phase synthesis method is used, where the method includes in the following order;
a step B: a step of reacting the nucleic acid compound in which the structure represented by Formula (1) is bonded to a terminal at a 3-position of a ribose structure, and a nucleic acid compound in which a 3-position of a ribose structure is subjected to phosphoramidation and a hydroxy group at a 5-position of the ribose structure is protected by a protective group capable of being deprotected by a weak acid, to be condensed by a phosphite triester bond,
a step C: a step of reacting the nucleic acid compound obtained in the step B with an oxidizing agent or a sulfurizing agent to convert the phosphite triester bond of the nucleic acid compound into a phosphate triester bond or a thiophosphate triester bond,
a step A: a step of deprotecting a terminal protective group at a 5-position of the nucleic acid compound obtained in the step C, and
a step D: a step of precipitating the nucleic acid compound obtained in the step A.

<6> The method of producing a nucleic acid compound according to <2> or <3>, in which L in Formula (2) is a group represented by Formula (1L).

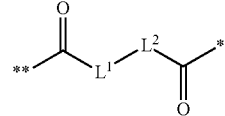

In Formula (1L), * represents a bonding position to $Y^A$,
** represents a bonding position to an oxygen atom at a 3-position of a ribose structure,
$L^1$ represents an alkylene group having 1 to 22 carbon atoms,
$L^2$ represents a single bond or #—C(=O)N($R^{2L}$)—$R^{1L}$—N($R^{3L}$)—##,
# represents a bonding position to $L^1$,
represents a bonding position to C=O,
$R^{1L}$ represents an alkylene group having 1 to 22 carbon atoms,
$R^{2L}$ and $R^{3L}$ each independently represent a hydrogen atom or an alkyl group having 1 to 22 carbon atoms, and
$R^{2L}$ and $R^{3L}$ may be bonded to each other to form an alkylene group having 1 to 22 carbon atoms.

<7> The method of producing a nucleic acid compound according to any one of <1> to <6>, in which the ring A in the structure represented by Formula (1) is a naphthalene ring.

<8> The method of producing a nucleic acid compound according to any one of <1> to <7>, in which the total number of carbon atoms of all aliphatic hydrocarbon groups contained in all $R^A$'s is 36 to 80.

<9> The method of producing a nucleic acid compound according to any one of <1> to <8>, in which the structure represented by Formula (1) has a structure represented by any one of Formulae (10) to (30).

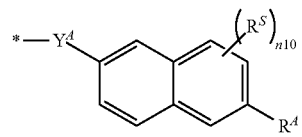

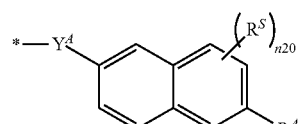

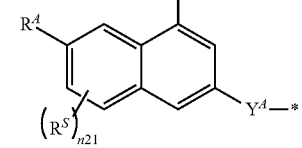

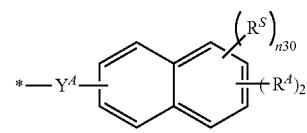

In Formula (10), Formula (20), or Formula (30), $Y^A$'s each independently represent *—OCR$_2$—**, *—NRCR$_2$—**, or *—SCR$_2$—,  represents a bonding position to a condensed polycyclic aromatic hydrocarbon ring, * represents a bonding position to another structure, R's each independently represent a hydrogen atom, an alkyl group, an aromatic group, or an aromatic group-substituted alkyl group, $R^A$'s are each independently an aliphatic hydrocarbon group or an organic group having an aliphatic hydrocarbon group, where at least one aliphatic hydrocarbon group in one $R^A$ or two $R^A$'s has 12 or more carbon atoms, $R^S$'s each independently represent a substituent, n10 represents an integer of 0 to 6, and n20, n21, and n30 each independently represent an integer of 0 to 5.

<10> The method of producing a nucleic acid compound according to <9>, in which $R^A$'s in Formula (10), Formula (20), or Formula (30) are each independently a group represented by Formula (f1) or Formula (a1).

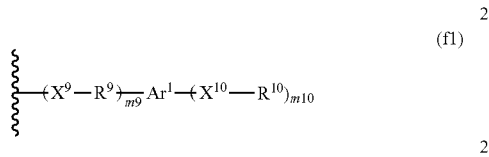

(f1)

In Formula (f1), a wavy line portion represents a bonding position to another structure, m9 represents an integer of 1 to 3, $X^9$'s each independently represent a single bond, —O—, —S—, —COO—, —OCO—, —OCONH—, —NHCONH—, —NHCO—, or —CONH—, $R^9$'s each independently represent a divalent aliphatic hydrocarbon group, $Ar^1$ represents an (m10+1)-valent aromatic group or an (m10+1)-valent heteroaromatic group, where m10 represents an integer of 1 to 3, $X^{10}$'s each independently represent a single bond, —O—, —S—, —COO—, —OCO—, —OCONH—, —NHCONH—, —NHCO—, or —CONH—, and $R^{10}$'s each independently represent a monovalent aliphatic hydrocarbon group having 5 or more carbon atoms.

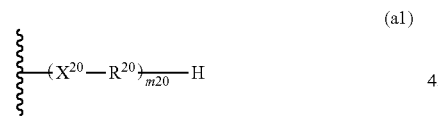

(a1)

In Formula (a1), a wavy line portion represents a bonding position to another structure, m20 represents an integer of 1 to 10, $X^{20}$'s each independently represent a single bond, —O—, —S—, —COO—, —OCO—, —OCONH—, —NHCONH—, —NHCO—, or —CONH—, and $R^{20}$'s each independently represent a divalent aliphatic hydrocarbon group, where at least one $R^{20}$ is a divalent aliphatic hydrocarbon group having 5 or more carbon atoms.

<11> The method of producing a nucleic acid compound according to <10>, in which the group represented by Formula (f1) is a group represented by Formula (f2).

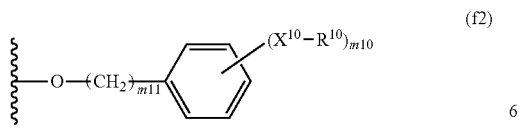

(f2)

In Formula (f2), a wavy line portion represents a bonding position to another structure, m10 represents an integer of 1 to 3, m11 represents an integer of 1 to 3, $X^{10}$'s each independently represent a single bond, —O—, —S—, —COO—, —OCO—, —OCONH—, —NHCONH—, —NHCO—, or —CONH—, and $R^{10}$'s each independently represent a monovalent aliphatic hydrocarbon group having 5 or more carbon atoms.

<12> The method of producing a nucleic acid compound according to any one of <1> to <6>, in which the ring A in the structure represented by Formula (1) has an indole ring or a carbazole ring.

<13> The method of producing a nucleic acid compound according to any one of <1> to <6> or <12>, in which the ring A in the structure represented by Formula (1) is a structure represented by Formula (40).

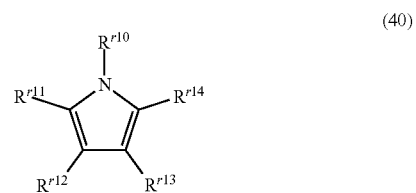

(40)

In Formula (40), Rr represents a substituent or $R^A$, $R^{r11}$ to $R^{r14}$ each independently represent a hydrogen atom, a substituent, $Y^A$, or $R^A$, $Y^A$'s each independently represent *—OCR$_2$—**, *—NRCR$_2$—**, or *—SCR$_2$—,  represents a bonding position to a ring A, * represents a bonding position to another structure, R's each independently represent a hydrogen atom, an alkyl group, an aromatic group, or an aromatic group-substituted alkyl group, provided that at least one of $R^{r11}$ to $R^{r14}$ is $Y^A$, $R^A$'s are each independently an aliphatic hydrocarbon group or an organic group having an aliphatic hydrocarbon group, where at least one aliphatic hydrocarbon group in one or more $R^A$'s has 12 or more carbon atoms, and $R^{r11}$ and $R^{r12}$, or $R^{r13}$ and $R^{r14}$ may each independently be linked to each other to form a ring.

<14> The method of producing a nucleic acid compound according to any one of <1> to <6>, <12>, or <13>, in which the structure represented by Formula (1) is a structure represented by any one of Formulae (400) or (50).

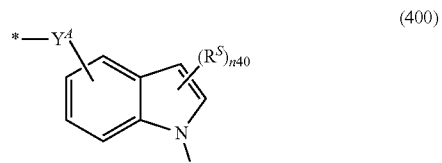

(400)

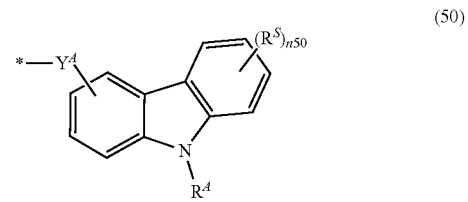

(50)

In Formula (400) or Formula (50), $Y^A$'s each independently represent *—OCR$_2$—**, *—NRCR$_2$—**, or *—SCR$_2$—,  represents a bonding position to an aromatic heterocyclic ring, * represents a bonding position to another structure, R's each independently represent a hydrogen atom, an alkyl group, an aromatic group, or an aromatic group-substituted alkyl group, $R^A$'s are each independently an aliphatic hydrocarbon group or an organic group having an aliphatic hydrocarbon group, where at least one aliphatic hydrocarbon group in one $R^A$ has 12 or more carbon atoms, $R^S$'s each independently represent a substituent, n40 represents an integer of 0 to 5, and n50 represents an integer of 0 to 7.

<15> The method of producing a nucleic acid compound according to any one of <1> to <6> or <12> to <14>, in which the at least one aliphatic hydrocarbon group in the one or more $R^A$'s has 14 or more carbon atoms.

<16> The method of producing a nucleic acid compound according to any one of <1> to <6> or <12> to <15>, in which the total number of carbon atoms of all aliphatic hydrocarbon groups contained in all $R^A$'s is 40 or more.

<17> The method of producing a nucleic acid compound according to <14>, in which $R^A$'s in Formula (400) or Formula (50) are each independently a group represented by Formula (f1) or Formula (a1).

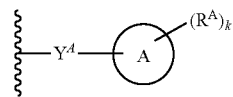
(f1)

In Formula (f1), a wavy line portion represents a bonding position to another structure, m9 represents an integer of 1 to 3, $X^9$'s each independently represent a single bond, —O—, —S—, —COO—, —OCO—, —OCONH—, —NHCONH—, —NHCO—, or —CONH—, $R^9$'s each independently represent a divalent aliphatic hydrocarbon group, $Ar^1$ represents an (m10+1)-valent aromatic group or an (m10+1)-valent heteroaromatic group, where m10 represents an integer of 1 to 3, $X^{10}$'s each independently represent a single bond, —O—, —S—, —COO—, —OCO—, —OCONH—, —NHCONH—, —NHCO—, or —CONH—, and $R^{10}$'s each independently represent a monovalent aliphatic hydrocarbon group having 5 or more carbon atoms.

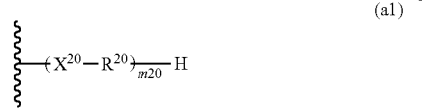
(a1)

In Formula (a1), a wavy line portion represents a bonding position to another structure, m20 represents an integer of 1 to 10, $X^{20}$'s each independently represent a single bond, —O—, —S—, —COO—, —OCO—, —OCONH—, —NHCONH—, —NHCO—, or —CONH—, and $R^{20}$'s each independently represent a divalent aliphatic hydrocarbon group, where at least one $R^{20}$ is a divalent aliphatic hydrocarbon group having 5 or more carbon atoms.

<18> The method of producing a nucleic acid compound according to <17>, in which the group represented by Formula (f1) is a group represented by Formula (f2).

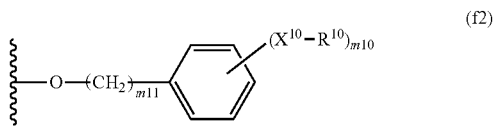
(f2)

In Formula (f2), a wavy line portion represents a bonding position to another structure, m10 represents an integer of 1 to 3, m11 represents an integer of 1 to 3, $X^{10}$'s each independently represent a single bond, —O—, —S—, —COO—, —OCO—, —OCONH—, —NHCONH—, —NHCO—, or —CONH—, and $R^{10}$'s each independently represent a monovalent aliphatic hydrocarbon group having 5 or more carbon atoms.

<19> A nucleic acid compound, in which a hydroxy group of any one of a 3-position or a 5-position of a ribose structure is protected by a structure represented by Formula (1a).

(1a)

In Formula (1a), a ring A represents a condensed polycyclic aromatic hydrocarbon ring or an aromatic heterocyclic ring, $Y^A$ represents *—OCR$_2$—**, *—NRCR$_2$—**, or *—SCR$_2$—**, R's each independently represent a hydrogen atom, an alkyl group, an aromatic group, or an aromatic group-substituted alkyl group, k represents an integer of 1 to 5, a wavy line portion and * represent a bonding position to a hydroxy group at a 3-position or 5-position of a ribose structure or a bonding position to another structure,

** represents a bonding position to a ring A, $R^A$'s are each independently an aliphatic hydrocarbon group or an organic group having an aliphatic hydrocarbon group, where at least one aliphatic hydrocarbon group in k pieces of $R^A$'s has 12 or more carbon atoms, and the ring A may further have a substituent in addition to $Y^A$ and $R^A$.

<20> The nucleic acid compound according to <19>, in which the nucleic acid compound protected by the structure represented by Formula (1) is a compound represented by Formula (2).

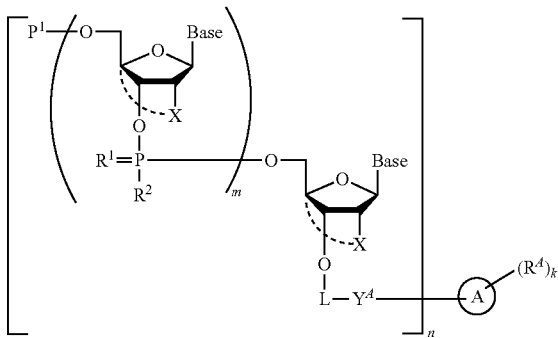

(2)

In Formula (2), m represents any integer of 0 or more,
n represents 1 to 6,
Bases each independently represent a nucleic acid base or a modified nucleic acid base,
$P^1$ represents a hydrogen atom or a hydroxy protective group,
$R^1$ represents an oxygen atom, a sulfur atom, or a borano group,
$R^2$ represents a hydrogen atom, a substituted or unsubstituted hydroxy group, a substituted or unsubstituted mercapto group, a substituted or unsubstituted alkyl group, or a substituted or unsubstituted amino group,
X's each independently represent a hydrogen atom, a hydroxy group, a halogen atom, or an organic group that is crosslinked to a carbon atom at a 4'-position of a ribose structure,
L's each independently represent a single bond or a divalent linking group,
the ring A represents a condensed polycyclic aromatic hydrocarbon ring or an aromatic heterocyclic ring,
$Y^A$'s each independently represent a single bond, *—$OCR_2$—**, *—$NRCR_2$—**, or *—$SCR_2$—**,
where * represents a bonding position to L,
** represents a bonding position to the ring A,
R's each independently represent a hydrogen atom, an alkyl group, an aromatic group, or an aromatic group-substituted alkyl group,
k represents an integer of 1 to 5,
$R^A$'s are each independently an aliphatic hydrocarbon group or an organic group having an aliphatic hydrocarbon group, where at least one aliphatic hydrocarbon group in k pieces of $R^A$'s has 12 or more carbon atoms, and
the ring A may further have a substituent in addition to $Y^A$ and $R^A$.

<21> The nucleic acid compound according to <20>, in which $R^1$ in Formula (2) is an oxygen atom or a sulfur atom, and $R^2$ is a hydroxy group.

<22> The nucleic acid compound according to <20> or <21>, in which L in Formula (2) is a group represented by Formula (1L).

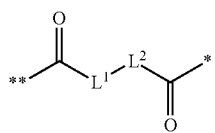

(1L)

In Formula (1L), * represents a bonding position to $Y^A$,
** represents a bonding position to an oxygen atom at a 3-position of a ribose structure,
$L^1$ represents an alkylene group having 1 to 22 carbon atoms,
$L^2$ represents a single bond or #—$C(=O)N(R^{2L})$—$R^{1L}$—$N(R^{3L})$—##,
# represents a bonding position to $L^1$,
represents a bonding position to C=O,
$R^{1L}$ represents an alkylene group having 1 to 22 carbon atoms,
$R^{2L}$ and $R^{3L}$ each independently represent a hydrogen atom or an alkyl group having 1 to 22 carbon atoms, and
$R^{2L}$ and $R^{3L}$ may be bonded to each other to form an alkylene group having 1 to 22 carbon atoms.

<23> The nucleic acid compound according to any one of <19> to <22>, in which the ring A in the structure represented by Formula (1a) is a naphthalene ring.

<24> The nucleic acid compound according to any one of <19> to <23>, in which the total number of carbon atoms of all aliphatic hydrocarbon groups contained in all $R^A$'s is 36 to 80.

<25> The nucleic acid compound according to any one of <19> to <24>, in which the structure represented by Formula (1a) has a structure represented by any one of Formulae (10) to (30).

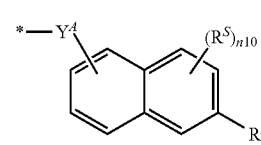

(10)

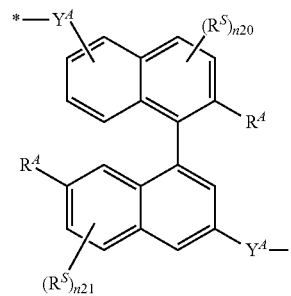

(20)

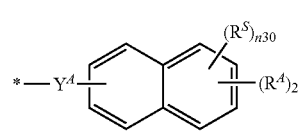

(30)

In Formula (10), Formula (20), or Formula (30), $Y^A$'s each independently represent *—$OCR_2$—**, *—$NRCR_2$—**, or *—$SCR_2$—,  represents a bonding position to a condensed polycyclic aromatic hydrocarbon ring, * represents a bonding position to another structure, R's each independently represent a hydrogen atom, an alkyl group, an aromatic group, or an aromatic group-substituted alkyl group, $R^A$'s are each independently an aliphatic hydrocarbon group or an organic group having an aliphatic hydrocarbon group, where at least one aliphatic hydrocarbon group in one $R^A$ or two $R^A$'s has 12 or more carbon atoms, $R^S$'s each independently represent a substituent, n10 represents an integer of 0 to 6, and n20, n21, and n30 each independently represent an integer of 0 to 5.

<26> The nucleic acid compound according to <25>, in which $R^A$'s in Formula (10), Formula (20), or Formula (30) are each independently a group represented by Formula (f1) or Formula (a1).

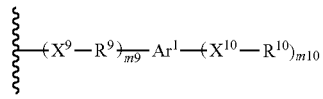

In Formula (f1), a wavy line portion represents a bonding position to another structure, m9 represents an integer of 1 to 3, $X^9$'s each independently represent a single bond, —O—, —S—, —COO—, —OCO—, —OCONH—, —NHCONH—, —NHCO—, or —CONH—, $R^9$'s each independently represent a divalent aliphatic hydrocarbon group, $Ar^1$ represents an (m10+1)-valent aromatic group or an (m10+1)-valent heteroaromatic group, where m10 represents an integer of 1 to 3, $X^{10}$'s each independently represent a single bond, —O—, —S—, —COO—, —OCO—, —OCONH—, —NHCONH—, —NHCO—, or —CONH—, and $R^{10}$'s each independently represent a monovalent aliphatic hydrocarbon group having 5 or more carbon atoms.

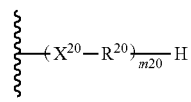

In Formula (a1), a wavy line portion represents a bonding position to another structure, m20 represents an integer of 1 to 10, $X^{20}$'s each independently represent a single bond, —O—, —S—, —COO—, —OCO—, —OCONH—, —NHCONH—, —NHCO—, or —CONH—, and $R^{20}$'s each independently represent a divalent aliphatic hydrocarbon group, where at least one $R^{20}$ is a divalent aliphatic hydrocarbon group having 5 or more carbon atoms.

<27> The nucleic acid compound according to <26>, in which the group represented by Formula (f1) is a group represented by Formula (f2).

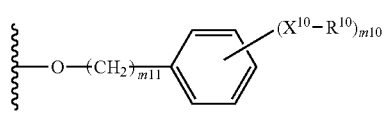

In Formula (f2), a wavy line portion represents a bonding position to another structure, m10 represents an integer of 1 to 3, m11 represents an integer of 1 to 3, $X^{10}$'s each independently represent a single bond, —O—, —S—, —COO—, —OCO—, —OCONH—, —NHCONH—, —NHCO—, or —CONH—, and $R^{10}$'s each independently represent a monovalent aliphatic hydrocarbon group having 5 or more carbon atoms.

<28> The nucleic acid compound according to any one of <19> to <22>, in which the ring A in the compound represented by Formula (1a) has an indole ring or a carbazole ring.

<29> The nucleic acid compound according to any one of <19> to <22> or <28>, in which a structure of the ring A in the compound represented by Formula (1a) is a structure represented by Formula (40).

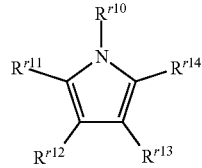

In Formula (40), $R^{10}$ represents a substituent or $R^A$, $R^{r11}$ to $R^{r14}$ each independently represent a hydrogen atom, a substituent, $Y^A$, or $R^A$, $Y^A$'s each independently represent *—$OCR_2$—**, *—$NRCR_2$—**, or *—$SCR_2$—,  represents a bonding position to a ring A, * represents a bonding position to another structure, R's each independently represent a hydrogen atom, an alkyl group, an aromatic group, or an aromatic group-substituted alkyl group, provided that at least one of $R^{r11}$ to $R^{r14}$ is $Y^A$, $R^A$'s are each independently an aliphatic hydrocarbon group or an organic group having an aliphatic hydrocarbon group, where at least one aliphatic hydrocarbon group in one or more $R^A$'s has 12 or more carbon atoms, and $R^{r11}$ and $R^{r12}$, or $R^{r13}$ and $R^{r14}$ may each independently be linked to each other to form a ring.

<30> The nucleic acid compound according to any one of <19> to <22>, <28>, or <29> in which the structure represented by Formula (1a) has a structure represented by Formula (400) or Formula (50).

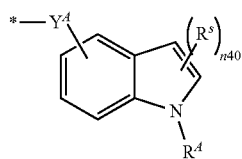

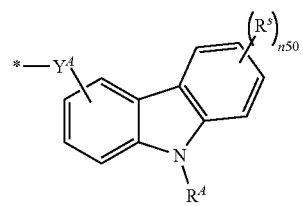

In Formula (400) or Formula (50), $Y^A$'s each independently represent *—$OCR_2$—**, *—$NRCR_2$—**, or *—$SCR_2$—,  represents a bonding position to an aromatic heterocyclic ring, * represents a bonding position to another structure, R's each independently represent a hydrogen atom, an alkyl group, an aromatic group, or an aromatic group-substituted alkyl group, $R^A$'s are each independently an aliphatic hydrocarbon group or an organic group having an aliphatic hydrocarbon group, where at least one aliphatic hydrocarbon group in one $R^A$ has 12 or more carbon atoms, $R^S$'s each independently represent a substituent, n40 represents an integer of 0 to 5, and n50 represents an integer of 0 to 7.

<31> The method of producing a nucleic acid compound according to any one of <19> to <22> or <28> to <30>, in which the at least one aliphatic hydrocarbon group in the one or more $R^A$'s has 14 or more carbon atoms.

<32> The method of producing a nucleic acid compound according to any one of <19> to <22> or <28> to <31>, in which the total number of carbon atoms of all aliphatic hydrocarbon groups contained in all $R^4$'s is 40 or more.

<33> The nucleic acid compound according to <30>, in which $R^4$'s in Formula (400) or Formula (50) are each independently a group represented by Formula (f1) or Formula (a1).

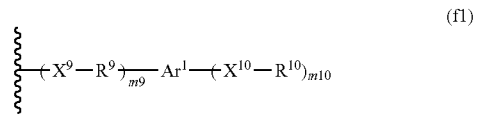
(f1)

In Formula (f1), a wavy line portion represents a bonding position to another structure, m9 represents an integer of 1 to 3, $X^9$'s each independently represent a single bond, —O—, —S—, —COO—, —OCO—, —OCONH—, —NHCONH—, —NHCO—, or —CONH—, $R^9$'s each independently represent a divalent aliphatic hydrocarbon group, $Ar^1$ represents an (m10+1)-valent aromatic group or an (m10+1)-valent heteroaromatic group, where m10 represents an integer of 1 to 3, $X^{10}$'s each independently represent a single bond, —O—, —S—, —COO—, —OCO—, —OCONH—, —NHCONH—, —NHCO—, or —CONH—, and $R^{10}$'s each independently represent a monovalent aliphatic hydrocarbon group having 5 or more carbon atoms.

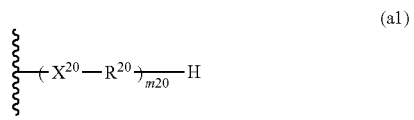
(a1)

In Formula (a1), a wavy line portion represents a bonding position to another structure, m20 represents an integer of 1 to 10, $X^{20}$'s each independently represent a single bond, —O—, —S—, —COO—, —OCO—, —OCONH—, —NHCONH—, —NHCO—, or —CONH—, and $R^{20}$'s each independently represent a divalent aliphatic hydrocarbon group, where at least one $R^{20}$ is a divalent aliphatic hydrocarbon group having 5 or more carbon atoms.

<34> The nucleic acid compound according to <33>, in which the group represented by Formula (f1) is a group represented by Formula (f2).

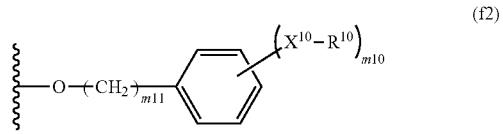
(f2)

In Formula (f2), a wavy line portion represents a bonding position to another structure, m10 represents an integer of 1 to 3, m11 represents an integer of 1 to 3, $X^{10}$'s each independently represent a single bond, —O—, —S—, —COO—, —OCO—, —OCONH—, —NHCONH—, —NHCO—, or —CONH—, and $R^{10}$'s each independently represent a monovalent aliphatic hydrocarbon group having 5 or more carbon atoms.

According to one aspect of the present invention, it is possible to provide a method of producing a nucleic acid compound having an excellent yield.

In addition, according to another aspect of the present invention, a novel nucleic acid compound can be provided.

DESCRIPTION OF THE PREFERRED EMBODIMENTS

Hereinafter, the content of the present disclosure will be described in detail. The description of the configuration requirements described below is based on the representative embodiments of the present disclosure: however, the present disclosure is not limited to such embodiments.

In addition, in the present specification, the numerical value range indicated by using "to" means a range including the numerical values before and after "to" as the lower limit value and the upper limit value, respectively.

In the numerical ranges described stepwise in the present specification, the upper limit value or the lower limit value described in one numerical range may be substituted with the upper limit value or the lower limit value of the numerical range described stepwise in other stages. Further, in the numerical ranges described in the present specification, the upper limit value or the lower limit value of the numerical range may be substituted with the value shown in Examples.

In the present specification, the term "step" includes not only an independent step but also a step that cannot be clearly distinguished from other steps, as long as the intended purpose of the step is achieved.

In addition, in describing a group (atomic group) in the present specification, the description which does not indicate substituted or unsubstituted includes not only a group having no substituent but also a group having a substituent. For example, the "alkyl group" includes not only an alkyl group having no substituent (an unsubstituted alkyl group) but also an alkyl group having a substituent (a substituted alkyl group).

In addition, the chemical structural formula in the present specification may be described by a simplified structural formula in which a hydrogen atom is omitted.

In the present disclosure, "% by mass" is synonymous with "% by weight", and "parts by mass" is synonymous with "parts by weight".

In addition, in the present disclosure, a combination of two or more preferred aspects is a more preferred aspect.

In the present specification, each term has the following meaning unless otherwise specified.

The "nucleoside" refers to a compound in which a purine base, a pyrimidine base, or an artificial nucleic acid base is bonded to a ribose sugar or a deoxyribose sugar, and the "nucleotide" refers to a compound in which a phosphate is ester-bonded to the 5-position of the ribose structure of the nucleoside.

The term "nucleotide" is used in the same meaning as the "polynucleotide" and the "oligonucleotide", where the "polynucleotide" and the "oligonucleotide" refers to a polymer of any length, which is formed of deoxyribonucleotide or nucleotide, which is bonded by a phosphodiester bond between a carbon atom at the 5-position of the ribose structure and a carbon atom at the 3-position of the ribose structure.

The term "nucleic acid compound" includes "nucleoside", "nucleotide", "polynucleotide" and "oligonucleotide".

Examples of the "alkyl group" include an alkyl group having a predetermined number of carbon atoms, for example, an alkyl group having 1 to 30 carbon atoms. An alkyl group having 1 to 10 carbon atoms is preferable, an alkyl group having 1 to 6 carbon atoms is more preferable. Suitable specific examples thereof include a methyl group, an ethyl group, a propyl group, an isopropyl group, an n-butyl group, an isobutyl group, a sec-butyl group, a tert-butyl group, a pentyl group, and a hexyl group. Hereinafter, the number of carbon atoms may be abbreviated by using C, like $C_{1-30}$.

Examples of the "aryl group" include an aryl group having 6 to 14 carbon atoms. Suitable specific examples thereof include a phenyl group, a 1-naphthyl group, a 2-naphthyl group, a biphenylyl group, and a 2-anthryl group.

The "aromatic group" as R is preferably an aryl group having 6 to 20 carbon atoms and particularly preferably a phenyl group or a naphthyl group.

Examples of the "aromatic group-substituted alkyl group" include an aromatic group-substituted alkyl group having 7 to 30 carbon atoms. Among them, preferred examples thereof include an aromatic group-substituted alkyl group having 7 to 20 carbon atoms, and more preferred examples thereof include an aromatic group-substituted alkyl group having 7 to 16 carbon atoms (for example, a group in which an alkylene group having 1 to 6 carbon atoms is bonded to an aromatic group having 6 to 10 carbon atoms). Suitable specific examples thereof include a benzyl group, a 1-phenylethyl group, a 2-phenylethyl group, a 1-phenylpropyl group, a naphthylmethyl group, a 1-naphthylethyl group, and a 1-naphthylpropyl group, and a benzyl group is more preferable.

Examples of the halogen atom include a chlorine atom, a bromine atom, a fluorine atom, and an iodine atom.

Examples of the "alkoxy group" include an alkoxy group having a predetermined number of carbon atoms, for example, an alkoxy group having 1 to 6 carbon atoms. Specific examples of the alkoxy group having 1 to 6 carbon atoms include a linear, cyclic, or branched alkyloxy group having 1 to 6 carbon atoms, such as a methoxy group, an ethoxy group, a propoxy group, an isopropoxy group, a cyclopropoxy group, a butoxy group, an isobutoxy group, a sec-butoxy group, a tert-butoxy group, a cyclobutoxy group, a pentyloxy group, or a hexyloxy group.

The "hydroxy protective group" includes all groups that can be used as the typical protecting group for a hydroxy group, and those described in T. W. Greene et al., Protective Groups in Organic Synthesis, 4th Edition, pp. 16 to 299, 2007, John Wiley & Sons, Inc. can be used. Specific examples thereof include an alkenyl group having 2 to 6 carbon atoms, an alkyl group having 1 to 6 carbon atoms, which has an aryl group, an alkyl group having 1 to 6 carbon atoms, which has an alkoxy group having 1 to 6 carbon atoms, an alkoxy group having 1 to 6 carbon atoms, which has an aryl group, an alkyl group having 1 to 6 carbon atoms, an acyl group, an alkoxycarbonyl group having 1 to 6 carbon atoms, an alkoxycarbonyl group having 1 to 6 carbon atoms, which has an aryl group, an alkylsulfonyl group having 1 to 6 carbon atoms, an arylsulfonyl group, a carbamoyl group, a silyl group, a tetrahydrofuranyl group, and a tetrahydropyranyl group.

More specific examples thereof include a methyl group, a benzyl group, a p-methoxybenzyl group, a tert-butyl group, a methoxymethyl group, a methoxyethyl group, a 2-tetrahydropyranyl group, an ethoxyethyl group, a cyanoethyl group, a cyanoethoxymethyl group, a nitroethyl group, a phenylcarbamoyl group, a 1,1-dioxothiomorpholin-4-thiocarbamoyl group, an acetyl group, a pivaloyl group, a benzoyl group, a trimethylsilyl group, a triethylsilyl group, a triisopropylsilyl group, a tert-butyldimethylsilyl group, a [(triisopropylsilyl)oxy]methyl (Tom) group, a 1-(4-chlorophenyl)-4-ethoxypiperidin-4-yl (Cpep) group, a monomethoxytrityl group, and a dimethoxytrityl group.

The "nucleic acid base" is not particularly limited as long as it is used for synthesizing a nucleic acid, and examples thereof include pyrimidine bases such as a cytosyl group, a uracil group, a thyminyl group, and purine bases such as adenyl group and a guanyl group.

In addition, the "nucleic acid base" also includes, for example, a nucleic acid base of which the amino group is protected by a protective group in an adenyl group, a guanyl group, or a cytosyl group, which is a nucleic acid base having an amino group. The nucleic acid base in which an amino group is protected by a protective group is preferably a nucleic acid base of which the amino group is protected by a protective group capable of withstanding the deprotection conditions at the 5-position of the ribose structure.

Further, in addition to the above-described groups, the above "nucleic acid base" includes a modified nucleic acid base (for example, an 8-bromoadenyl group, an 8-bromoguanyl group, a 5-bromocytosyl group, a 5-iodocytosyl group, a 5-bromouracil group, a 5-iodouracil group, a 5-fluorouracil group, a 5-methylcytosyl group, an 8-oxoguanyl group, or a hypoxanthinyl group) which is obtained by substituting a nucleic acid base with any one to three substituents at any position (for example, a halogen atom, an alkyl group, an aromatic group-substituted alkyl group, an alkoxy group, an acyl group, an alkoxyalkyl group, a hydroxy group, an amino group, a monoalkylamino group, a dialkylamino group, a carboxy group, an aryl group, a heteroaryl group, a cyano group, or a nitro group).

Examples of the "protective group of an amino group" include protective groups described in T. W. Greene et al., Protective Groups in Organic Synthesis, 4th Edition, pp. 696 to 926, 2007, John Wiley & Sons, Inc.

Specific examples of the "protective group of an amino group" include a pivaloyl group, a pivaloyloxymethyl group, a trifluoroacetyl group, a phenoxyacetyl group, a 4-isopropylphenoxyacetyl group, a 4-tert-butylphenoxyacetyl group, an acetyl group, a benzoyl group, an isobutyryl group, a dimethylformamidinyl group, and a 9-fluorenylmethyloxycarbonyl group (a Fmoc group).

Among these, a phenoxyacetyl group, a 4-isopropylphenoxyacetyl group, an acetyl group, a benzoyl group, an isobutyryl group, or a dimethylformamidinyl group is preferable.

In addition, in the above nucleic acid base, a carbonyl group of the nucleic acid base may be protected. Examples of the method of protecting a carbonyl group of a nucleic acid base include a method of reacting a carbonyl group with phenol, 2,5-dichlorophenol, 3-chlorophenol, 3,5-dichlorophenol, 2-formylphenol, 2-naphthol, 4-methoxyphenol, 4-chlorophenol, 2-nitrophenol, 4-nitrophenol, 4-acetylaminophenol, pentafluorophenol, 4-pivaloyloxybenzyl alcohol, 4-nitrophenethyl alcohol, 2-(methylsulfonyl)ethanol, 2-(phenylsulfonyl)ethanol, 2-cyanoethanol, 2-(trimethylsilyl)ethanol, dimethylcarbamic acid chloride, diethylcarbamic acid chloride, ethylphenylcarbamic acid chloride, 1-pyrrolidine-carboxylic acid chloride, 4-morpholine-carboxylic acid chloride, or diphenylcarbamic acid chloride. In addition, a protective group may not be particularly introduced into the carbonyl group.

(Method of Producing Nucleic Acid Compound)

In the method of producing a nucleic acid compound according to the present disclosure, a nucleic acid compound, in which any one of the hydroxy group at the 3-position of the ribose structure (hereinafter, may be simply referred to as the "3-position") or the 5-position of the ribose structure (hereinafter, may be simply referred to as the "5-position") is protected by a structure represented by Formula (1), is used.

In the method of producing a nucleic acid compound according to the present disclosure, a nucleic acid compound protected by the structure represented by Formula (1) at the hydroxy groups at the 3-position and the 5-position can be used; however, from the viewpoint of reactivity, a nucleic acid compound protected by the structure represented by Formula (1) at the hydroxy group at the 3-position is preferably used.

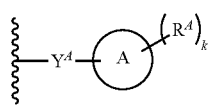
(1)

In Formula (1), a ring A represents a condensed polycyclic aromatic hydrocarbon ring or an aromatic heterocyclic ring, $Y^A$ represents *—$OCR_2$—**, *—$NRCR_2$—**, or *—$SCR_2$—**. R's each independently represent a hydrogen atom, an alkyl group, an aromatic group, or an aromatic group-substituted alkyl group, k represents an integer of 1 to 5, a wavy line portion and * represent a bonding position to another structure, ** represents a bonding position to the ring A, $R^A$'s are each independently an aliphatic hydrocarbon group or an organic group having an aliphatic hydrocarbon group, where at least one aliphatic hydrocarbon group in k pieces of $R^A$'s has 12 or more carbon atoms, and the ring A may further have a substituent in addition to $Y^A$ and $R^A$.

The detailed mechanism by which a nucleic acid compound having an excellent yield can be obtained by using the nucleic acid compound protected by the structure represented by Formula (1) in the method of producing a nucleic acid compound according to the present disclosure is not clear, but it is presumed as follows.

In the structure represented by Formula (1), since at least one aliphatic hydrocarbon group in k pieces of $R^A$'s has 12 or more carbon atoms, the compound protected by the structure represented by Formula (1) has excellent solubility in a hydrophobic solvent. Further, due to the facts that in the hydrophilic solvent, the aliphatic hydrocarbon groups in respective $R^A$'s are aggregated with each other and that the structure represented by Formula (1) has a polycyclic aromatic hydrocarbon ring or an aromatic heterocyclic ring, a π-π interaction (a π-π stacking) between aromatic heterocyclic rings occurs, and thus the crystallization property is excellent, and the purification property and the separation property are also excellent. In other words, due to the fact that the compound protected by the structure represented by Formula (1) has excellent solvent solubility in the hydrophobic solvent which is a reaction solvent, it is estimated that the reaction proceeds rapidly and a target product is efficiently crystallized and purified by adding a polar solvent, which is a poor solvent, at the time of purification, and thus the yield of the obtained nucleic acid compound is excellent.

The above effects are more effectively exhibited in a case where at least one aliphatic hydrocarbon group in k pieces of $R^A$'s preferably has 14 or more carbon atoms. The reason for the above is not clear; however, it is conceived that in a case where the number of carbon atoms in $R^A$ in Formula (1) increases, the rate of the contribution to hydrophobicity in the entire molecule represented by Formula (1) increases, and thus the solubility in the hydrophobic solvent increases. In addition, it is conceived that in a case where the number of carbon atoms increases, the cohesive force further increases in the hydrophilic solvent, which facilitates crystallization.

Further, since the structure represented by Formula (1) according to the present disclosure has the above-described structure, it is stable during the synthesis reaction of the nucleic acid compound and it is easily deprotected (removed).

Furthermore, in a case where the nucleic acid compound protected by the structure represented by Formula (1) according to the present disclosure is used, it is possible to synthesize even a poorly synthesizable nucleic acid compound such as an artificial nucleic acid containing an unnatural structure by which a side reaction is likely to occur, with high purity by suppressing the side reaction.

Hereinafter, the structure represented by Formula (1) that is used in the method of producing a nucleic acid compound according to the present disclosure will be described in detail.

<Structure Represented by Formula (1)>

The structure represented by Formula (1) that is used in the method of producing a nucleic acid compound according to the present disclosure is shown below.

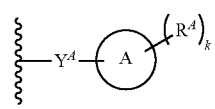
(1)

In Formula (1), a ring A represents a condensed polycyclic aromatic hydrocarbon ring or an aromatic heterocyclic ring, $Y^A$ represents *—$OCR_2$—**, *—$NRCR_2$—**, or *—$SCR_2$—**, where the R's each independently represent a hydrogen atom, an alkyl group, an aromatic group, or an aromatic group-substituted alkyl group, k represents an integer of 1 to 5, a wavy line portion and * represents a bonding position to another structure, ** represents a bonding position to a ring A, $R^A$'s are each independently an aliphatic hydrocarbon group or an organic group having an aliphatic hydrocarbon group, at least one aliphatic hydrocarbon group in k pieces of $R^A$'s has 12 or more carbon atoms, and the ring A may further have a substituent in addition to $Y^A$ and $R^A$.

From the viewpoint of stability, in Formula (1), the ring A is preferably a condensed polycyclic aromatic hydrocarbon ring.

—Condensed Polycyclic Aromatic Hydrocarbon Ring—

In a case where the ring A in Formula (1) is a condensed polycyclic aromatic hydrocarbon ring, it represents a condensed polycyclic aromatic hydrocarbon ring in which two or more aromatic hydrocarbon rings are condensed, and the ring A may further have a substituent in addition to $Y^A$ and $R^A$.

In a case where the ring A is a condensed polycyclic aromatic hydrocarbon ring, the ring A is preferably a condensed polycyclic aromatic hydrocarbon ring which is bicyclic to tetracyclic, more preferably a condensed polycyclic aromatic hydrocarbon ring which is bicyclic or tricyclic, and particularly preferably a condensed polycyclic aromatic hydrocarbon ring which is bicyclic, from the viewpoint of stability, crystallization property, and yield.

Among the above, the ring A is preferably a naphthalene ring, an anthracene ring, a phenanthrene ring, a tetracene ring, a triphenylene ring, a pyrene ring, or a chrysene ring, more preferably a naphthalene ring, an anthracene ring, or phenanthrene ring, and particularly preferably a naphthalene ring from the viewpoints of stability, crystallization property, and yield.

In addition, the ring A is preferably a ring having at least a naphthalene ring structure from the viewpoint of yield.

Further, the ring A may have a substituent, where two or more substituents may be bonded to form a ring structure as described later, and a structure in which an aliphatic hydrocarbon ring, an aliphatic heterocyclic ring, a heteroaromatic ring, or the like is further condensed to the ring A may be adopted.

—Aromatic Heterocyclic Ring—

In a case where the ring A in Formula (1) is an aromatic heterocyclic ring, the aromatic heterocyclic ring may be a monocyclic ring or may be a condensed polycyclic aromatic hydrocarbon ring in which two or more aromatic hydrocarbon rings are condensed, and the ring A may further have a substituent in addition to $Y^A$ and $R^A$.

The aromatic heterocyclic ring is preferably an aromatic heterocyclic ring having no SH group, amino group, OH group, or COOH group other than $Y^A$ from the viewpoints of stability, crystallization property, and yield.

In a case where the ring A is an aromatic heterocyclic ring and is a polycyclic ring, it is preferably a condensed polycyclic aromatic heterocyclic ring having two or more rings, in which aromatic heterocyclic rings are condensed, more preferably a condensed polycyclic aromatic heterocyclic ring which is bicyclic to tetracyclic, and still more preferably a condensed polycyclic aromatic heterocyclic ring which is bicyclic or tricyclic.

In addition, the aromatic heterocyclic ring is preferably a heterocyclic ring having at least one heteroatom selected from the group consisting of a nitrogen atom, an oxygen atom, and a sulfur atom, more preferably a heterocyclic ring having at least one heteroatom selected from the group consisting of a nitrogen atom and a sulfur atom, still more preferably a heterocyclic ring containing a nitrogen atom or a sulfur atom, and particularly preferably a heterocyclic ring containing a nitrogen atom.

In the aromatic heterocyclic ring, the heteroatom preferably further has a substituent from the viewpoints of stability, crystallization property, and yield. Suitable examples of the substituent include $R^A$ in Formula (1) described, and the same applies to the preferred aspect thereof.

The aromatic heterocyclic ring is not particularly limited; however, it is preferably a 5-membered to an 8-membered ring, and more preferably a 5-membered ring or a 6-membered ring.

From the viewpoints of stability, crystallization property, and yield, the aromatic heterocyclic ring is preferably a 5-membered to an 8-membered aromatic heterocyclic ring, more preferably a 5-membered or 6-membered aromatic heterocyclic ring, still more preferably a condensed polycyclic aromatic heterocyclic ring which is bicyclic or tricyclic, which contains a 5-membered or 6-membered ring having at least one heteroatom selected from a nitrogen atom and a sulfur atom, and particularly preferably a condensed polycyclic aromatic heterocyclic ring which is bicyclic or tricyclic, which contains a 5-membered or a 6-membered ring having a nitrogen atom or a sulfur atom.

Among them, in a case where the ring A is an aromatic heterocyclic ring, examples of the ring A include a benzothiophene ring, a furan ring, a benzofuran ring, a pyrrole ring, an indole ring, a carbazole ring, a pyrazole ring, an indazole ring, a thiophene ring. However, from the viewpoints of stability, crystallization property, and yield, an indole ring, a carbazole ring, or an indazole ring is preferable, and an indole ring or a carbazole ring is particularly preferable.

In a case where the ring A is an aromatic heterocyclic ring, the nitrogen atom at the 1-position on the pyrrole ring, the indole ring, the carbazole ring, the pyrazole ring, or the indazole ring preferably has a substituent on the above nitrogen atom from the viewpoints of stability, crystallization property, and yield. Suitable examples of the substituent include $R^A$ in Formula (1) described, and the same applies to the preferred aspect thereof.

In addition, in a case where the ring A is an aromatic heterocyclic ring, the ring A is preferably a condensed polycyclic aromatic heterocyclic ring which is bicyclic or tricyclic, which contains a 5-membered ring having a nitrogen atom, and more preferably an indole ring or a carbazole ring, from the viewpoint of yield.

Further, in a case where the ring A is an aromatic heterocyclic ring, the ring A may have a substituent, where two or more substituents may be bonded to form a ring structure as described later, and a structure in which an aliphatic hydrocarbon ring, a polycyclic aromatic hydrocarbon ring, an aliphatic heterocyclic ring, or the like is further condensed to the ring A may be adopted.

The number n of substitutions of $Y^A$ on the ring A in Formula (1) is preferably 1 from the viewpoints of stability, crystallization property, and yield.

$Y^A$'s in Formula (1) each independently are *—OCR$_2$—**, *—NRCR$_2$—**, or *—SCR$_2$—**, and from the viewpoint of stability, solvent solubility, and yield, it is preferably *—OCR$_2$—** or *—NRCR$_2$—**, more preferably *—OCH$_2$—** or *—NRCH$_2$—**, and particularly preferably *—NRCH$_2$—**.

In addition, the compound that forms the structure represented by Formula (1) is preferably a compound in which the structure of $Y^A$ and the structure up to the terminal on the * side in Formula (1) has the following structure. Specifically, from the viewpoints of stability, solvent solubility, and yield, —CR$_2$OH, —CR$_2$NHR, or —CR$_2$SH is preferable —CH$_2$OH, —CH$_2$NHR, or —CH$_2$SH is more preferable, —CH$_2$OH or —CH$_2$NHR is still more preferable, and **—CH$_2$NHR is particularly preferable.

In addition, in a case where two $Y^A$'s are included in Formula (1), the two $Y^A$'s are preferably the same group.

R's in *—NRCR$_2$—** each independently represent a hydrogen atom, an alkyl group, an aromatic group, or an aromatic group-substituted alkyl group, where the alkyl group is preferably an alkyl group having 1 to 10 carbon atoms and more preferably an alkyl group having 1 to 6 carbon atoms.

Among the above, R's in *—NRCR$_2$—** are each independently preferably a hydrogen atom, an alkyl group having 1 to 6 carbon atoms, or an aromatic group-substituted alkyl group having 7 to 16 carbon atoms, more preferably a hydrogen atom, a methyl group, an ethyl group, or a benzyl group, and still more preferably a hydrogen atom.

Further, the compound represented by Formula (1) may have a substituent which is contained in the ring A. That is, the compound represented by Formula (1) may be a multimer such as a dimer. The multimer is preferably a dimer to a hexamer, more preferably a dimer to a tetramer, and particularly preferably a dimer, from the viewpoint of ease of synthesis.

From the viewpoints of crystallization property, solvent solubility, and yield, k, which is the number of substitutions of $R^4$ on the ring A in Formula (1), is preferably an integer of 1 to 4, more preferably an integer of 1 to 3, particularly preferably 1 or 2.

$R^4$'s each independently represent an aliphatic hydrocarbon group or an organic group having an aliphatic hydrocarbon group, The "organic group having an aliphatic hydrocarbon group" is a monovalent (having one bonding site) organic group having an aliphatic hydrocarbon group in the molecular structure thereof.

The "aliphatic hydrocarbon group" is a linear, branched, or cyclic aliphatic hydrocarbon group having 5 or more carbon atoms, which is saturated or unsaturated, and it is preferably an aliphatic hydrocarbon group having 5 to 60 carbon atoms, more preferably an aliphatic hydrocarbon group having 5 to 30 carbon atoms, and particularly preferably an aliphatic hydrocarbon group having 10 to 30 carbon atoms, from the viewpoints of solvent solubility, crystallization property, and yield.

In addition, the "aliphatic hydrocarbon group" preferably has 12 or more carbon atoms, more preferably 14 or more carbon atoms, still more preferably 16 or more carbon atoms, and particularly preferably 18 or more carbon atoms, from the viewpoints of solvent solubility, crystallization property, and yield.

The moiety of the aliphatic hydrocarbon group in the organic group having an aliphatic hydrocarbon group is not particularly limited, and it may be present at the terminal (a monovalent group) or at another site (for example, a divalent group).

Examples of the "aliphatic hydrocarbon group" include an alkyl group, a cycloalkyl group, an alkenyl group, and an alkynyl group, and specific examples thereof include monovalent groups such as a pentyl group, a hexyl group, an octyl group, a decyl group, a hexadecyl group, an octadecyl group, an icosyl group, a docosyl group, a tetracosyl group, a lauryl group, a tridecyl group, a myristyl group, an oleyl group, and an isostearyl group, divalent groups derived from these groups (divalent groups obtained by removing one hydrogen atom from the above monovalent groups), and groups obtained by excluding a hydroxy group or the like from various steroid groups.

In addition, the "alkyl group" is preferably, for example, an alkyl group having 5 to 30 carbon atoms, and examples thereof include a pentyl group, a hexyl group, an octyl group, a 2-ethylhexyl group, a decyl group, a hexadecyl group, an octadecyl group, an icosyl group, a docosyl group, a tetracosyl group, a lauryl group, a tridecyl group, a myristyl group, and an isostearyl group. An octadecyl group, an icosyl group, a docosyl group, or a tetracosyl group is preferable, and an icosyl group, a docosyl group, or a tetracosyl group is more preferable.

The "cycloalkyl group" is preferably, for example, a cycloalkyl group having 5 to 30 carbon atoms, and examples thereof include a cyclopentyl group, a cyclohexyl group, an isobornyl group, and a tricyclodecanyl group. In addition, these groups may be repeatedly linked or may have a fused-ring structure of two or more rings.

The "alkenyl group" is preferably, for example, an alkenyl group having 5 to 30 carbon atoms, and examples thereof include a pentenyl group, a hexenyl group, an oleyl group.

The "alkynyl group" is preferably, for example, an alkynyl group having 5 to 30 carbon atoms, and examples thereof include a 4-pentynyl group and a 5-hexenyl group.

The "steroid group" is preferably, for example, a group having a cholesterol structure, a group having an estradiol structure, or the like.

The organic group may be further substituted with a silyl group, a hydrocarbon group having a silyloxy structure, or an organic group having a perfluoroalkyl structure.

The silyl group is preferably a trialkylsilyl group and more preferably a silyl group having three alkyl groups which have 1 to 3 carbon atoms.

The silyloxy structure in the hydrocarbon group having a silyloxy structure is preferably a trialkylsilyloxy structure and more preferably a silyloxy structure having three alkyl groups which have 1 to 3 carbon atoms.

In addition, the hydrocarbon group having a silyloxy structure preferably has 1 to 3 silyloxy structures.

Further, the hydrocarbon group having a silyloxy structure preferably has 10 or more carbon atoms, more preferably 10 to 100 carbon atoms, and particularly preferably 16 to 50 carbon atoms.

The hydrocarbon group having a silyloxy structure is preferably a group represented by Formula (Si).

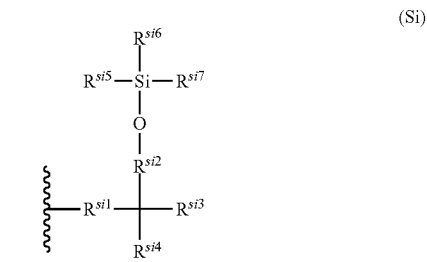

(Si)

In Formula (Si), $R^{si1}$ represents a single bond or an alkylene group having 1 to 3 carbon atoms, $R^{si2}$ represents an alkylene group having 1 to 3 carbon atoms, and $R^{si3}$ and $R^{si4}$ each independently represent a hydrogen atom, an alkyl group having 1 to 6 carbon atoms, or —$OSiR^{si5}R^{si6}R^{si7}$, and $R^{si5}$ to $R^{si7}$ each independently represent an alkyl group having 1 to 6 carbon atoms or an aryl group.

$R^{si5}$ to $R^{si7}$ in Formula (Si) are each independently preferably an alkyl group having 1 to 6 carbon atoms or a phenyl group, more preferably alkyl group having 1 to 6 carbon atoms, and particularly preferably a linear or branched alkyl group having 1 to 4 carbon atoms.

The perfluoroalkyl structure in the organic group having a perfluoroalkyl structure is preferably a perfluoroalkyl structure having 1 to 20 carbon atoms, more preferably a perfluoroalkyl structure having 5 to 20 carbon atoms, and particularly preferably a perfluoroalkyl structure having 7 to 16 carbon atoms. Further, the perfluoroalkyl structure may be linear, may have a branch, or may have a ring structure.

The organic group having a perfluoroalkyl structure is preferably a perfluoroalkyl group, an alkyl group having a perfluoroalkyl structure, or an alkyl group having a perfluoroalkyl structure and an amide bond in the alkyl chain.

The organic group having a perfluoroalkyl structure preferably has 5 or more carbon atoms, more preferably 10 or more carbon atoms, still more preferably 10 to 100 carbon atoms, and particularly preferably 16 to 50 carbon atoms.

Preferred examples of the organic group having a perfluoroalkyl structure include groups shown below.

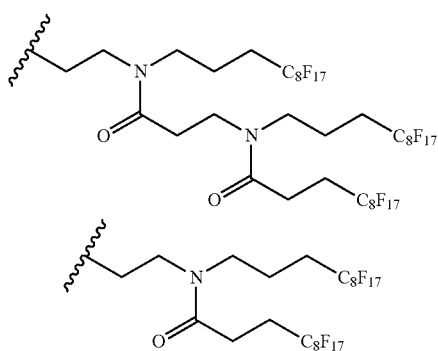

The moiety other than the "aliphatic hydrocarbon group" in the "organic group having an aliphatic hydrocarbon group" can be freely set. For example, a moiety such as —O—, —S—, —COO—, —OCONH—, —CONH—, or a hydrocarbon group (a monovalent group or a divalent group) other than the "aliphatic hydrocarbon group" may be contained.

Examples of the "hydrocarbon group" other than the "aliphatic hydrocarbon group" include an aromatic hydrocarbon group, and specifically, for example, a monovalent group such as an aryl group and a divalent group derived therefrom can be used.

Among the "aryl groups", an aryl group having 6 to 10 carbon atoms is more preferable, and a phenyl group is particularly preferable.

Further, the hydrocarbon group other than the aliphatic hydrocarbon group and the aliphatic hydrocarbon group may be substituted with a substituent selected from a halogen atom, an oxo group, and the like.

The bond (the substitution) of the "organic group having an aliphatic hydrocarbon group" to the ring A may be one formed through the "aliphatic hydrocarbon group" that is present in the above $R^A$ or through the above "hydrocarbon group", that is, it may be one formed by directly being bonded by a carbon-carbon bond, may be one formed by directly being bonded by a nitrogen-carbon bond derived from the ring A, or may be one formed through the moiety such as —O—, —S—, —COO—, —OCONH—, —CONH—, or the like, which are present in the above $R^A$. From the viewpoint of easiness of synthesizing the compound, it is preferably one formed by directly being bonded by a carbon-carbon bond, one formed by directly being bonded by a nitrogen-carbon bond derived from the ring A, or one formed through —O—, —S—, —COO—, or —CONH—, and particularly preferably one formed by directly being bonded by a nitrogen-carbon bond derived from the ring A or one formed by directly being bonded by a carbon-carbon bond.

The organic group having an aliphatic hydrocarbon group, as $R^A$, is preferably an aromatic hydrocarbon group having an aliphatic hydrocarbon group, more preferably a phenyl group having an aliphatic hydrocarbon group, and still more preferably a phenyl group having an alkoxy group, from the viewpoints of solvent solubility, crystallization property, and yield.

In the structure represented by Formula (1), the total number of carbon atoms of all aliphatic hydrocarbon groups contained in all $R^A$'s is preferably 24 or more, more preferably 24 to 200, still more preferably 32 to 100, even still more preferably 34 to 80, particularly preferably 36 to 80, and most preferably 40 to 80, from the viewpoints of solvent solubility, crystallization property, and yield.

In the compound represented by Formula (1) according to the present disclosure, at least one aliphatic hydrocarbon group in k pieces of $R^A$'s preferably has 14 or more carbon atoms, more preferably 16 or more carbon atoms, still more preferably 18 or more carbon atoms, and particularly preferably 20 or more carbon atoms. Within the above range, a more excellent effect is exhibited. The reason for the above is presumed to be because in a case where the number of carbon atoms increases, the rate of the contribution to hydrophobicity in the entire molecule increases, and thus the solubility in the hydrophobic solvent increases, and in a case where the number of carbon atoms increases, the cohesive force further increases in the hydrophilic solvent, which facilitates crystallization.

Further, the aliphatic hydrocarbon group is preferably an alkyl group and more preferably a linear alkyl group from the viewpoints of crystallization property and yield.

In addition, the structure represented by Formula (1) is a structure having at least one aliphatic hydrocarbon group having 12 or more carbon atoms in at least one $R^A$ of k pieces of $R^A$'s, and in k pieces of $R^A$'s, it preferably has at least one aliphatic hydrocarbon group having 12 to 100 carbon atoms, more preferably has at least one aliphatic hydrocarbon group having 18 to 40 carbon atoms, and still more preferably has at least one aliphatic hydrocarbon group having 20 to 36 carbon atoms, from the viewpoints of solvent solubility, crystallization property, and yield.

Further, one $R^A$ preferably has 12 to 200 carbon atoms, more preferably 14 to 150 carbon atoms, still more preferably 16 to 100 carbon atoms, and particularly preferably 20 to 80 carbon atoms, from the viewpoints of solvent solubility, crystallization property, and yield.

Furthermore, the aliphatic hydrocarbon group having 12 or more carbon atoms, which has the structure represented by Formula (1), is preferably contained in at least one of $R^A$'s from the viewpoints of solvent solubility, crystallization property, and yield.

In Formula (1), at least one $R^A$ is preferably a group represented by Formula (f1), Formula (a1), Formula (b1), or Formula (e1), more preferably a group represented by Formula (f1) or Formula (a1), and particularly preferably a group represented by Formula (f1), from the viewpoints of solvent solubility, crystallization property, and yield.

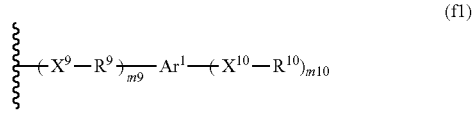

(f1)

In Formula (f1), the wavy line portion represents a bonding position to the ring A, m9 represents an integer of 0 to 3, $X^9$'s each independently represent a single bond, —O—, —S—, —COO—, —OCO—, —OCONH—, —NHCONH—, —NHCO—, or —CONH—, $R^9$'s each independently represent a divalent aliphatic hydrocarbon group, $Ar^1$ represents an (m10+1)-valent aromatic group or an (m10+1)-valent heteroaromatic group, where m10 represents an integer of 1 to 3, $X^{10}$'s each independently represent a single bond, —O—, —S—, —COO—, —OCO—, —OCONH—, —NHCONH—, —NHCO—, or —CONH—, and $R^{10}$'s each independently represent a monovalent aliphatic hydrocarbon group having 5 or more carbon atoms.

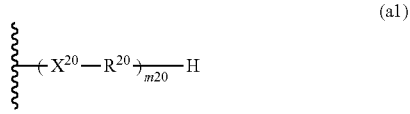

(a1)

In Formula (a1), the wavy line portion represents a bonding position to the ring A, m20 represents an integer of 1 to 10, $X^{20}$'s each independently represent a single bond, —O—, —S—, —COO—, —OCO—, —OCONH—, —NHCONH—, —NHCO—, or —CONH—, and $R^{20}$'s each independently represent a divalent aliphatic hydrocarbon group.

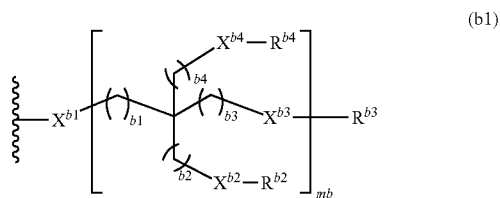

(b1)

In Formula (b1), the wavy line portion represents a bonding position to the ring A, mb represents 1 or 2, b1 to b4 each independently represent an integer of 0 to 2, $X^{b1}$ to $X^{b4}$ each independently represent a single bond, —O—, —S—, —COO—, —OCONH—, or —CONH—, $R^{b2}$ and $R^{b4}$ each independently represent a hydrogen atom, a methyl group, or an aliphatic hydrocarbon group having 5 or more carbon atoms, and $R^{b3}$ represents an aliphatic hydrocarbon group having 5 or more carbon atoms.

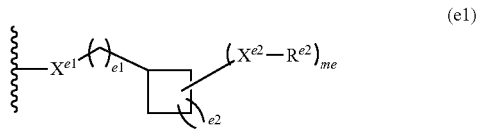

(e1)

In Formula (e1), the wavy line portion represents a bonding position to the ring A, Xe1 represents a single bond, —O—, —S—, —NHCO—, or —CONH—, me represent an integer of 0 to 15, e1 represents an integer of 0 to 11, e2 represents an integer of 0 to 5, $X^{e2}$'s each independently represent a single bond, —O—, —S—, —COO—, —OCONH—, —NHCO—, or —CONH—, and $R^{e2}$'s each independently represent a hydrogen atom, a methyl group, or an organic group having an aliphatic hydrocarbon group having 5 or more carbon atoms.

m9 in Formula (f1) is preferably 0 or 1 and more preferably 1.

$X^9$ and $X^{10}$ in Formula (f1) are each independently preferably a single bond, —O—, —S—, —COO—, —OCONH—, or —CONH—, and more preferably a single bond.

$R^9$'s in Formula (f1) are each independently preferably an alkylene group having 1 to 10 carbon atoms, more preferably an alkylene group having 1 to 4 carbon atoms, and particularly preferably a methylene group.

$R^{10}$'s in Formula (f1) are each independently preferably a monovalent aliphatic hydrocarbon group having 5 to 60 carbon atoms, more preferably a monovalent aliphatic hydrocarbon group having 12 to 50 carbon atoms, still more preferably a monovalent aliphatic hydrocarbon group having 18 to 40 carbon atoms, and particularly preferably a monovalent aliphatic hydrocarbon group having 20 to 32 carbon atoms. Further, $R^{10}$'s are each independently preferably a linear alkyl group or a branched alkyl group, and more preferably a linear alkyl group.

The m10 in Formula (f1) is preferably 2 or 3, and more preferably 2.

$Ar^1$ in Formula (f1) is preferably an (m10+1)-valent aromatic group and more preferably a group obtained by removing (m10+1) hydrogen atoms from benzene.

In addition, the group represented by Formula (f1) is preferably a group represented by Formula (f2) from the viewpoints of solvent solubility, crystallization property, and yield.

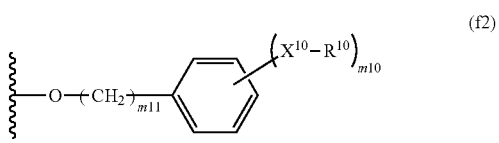

(f2)

In Formula (f2), the wavy line portion represents a bonding position to the ring A, m10 represents an integer of 1 to 3, m11 represents an integer of 0 to 3, $X^{10}$'s each independently represent a single bond, —O—, —S—, —COO—, —OCO—, —OCONH—, —NHCONH—, —NHCO—, or —CONH—, and $R^{10}$'s each independently represent a monovalent aliphatic hydrocarbon group having 5 or more carbon atoms.

m10 and $X^{10}$ and $R^{10}$ in Formula (f2) are respectively synonymous with m10 and $X^{10}$ and $R^{10}$ in Formula (f1), and the same applies to the preferred aspect thereof.

m11 in Formula (f2) is preferably 0 or 1, and more preferably 1.

m20 in Formula (a1) is preferably 1 or 2, and more preferably 1.

$X^{20}$'s in Formula (a1) are each independently preferably —O—, —S—, —COO—, —OCONH—, or —CONH—, and more preferably —O—.

$R^{20}$ in Formula (a1) is preferably a divalent aliphatic hydrocarbon group having 5 or more carbon atoms, more preferably a divalent aliphatic hydrocarbon group having 5 to 60 carbon atoms, still more preferably a divalent aliphatic hydrocarbon group having 8 to 40 carbon atoms, and particularly preferably a divalent aliphatic hydrocarbon group having 12 to 32 carbon atoms. In addition, $R^{20}$ is preferably a linear alkylene group.

mb in Formula (b1) is preferably 1.

b1 to b4 in Formula (b1) are each independently preferably 1 or 2, and more preferably 1.

$X^{b1}$ to $X^{b4}$ in Formula (b1) are each independently preferably —O—, —S—, —COO—, —OCONH—, or —CONH—, and more preferably —O—.

$R^{b2}$ and $R^{b4}$ in Formula (b1) are each independently preferably a hydrogen atom, a methyl group, or an aliphatic hydrocarbon group having 5 to 60 carbon atoms, more preferably a hydrogen atom, a methyl group, or an alkyl group having 8 to 40 carbon atoms, and particularly preferably a hydrogen atom, a methyl group, or an alkyl group having 12 to 32 carbon atoms.

$R^{b3}$ in Formula (b1) is preferably a monovalent aliphatic hydrocarbon group having 5 to 60 carbon atoms, more preferably a monovalent aliphatic hydrocarbon group having 5 to 60 carbon atoms, still more preferably a monovalent aliphatic hydrocarbon group having 8 to 40 carbon atoms, and particularly preferably a monovalent aliphatic hydrocarbon group having 12 to 32 carbon atoms. In addition, $R^{b3}$ is preferably a linear alkyl group.

Further, from the viewpoints of solvent solubility and yield, preferred examples of the structure represented by Formula (1) include aliphatic hydrocarbon groups having a branch, as the aliphatic hydrocarbon group in $R^A$, and more preferred examples thereof include groups shown below. The wavy line portion represents a bonding position with another structure, nt2 represents an integer of 3 or more, and nt3 represents an integer set so that the total carbon number of the following groups is 14 to 300.

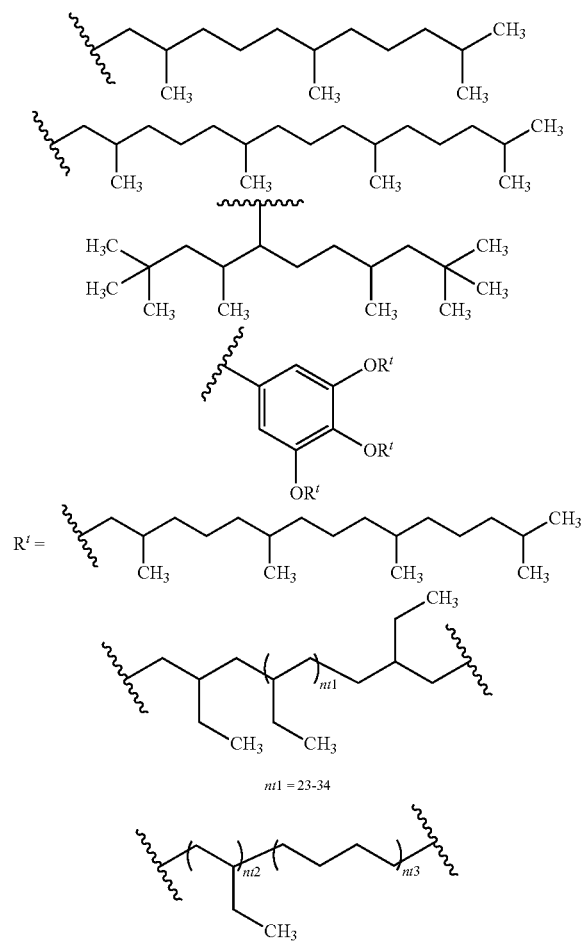

The substituent which may be contained in the ring A of the structure represented by Formula (1) is not particularly limited; however, examples thereof include an alkoxy group, an aryloxy group, a halogen atom, an alkyl group, a halogenated alkyl group, an aryl group, an acyl group, an acyloxy group, an alkoxycarbonyl group, an aryloxycarbonyl group, an alkylthio group, an arylthio group, $R^{st}$—CO—$NR^{st}$—, —$CON(R^{st})_2$, a dialkylamino group, an alkylarylamino group, a diarylamino group, and groups in which two or more of these are combined. It is noted that $R^{st}$ represents a hydrogen atom, an alkyl group, or an aryl group.

In a case where the ring A in Formula (1) is an aromatic heterocyclic ring, the structure represented by Formula (1) preferably does not have a substituent in the aromatic heterocyclic ring from the viewpoints of stability, crystallization property, solvent solubility, and yield.

Further, in a case where the ring A in Formula (1) is a condensed polycyclic aromatic hydrocarbon ring and has a structure represented by Formula (1), having a multimeric structure, preferred examples of the substituent which may be contained in the ring A include a group represented by Formula (M).

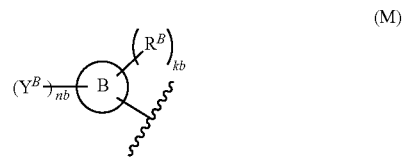

In Formula (M), the wavy line portion represents a bonding position to the ring A in Formula (1), the ring B represents a condensed polycyclic aromatic hydrocarbon ring, $Y^B$'s each independently represent —$CR^b{}_2OH$, —$CR^b{}_2NR^b$, —$CH_2SH$, or —$CR^b{}_2X^0$, where $R^b$ represents a hydrogen atom, an alkyl group, an aromatic group, or an aromatic group-substituted alkyl group, $X^0$ represents Cl, Br, or I, kb represents an integer of 1 to 5, nb represents 1 or 2. $R^B$'s are each independently an aliphatic hydrocarbon group or an organic group having an aliphatic hydrocarbon group, at least one aliphatic hydrocarbon group in at least one $R^B$ has 12 or more carbon atoms, and the ring B may further have a substituent in addition to $Y^B$ and $R^B$.

The ring B, $Y^B$, $R^b$, kb, nb, and $R^B$ in Formula (M) are respectively synonymous with the ring A, $Y^A$, R, k, n, and $R^A$ in Formula (1), and the same applies to the preferred aspect thereof.

Further, in a case where the ring A in Formula (1) is a condensed polycyclic aromatic hydrocarbon ring and has a group represented by Formula (M), as a substituent, the structure represented by Formula (1) is preferably a structure represented by Formula (20) described later.

The structure represented by Formula (1) is preferably a structure represented by Formula (10), Formula (20), or Formula (30), and more preferably a structure represented by Formula (10), from the viewpoints of stability, crystallization property, solvent solubility, and yield.

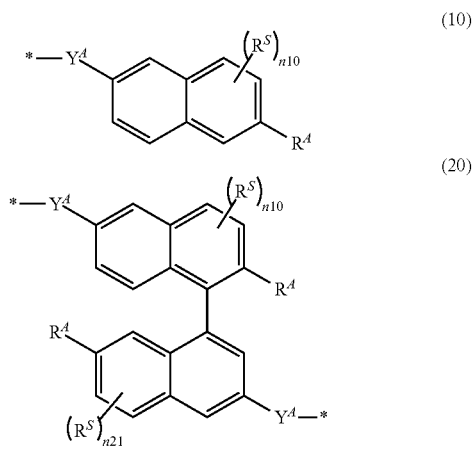

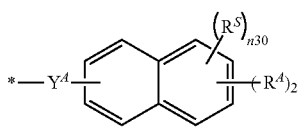

(30)

In Formula (10), Formula (20), or Formula (30), $Y^A$'s each independently represent *—$OCR_2$—**, *—$NRCR_2$—**, or *—$SCR_2$—,  represents a bonding position to the ring A, * represents a bonding position to another structure, R's each independently represent a hydrogen atom, an alkyl group, an aromatic group, or an aromatic group-substituted alkyl group, $R^A$'s are each independently an aliphatic hydrocarbon group or an organic group having an aliphatic hydrocarbon group, where at least one aliphatic hydrocarbon group contained in at least one $R^A$ has 12 or more carbon atoms, $R^S$'s each independently represent a substituent, n10 represents an integer of 0 to 6, and n20, n21, and n30 each independently represent an integer of 0 to 5.

$Y^A$, $R^A$, and R in Formula (10), Formula (20), or Formula (30) are respectively synonymous with $Y^A$, $R^A$, and R in Formula (1), and the same applies to the preferred aspect thereof.

n10 in Formula (10) is preferably an integer of 0 to 2, more preferably 0 or 1, and still more preferably 0.

n20 and n21 in Formula (20) are each independently preferably an integer of 0 to 2, more preferably 0 or 1, and particularly preferably 0.

It is preferable that the two $Y^A$'s in Formula (20) are the same group.

Further, it is preferable that the two $R^A$'s in Formula (20) are the same group.

n30 in Formula (30) is preferably an integer of 0 to 2, more preferably 0 or 1, and particularly preferably 0.

It is preferable that the two $R^A$'s in Formula (30) are the same group.

$R^S$'s in Formula (10), Formula (20), or Formula (30) are each independently preferably an alkoxy group, an aryloxy group, a halogen atom, an alkyl group, a halogenated alkyl group, an aryl group, an acyl group, an acyloxy group, an alkoxycarbonyl group, an aryloxycarbonyl group, an alkylthio group, an arylthio group, $R^{st}$—CO—$NR^{st}$—, —CON$(R^{st})_2$, a dialkylamino group, an alkylarylamino group, a diarylamino group, or a group in which two or more of these are combined, more preferably an alkoxy group, an aryloxy group, a halogen atom, an alkyl group, a halogenated alkyl group, or an aryl group, and still more preferably an alkoxy group or an alkyl group.

$R^A$ in Formula (10) is preferably a group represented by Formula (f1), Formula (a1), Formula (b1), or Formula (e1), more preferably a group represented by Formula (f1) or (a1), still more preferably a group represented by Formula (f1), and particularly preferably a group represented by Formula (f2), from the viewpoints of solvent solubility, crystallization property, and yield.

$R^A$'s in Formula (20) are each independently preferably a group represented by Formula (f1), Formula (a1), Formula (b1), or Formula (e1), and more preferably a group represented by Formula (f1) or Formula (a1), from the viewpoints of solvent solubility, crystallization property, and yield.

$R^A$'s in Formula (30) are each independently preferably a group represented by Formula (f1), Formula (a1), Formula (b1), or Formula (e1), and more preferably a group represented by Formula (f1) or Formula (a1), from the viewpoints of solvent solubility, crystallization property, and yield.

In a case where the compound represented by Formula (1) is an aromatic heterocyclic ring, the ring A in the structure represented by Formula (1) is preferably a structure represented by Formula (40) from the viewpoints of stability, crystallization property, solvent solubility, and yield.

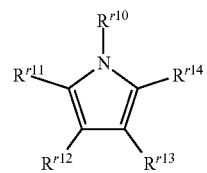

(40)

In Formula (40), $R^{r10}$ represents a substituent or $R^A$, $R^{r11}$ to $R^{r14}$ each independently represent a hydrogen atom, a substituent, $Y^A$, or $R^A$, $Y^A$'s each independently represent *—$OCR_2$—**, *—$NRCR_2$—**, or *—$SCR_2$—,  represents a bonding position to a ring A, * represents a bonding position to another structure, R's each independently represent a hydrogen atom, an alkyl group, an aromatic group, or an aromatic group-substituted alkyl group, provided that at least one of $R^{r11}$ to $R^{r14}$ is $Y^A$, $R^A$'s are each independently an aliphatic hydrocarbon group or an organic group having an aliphatic hydrocarbon group, where at least one aliphatic hydrocarbon group in one or more $R^A$'s has 12 or more carbon atoms, and $R^{r11}$ and $R^{r12}$, or $R^{r13}$ and $R^{r14}$ may each independently be linked to each other to form a ring.

In Formula (40), it is preferable that $R^{r11}$ and $R^{r12}$, or $R^{r13}$ and $R^{r14}$ are each independently linked to each other to form a ring from the viewpoints of crystallization property and yield.

In a case where $R^{r11}$ and $R^{r12}$, or $R^{r13}$ and $R^{r14}$ are linked to each other to form a ring, the structure represented by Formula (40) is a compound having an indole ring, and in a case where $R^{r11}$ and $R^{r12}$, and $R^{r13}$ and $R^{r14}$ are linked to each other to form a ring, the structure represented by Formula (40) is a compound having a carbazole ring.

In a case where the structure represented by Formula (1) is an aromatic heterocyclic ring, the structure represented by Formula (1) is preferably a structure represented by Formula (400) or Formula (50) from the viewpoints of stability, crystallization property, solvent solubility, and yield.

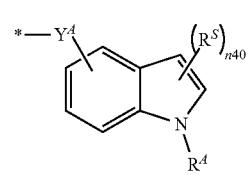

(400)

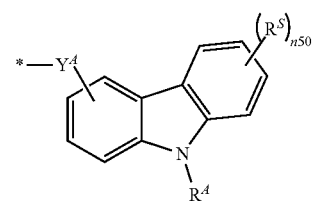

(50)

In Formula (400) or Formula (50), $Y^A$'s each independently represent *—$OCR_2$—**, *—$NRCR_2$—**, or *—$SCR_2$—,  represents a bonding position to an aromatic heterocyclic ring, * represents a bonding position to another structure, R's each independently represent a hydrogen atom, an alkyl group, an aromatic group, or an aromatic group-substituted alkyl group, $R^A$'s are each independently an aliphatic hydrocarbon group or an organic group having an aliphatic hydrocarbon group, where at least one aliphatic hydrocarbon group in one $R^A$ has 12 or more carbon atoms, $R^S$'s each independently represent a substituent, n40 represents an integer of 0 to 5, and n50 represents an integer of 0 to 7.

$Y^A$, $R^A$, and R in Formula (40), Formula (400), or Formula (50) are respectively synonymous with $Y^A$, $R^A$, and R in Formula (1), and the same applies to the preferred aspect thereof.

The substituents in Formula (40), Formula (400), or Formula (50) are each independently preferably an alkoxy group, an aryloxy group, a halogen atom, an alkyl group, a halogenated alkyl group, an aryl group, an acyl group, an acyloxy group, an alkoxycarbonyl group, an aryloxycarbonyl group, an alkylthio group, an arylthio group, $R^{st}$—CO—$NR^{st}$—, —$CON(R^{st})_2$, a dialkylamino group, an alkylarylamino group, a diarylamino group, or a group in which two or more of these are combined, more preferably an alkoxy group, an aryloxy group, a halogen atom, an alkyl group, a halogenated alkyl group, or an aryl group, and still more preferably an alkoxy group or an alkyl group.

n40 is preferably an integer of 0 or 1 and more preferably 0 from the viewpoints of solvent solubility, crystallization property, and yield.

n50 is preferably an integer of 0 to 2, more preferably 0 or 1, and still more preferably 0, from the viewpoints of solvent solubility, crystallization property, and yield.

$R^A$ in Formula (40), Formula (400), or Formula (50) is preferably a group represented by Formula (f1), Formula (a1), Formula (b1), or Formula (e1), more preferably a group represented by Formula (f1) or (a1), still more preferably a group represented by Formula (f1), and particularly preferably a group represented by Formula (f2), from the viewpoints of solvent solubility, crystallization property, and yield.

The molecular weight of the compound having a structure represented by Formula (1) is not particularly limited; however, it is preferably 340 to 3,000, more preferably 400 to 2,000, still more preferably 500 to 1,500, and particularly preferably 800 to 1,300, from the viewpoint of crystallization property, solvent solubility, and yield. In addition, in a case where the molecular weight is 3,000 or less, the proportion of Formula (1) in the target product is proper, and the proportion of the compound obtained by deprotecting Formula (1) does not decrease, and thus the productivity is excellent.

Specific preferred examples of the structure represented by Formula (1) include the structures shown below, which are not limited thereto.

$R^g$ represents an aliphatic hydrocarbon group having 12 or more carbon atoms, preferably an aliphatic hydrocarbon group having 12 to 100 carbon atoms, more preferably an aliphatic hydrocarbon group having 18 to 40 carbon atoms, and particularly preferably an aliphatic hydrocarbon group having 20 to 32 carbon atoms. In addition, the aliphatic hydrocarbon group is preferably a linear alkyl group, a branched alkyl group, or a cyclic alkyl group, and more preferably a linear alkyl group.

In addition, it is noted that in the compounds shown below, * represents a bonding position to another structure and preferably a bonding position to L in Formula (2).

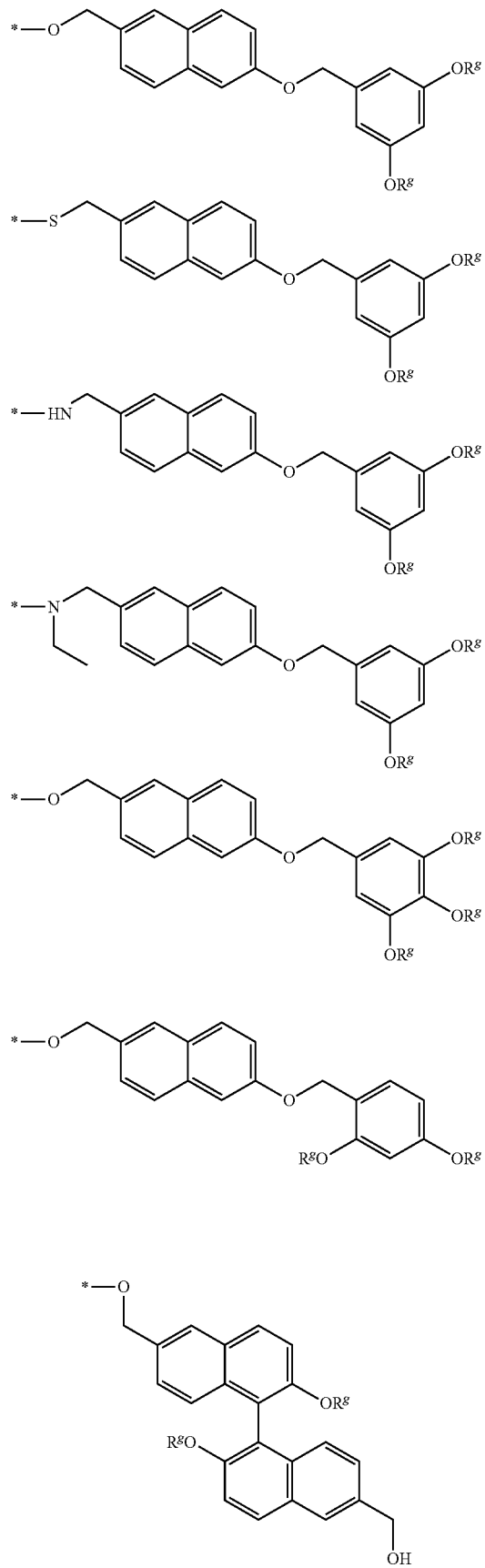

33
-continued
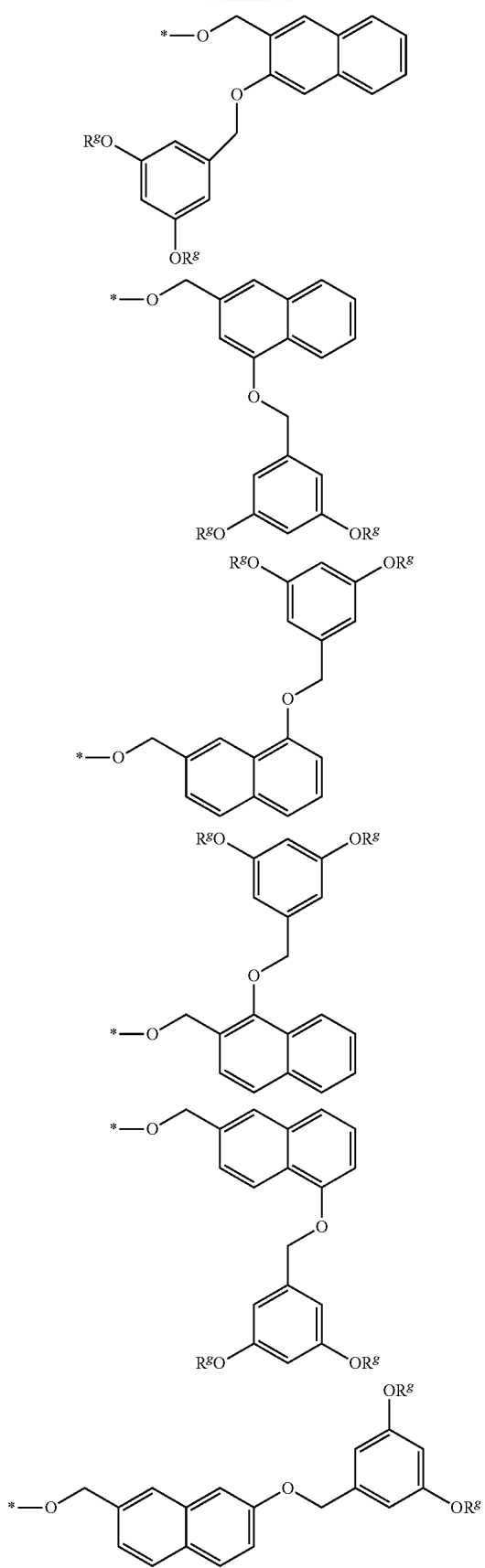
34
-continued
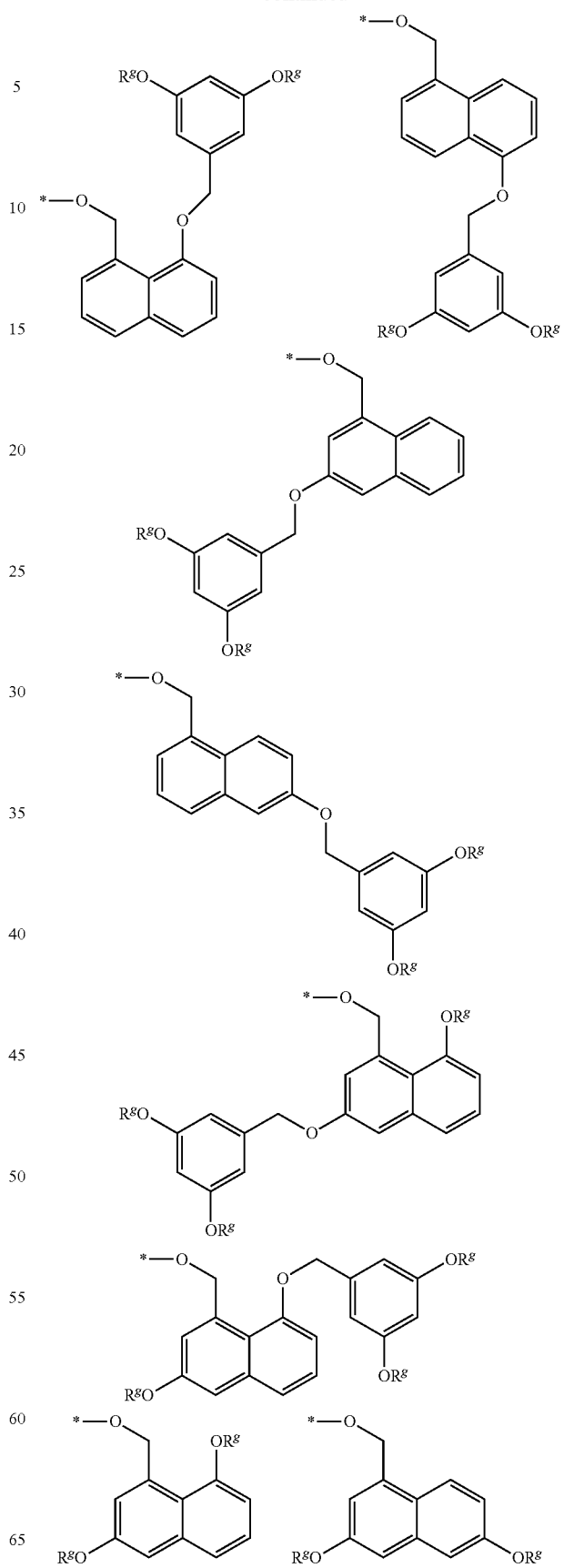

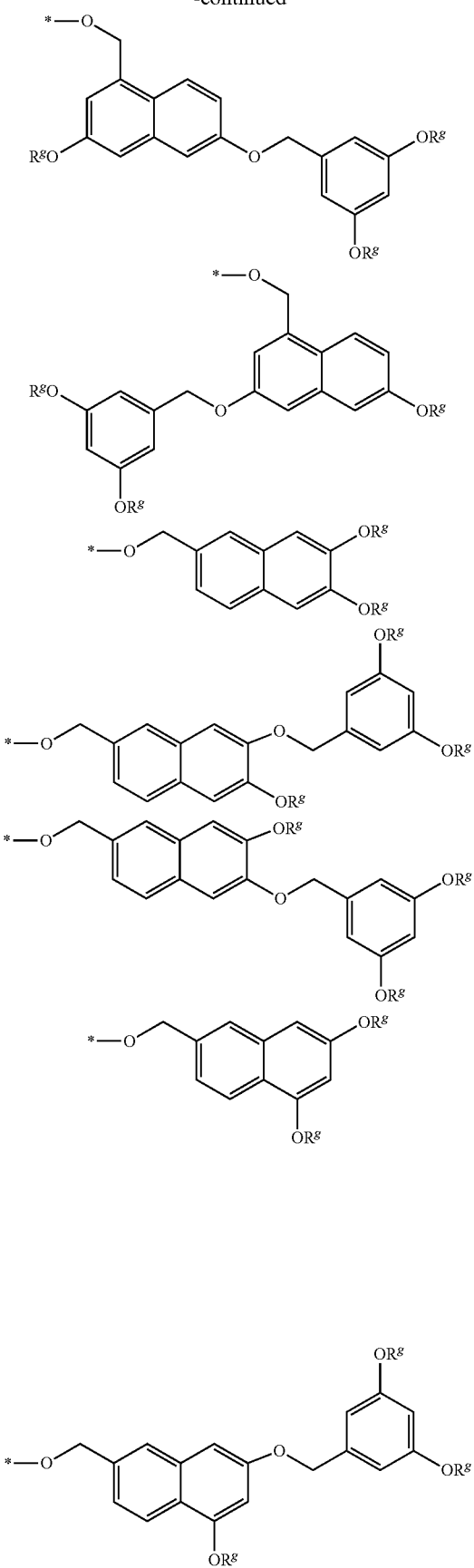
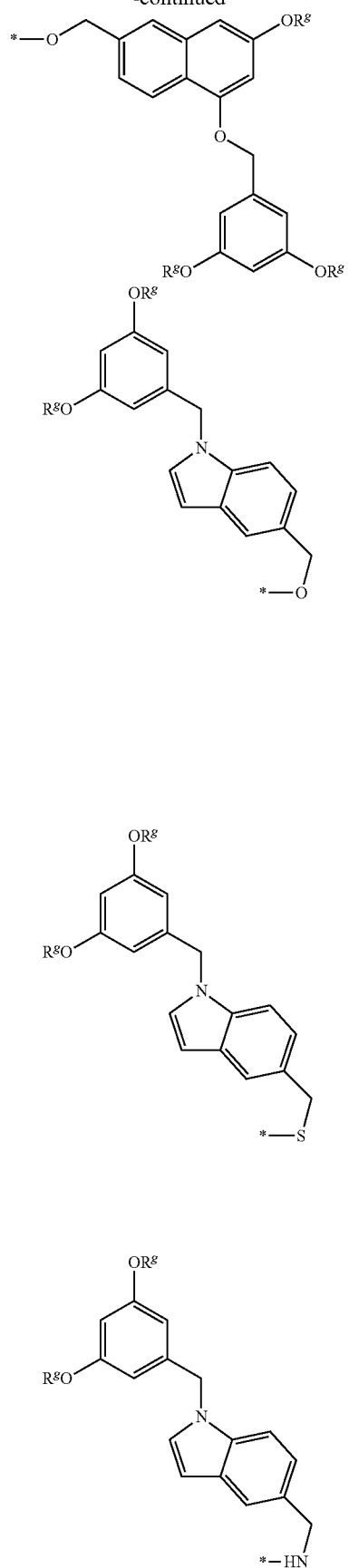

-continued

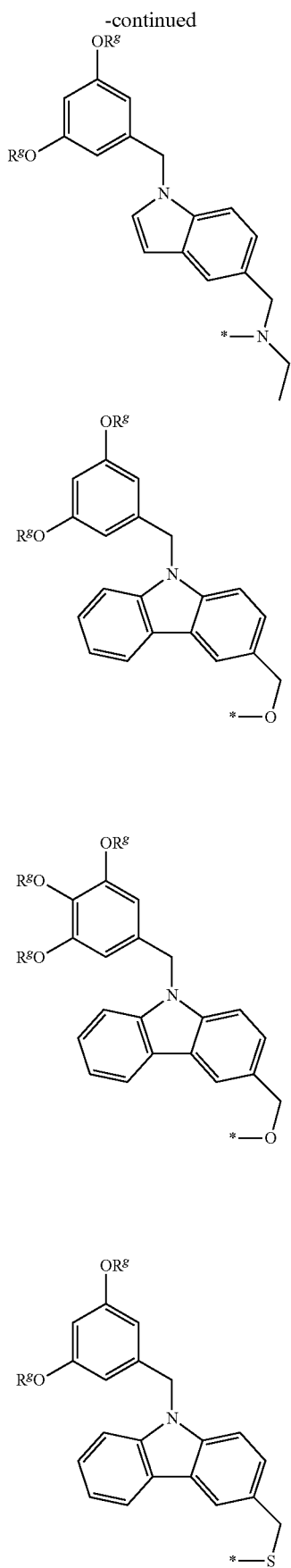

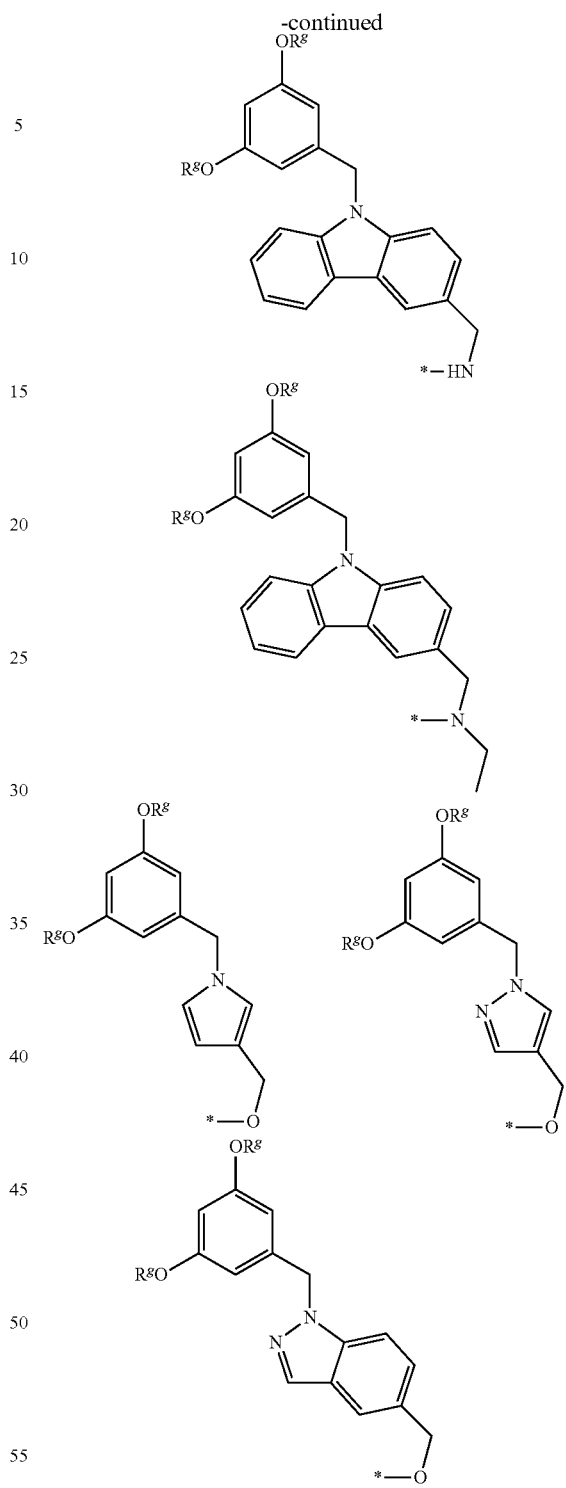

Suitable examples of the compound (the reagent for forming a protective group that forms a compound protected by the structure represented by (Formula (1)) represented by Formula (1)) also include the reagent for forming a protective group described in PCT/JP2020/007477, PCT/JP2020/007478, PCT/JP2020/024231, or PCT/JP2020/024232.

<<Method of Producing Compound that Forms Structure Represented by Formula (1)>>

The method of producing the compound that forms the structure represented by Formula (1) according to the present disclosure is not particularly limited; however, it can be produced with reference to a known method.

Unless otherwise specified, the raw material compound that is used for production may be a commercially available compound or can be produced according to a method known per se or a method equivalent thereto.

In addition, as necessary, the produced compound that forms the structure represented by Formula (1) may be purified by a known purification method. For example, a method of carrying out isolation and purification by recrystallization, column chromatography, or the like, or a method of carrying out purification by reprecipitation by a means for changing the solution temperature, a means for changing the solution composition, or the like can be carried out.

The compound that forms the structure represented by Formula (1) can be synthesized, for example, according to the following scheme. In addition, it can be synthesized with reference to the synthesis method disclosed in WO2010/113939A.

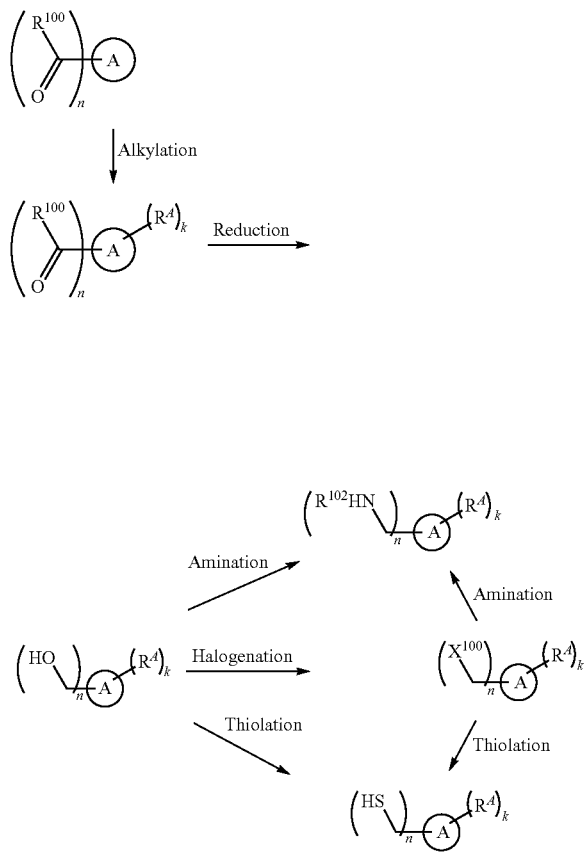

$R^{100}$ represents a hydrogen atom or $OR^{101}$, $R^{101}$ represents an alkyl group, $X^{100}$ represents Cl, Br, or I, $R^{102}$ represents a hydrogen atom or alkyl group, and the ring A represents a condensed polycyclic aromatic hydrocarbon ring or an aromatic heterocyclic ring.

<<Compound Protected by Structure Represented by Formula (1)>>

In the method of producing a nucleic acid compound according to the present disclosure, the compound protected by the structure represented by Formula (1) is preferably a compound represented by Formula (2).

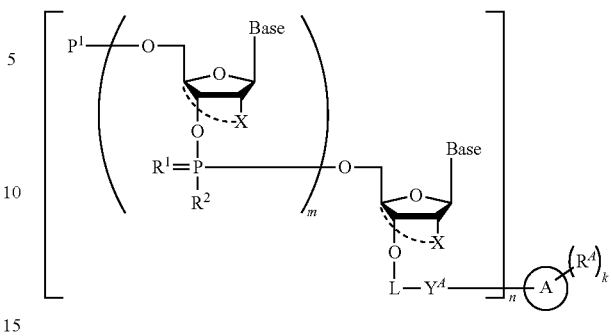

(2)

In Formula (2), m represents any integer of 0 or more,
n represents 1 to 6,
Bases each independently represent a nucleic acid base or a modified nucleic acid base,
$P^1$ represents a hydrogen atom or a hydroxy protective group,
$R^1$ represents an oxygen atom, a sulfur atom, or a borano group,
$R^2$ represents a hydrogen atom, a substituted or unsubstituted hydroxy group, a substituted or unsubstituted mercapto group, a substituted or unsubstituted alkyl group, or a substituted or unsubstituted amino group,
X's each independently represent a hydrogen atom, a hydroxy group, a halogen atom, or an organic group that is crosslinked to a carbon atom at a 4'-position of a ribose structure,
L's each independently represent a single bond or a divalent linking group,
the ring A represents a condensed polycyclic aromatic hydrocarbon ring or an aromatic heterocyclic ring,
$Y^A$'s each independently represent a single bond, *—$OCR_2$—**, *—$NRCR_2$—**, or *—$SCR_2$—**, where * represents a bonding position to L, ** represents a bonding position to the ring A, and R's each independently represent a hydrogen atom, an alkyl group, an aromatic group, or an aromatic group-substituted alkyl group,
k represents an integer of 1 to 5,
$R^A$'s are each independently an aliphatic hydrocarbon group or an organic group having an aliphatic hydrocarbon group, where at least one aliphatic hydrocarbon group in k pieces of $R^A$'s has 12 or more carbon atoms, and
the ring A may further have a substituent in addition to $Y^A$ and $R^A$.

In Formula (2), the ring A, $R^A$, $Y^A$, and k are synonymous with the ring A, $R^A$, $Y^A$, and k in Formula (1), and the same applies to the preferred aspect thereof.

m represents any integer of 0 or more. The upper limit of m is not particularly limited; however, it is preferably 49 or less, more preferably 29 or less, and still more preferably 19 or less.

From the viewpoints of reactivity and yield, m is preferably 0.

In a case where m is 0, the compound represented by Formula (2), which is used in the method of producing a nucleic acid compound according to the present disclosure, represents a "nucleoside" which represents a starting compound for the terminal at the 3-position in the synthesis of the nucleic acid compound.

n represents 1 or 2. From the viewpoints of reactivity and yield, n is preferably 1.

$P^1$ represents a hydrogen atom or a hydroxy protective group (hereinafter, may also be referred to as "may be protected").

The hydroxy protective group as $P^1$ is preferably a hydroxy protective group capable of being deprotected under acidic conditions. Specific examples thereof include a di(alkoxy having 1 to 6 carbon atoms)trityl group such as a trityl group, a 9-(9-phenyl)xanthenyl group, a 9-phenylthioxanthenyl group, or a 1,1-bis(4-methoxyphenyl)-1-phenylmethyl group (a dimethoxytrityl group), and a mono(alkoxy having 1 to 18 carbon atoms)trityl group such as a 1-(4-methoxyphenyl)-1,1-diphenylmethyl group (a monomethoxytrityl group).

Among these, from the viewpoints of ease of deprotection and ease of availability, a monomethoxytrityl group or a dimethoxytrityl group is preferable, and a dimethoxytrityl group is more preferable.

X's each independently represent a hydrogen atom, a hydroxy group, a halogen atom, or an organic group that is crosslinked to a carbon atom at a 4'-position of a ribose structure.

The hydroxy group as X may be protected.

Preferred examples of the protective group include an alkyl group, an aromatic group-substituted alkyl group, an electron-withdrawing group substituted alkyl group, an alkoxy group, an acyl group, an alkoxyalkyl group, a carbamoyl group, and a silyl group.

The halogen atom represented by X is preferably a fluorine atom or a chlorine atom, and more preferably a fluorine atom.

The organic group that is crosslinked to the carbon atom at the 4'-position of the ribose structure is not particularly limited as long as it is crosslinked to the 2'-position and the 4'-position of the ribose structure; however, examples thereof include an alkylene group having 2 to 7 carbon atoms.

In the carbon-carbon bond, the above alkylene group may have one or more (preferably one or two) linking groups selected from —O—, —NR$^{LN}$—, —S—, —CO—, —COO—, —OCONR$^{LN}$—, —CONR$^{LN}$— (R$^{LN}$ represents a hydrogen atom or an alkyl group having 1 to 6 carbon atoms), or the like.

More specific examples thereof include —ORi, —O—NR$^{LN}$—Rj, —O-Rk-O-Rl. Ri, Rj, Rk, and Rl represent an alkylene group having 1 to 6 carbon atoms, which are crosslinked at the 4'-position, and Ri, Rj, Rk, and Rl are each independently preferably a methylene group or an ethylene group.

The organic groups that are crosslinked to the carbon atom at the 4'-position of the ribose structure are preferably *—O—CH$_2$—**, *—O—CH$_2$—CH$_2$—**, and *—O—NR$^{LN}$—CH$_2$—** or *—O—CH$_2$—O—CH$_2$—**, *—S—S—CH$_2$—**, *—NR$^{LN}$—CO—**, and *—NR$^{LN}$—CO—NR$^{LN}$—CH$_2$—**, and they are more preferably *—O—CH$_2$—**, *—O—CH$_2$—CH$_2$—**, *—O—NH—CH$_2$—**, and *—O—N(CH$_3$)—CH$_2$—**, or *—O—CH$_2$—O—CH$_2$—**, *—S—S—CH$_2$—**, *—N(Me)-CO—**, and *—NH—CO—NH—CH$_2$—**.

R$^{LN}$ represents a hydrogen atom or an alkyl group having 1 to 6 carbon atoms, * represents a bonding site to the 2'-position of the ribose structure, and ** represents a bonding site to the 4'-position of the ribose structure.

Examples of the nucleoside in which the 2'-position is crosslinked to the 4'-position include compounds shown below, which are not limited thereto.

Me represents a methyl group, Base represents a nucleic acid base or a modified nucleic acid base, and the wavy line represents a bonding site to another moiety.

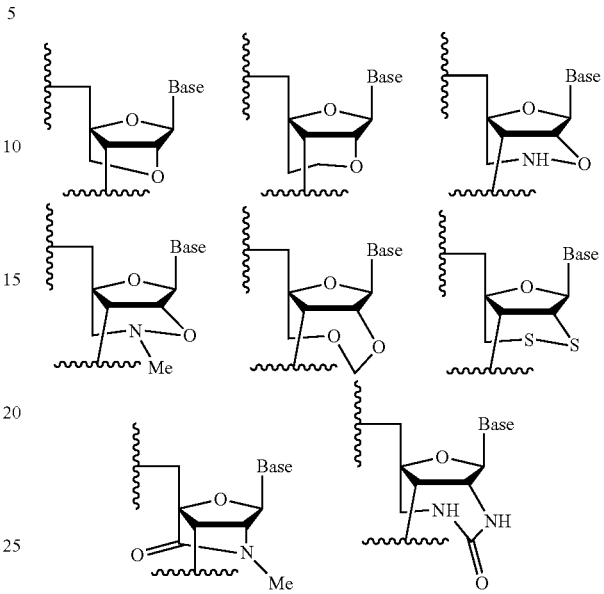

$R^1$ represents an oxygen atom, a sulfur atom, or a borano group (—BH$_3$). From the viewpoints of reactivity and yield, it is preferably an oxygen atom.

$R^2$ represents a hydrogen atom, a substituted or unsubstituted hydroxy group, a substituted or unsubstituted mercapto group, a substituted or unsubstituted alkyl group, or a substituted or unsubstituted amino group.

Examples of the substituent include a halogen atom, an alkyl group, an aromatic group-substituted alkyl group, an alkoxy group, an acyl group, an alkoxyalkyl group, a hydroxy group, an amino group, a monoalkylamino group, a dialkylamino group, a carboxy group, a cyano group, and a nitro group.

$R^2$ is preferably a substituted or unsubstituted hydroxy group, and more preferably a hydroxy group having a substituent. Preferred examples of the substituent of the hydroxy group include the same groups as the protective group of $P^1$, and among these, a 1-nitroethyl group or a 1-cyanoethyl group is preferable, and a 1-cyanoethyl group is more preferable.

From the viewpoints of reactivity and yield, $R^2$ is more preferably a group represented by Formula (2a).

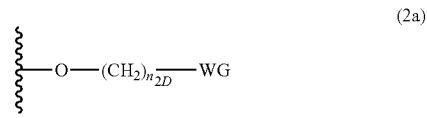

(2a)

In Formula (2a), $n_{2D}$ represents an integer of 1 to 5, WG represents an electron-attracting group, and the wavy line represents a bonding site to the phosphorus atom in Formula (2).

Examples of the electron-attracting group include a cyano group and a nitro group. $n_{2D}$ is preferably 1 to 4, more preferably 1 to 3, still more preferably 1 or 2, and particularly preferably 2.

From the viewpoint of excellent yield, it is preferable that $R^1$ in Formula (2) is an oxygen atom or a sulfur atom and $R^2$ is a substituted or unsubstituted hydroxy group, and it is more preferable that $R^1$ in Formula (2) is an oxygen atom and $R^2$ is a group represented by Formula (2a).

L in Formula (2) is preferably a group represented by Formula (1L).

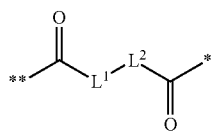

(1L)

In Formula (1L), * represents a bonding position to $Y^A$,
** represents a bonding position to an oxygen atom at a 3-position of a ribose structure,
$L^1$ represents an alkylene group having 1 to 22 carbon atoms, and
$L^2$ represents a single bond or #—C(=O)N($R^{2L}$)—$R^{1L}$—N($R^{3L}$)—##, where # represents a bonding position to L1, ## represents a bonding position to C=O, $R^{1L}$ represents an alkylene group having 1 to 22 carbon atoms, $R^{2L}$ and $R^{3L}$ each independently represent a hydrogen atom or an alkyl group having 1 to 22 carbon atoms, and $R^{2L}$ and $R^{3L}$ may be bonded to each other to form an alkylene group having 1 to 22 carbon atoms.

The preferred aspect of L represented by Formula (1L) is an aspect in which in Formula (1L), $L^1$ represents an ethylene group or $CH_2$—O-1,4-phenylene-O—$CH_2$ and $L^2$ represents a single bond or represents #—C(=O)N($R^{2L}$)—$R^1$—N($R^{3L}$)—##, where # represents a bonding position to $L^1$, ## represents a bonding position to C=O, $R^{1L}$ represents an alkylene group having 1 to 6 carbon atoms, $R^{2L}$ and $R^{3L}$ each independently represent a hydrogen atom or an alkyl group having 1 to 6 carbon atoms, and $R^{2L}$ and $R^{3L}$ may be bonded to each other to form an alkylene group having 1 to 6 carbon atoms.

Another preferred aspect of L represented by Formula (1L) is an aspect in which in Formula (1L), $L^1$ represents an ethylene group and $L^{2L}$ represents a single bond.

In addition, another preferred aspect of L represented by Formula (1L) is an aspect in which in Formula (1L), $L^1$ represents an ethylene group and the N($R^{2L}$)—$R^1$—N($R^3$) moiety in $L^2$ is a group that represents a piperazinylene group.

Further, another preferred aspect of L represented by Formula (1L) is an aspect in which in Formula (1L), $L^1$ represents an ethylene group and $L^2$ is a group represented by #—C(=O)N($R^{2L}$)—$R^{1L}$—N($R^{3L}$)—##. Here, # represents a bonding position to $L^1$, ## represents a bonding position to C=O, $R^{1L}$ represents a pentylene group or a hexylene group, and $R^{2L}$ and $R^{3L}$ each independently represent a hydrogen atom or a methyl group.

The above L is particularly preferably a succinyl group (**—CO—$CH_2$—$CH_2$—CO—*) from the viewpoint of easy availability and low cost.

The preferred aspect of the compound represented by Formula (2) is a compound in which in Formula (2), m is 0, n is 1 or 2, the ring A represents a condensed polycyclic aromatic hydrocarbon ring or an aromatic heterocyclic ring.

Here, Bases are a cytosyl group, a uracil group, a thyminyl group, an adenyl group, or a guanyl group, which may be protected, $P^1$ is a di(alkoxy having 1 to 6 carbon atoms) trityl group or a mono(alkoxy having 1 to 6 carbon atoms) trityl group, X is a hydrogen atom, a hydroxy group, a halogen atom, or an organic group that is crosslinked to the carbon atom at the 4'-position of the ribose structure, L has a structural formula represented by Formula (1L), and $Y^A$ and $R^A$ are the same as the combinations of the respective groups shown as the preferred aspect in Formula (1).

In addition, another preferred aspect of the compound represented by Formula (2) is a compound in which in Formula (2), m is 0, n is 1 or 2, the ring A represents a condensed polycyclic aromatic hydrocarbon ring or an aromatic heterocyclic ring. Here, Bases are a cytosyl group, a uracil group, a thyminyl group, an adenyl group, or a guanyl group, which may be protected, $P^1$ is a dimethoxytrityl group or a monomethoxytrityl group, X is a hydrogen atom, a hydroxy group, a halogen atom, or an organic group that is crosslinked to the carbon atom at the 4'-position of the ribose structure, L has a structural formula represented by Formula (1L), and $Y^A$ and $R^A$ are the same as the combinations of the respective groups shown as the preferred aspect in Formula (1).

Further, another preferred aspect of the compound represented by Formula (2) is a compound in which in Formula (2), m is 0, n is 1 or 2, the ring A represents a condensed polycyclic aromatic hydrocarbon ring or an aromatic heterocyclic ring.

Here, Bases are a cytosyl group, a uracil group, a thyminyl group, an adenyl group, or a guanyl group, which may be protected, $P^1$ is a dimethoxytrityl group, X is a hydrogen atom or a fluorine atom, L has a structural formula represented Formula (1L), and $Y^A$ and $R^A$ are the same as the combinations of the respective groups shown as the preferred aspect in Formula (1).

Specific examples of the compound represented by Formula (2) are shown below; however, it goes without saying that the examples are not limited thereto. It is noted that DMTr represents a dimethoxytrityl group.

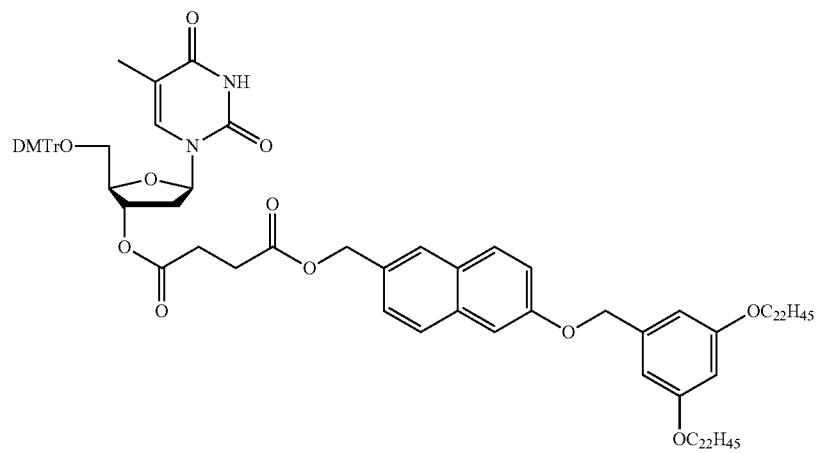
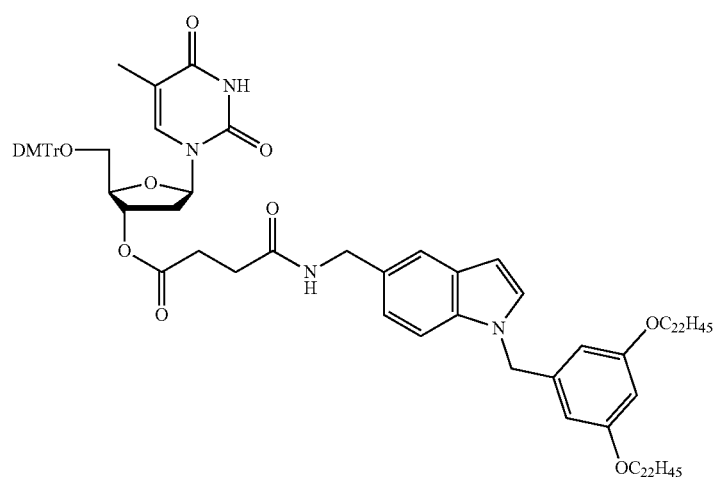
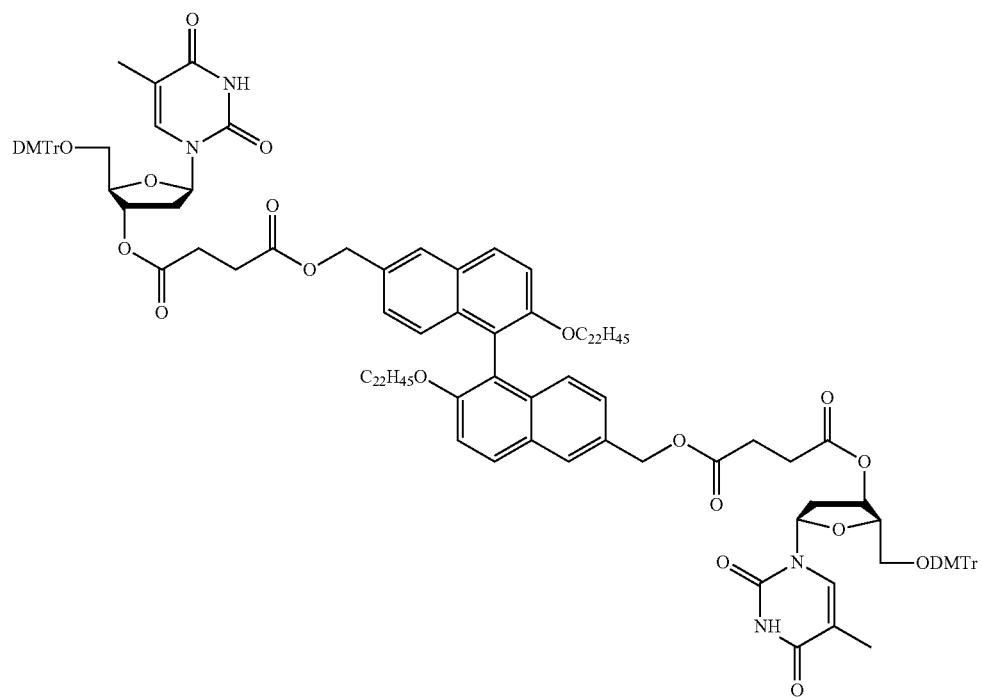

-continued

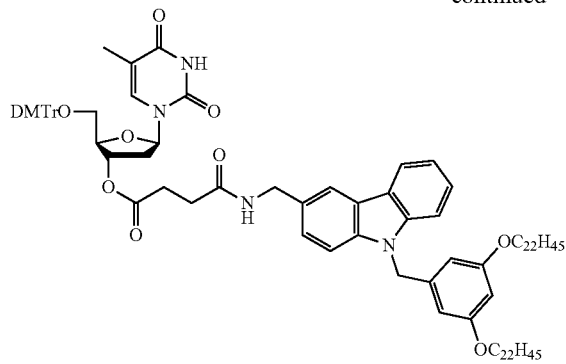

The method of producing a nucleic acid compound according to the resent disclosure is a method in which $P^1$ represents a hydroxy protective group capable of being deprotected by a weak acid, and a liquid phase synthesis method (hereinafter, also referred to as a "liquid phase synthesis method A") is preferably used, where the method includes in the following order;

- a step A: a step (hereinafter, also referred to as a "deprotection step") of deprotecting a 5-terminal of a ribose structure in a nucleic acid compound in which the structure represented by Formula (1) is bonded to a terminal at a 3-position of the ribose structure,
- a step B: a step (hereinafter, also referred to as a "nucleic acid extension step") of reacting a nucleic acid compound obtained in the step A and a nucleic acid compound in which a 3-position of a ribose structure is subjected to phosphoramidation and a hydroxy group at a 5-position of the ribose structure is protected by a protective group capable of being deprotected by a weak acid, to be condensed by a phosphite triester bond,
- a step C: a step (hereinafter, also referred to as an "oxidation or sulfurization step") of reacting a nucleic acid compound obtained in the step B with an oxidizing agent or a sulfurizing agent to convert the phosphite triester bond of the nucleic acid compound into a phosphate triester bond or a thiophosphate triester bond, and
- a step D: a step (hereinafter, also referred to as a "precipitation step") of precipitating a nucleic acid compound obtained in the step C.

In addition, another aspect of the method of producing a nucleic acid compound according to the present disclosure is a method in which $P^1$ represents a hydrogen atom, and a liquid phase synthesis method (hereinafter, also referred to as a "liquid phase synthesis method B") is preferably used, where the method includes in the following order;

- a step B: a step of reacting the nucleic acid compound in which the structure represented by Formula (1) is bonded to a terminal at a 3-position of a ribose structure, and a nucleic acid compound in which a 3-position of a ribose structure is subjected to phosphoramidation and a hydroxy group at a 5-position of the ribose structure is protected by a hydroxy protective group capable of being deprotected by a weak acid, to be condensed by a phosphite triester bond,
- a step C: a step of reacting the nucleic acid compound obtained in the step B with an oxidizing agent or a sulfurizing agent to convert the phosphite triester bond of the nucleic acid compound into a phosphate triester bond or a thiophosphate triester bond,
- a step A: a step of deprotecting a terminal protective group at a 5-position of the nucleic acid compound obtained in the step C, and
- a step D: a step of precipitating the nucleic acid compound obtained in the step A.

The method of producing a nucleic acid compound according to the present disclosure is excellent in yield since the liquid phase synthesis method including the deprotection step, the nucleic acid extension step, and the precipitation step in the specific order is used.

Hereinafter, each of the steps of the liquid phase synthesis methods A and B will be described in detail.

The description for each of the steps shall be common to the liquid phase synthesis methods A and B.

<<Step A; Deprotection Step>>

The deprotection step in the method of producing a nucleic acid compound according to the present disclosure is a step of deprotecting a terminal protective group at a 5-terminal of the nucleic acid compound.

The nucleic acid compound of which the terminal protective group at a 5-terminal is deprotected may be a nucleic acid compound in which the structure represented by Formula (1) is bonded to the terminal at a 3-position of the ribose structure or may be a nucleic acid compound obtained in the nucleic acid extension step and the oxidation or sulfurization step.

The deprotection step in the method of producing a nucleic acid compound according to the present disclosure is preferably a step of deprotecting a terminal protective group at a 5-position of the nucleic acid compound by the addition of an acid.

In a case where the nucleic acid extension step is provided after the deprotection step, the deprotection step in the method of producing a nucleic acid compound according to the present disclosure preferably includes a step of carrying out neutralization by the addition of an organic base after removing the terminal hydroxy protective group at the 5-position by the addition of an acid.

The acid that is used for removing the terminal hydroxy protective group at the 5-position of the ribose structure is not particularly limited as long as the removal of the hydroxy protective group can be achieved; however, examples thereof include trifluoroacetic acid, dichloroacetic acid, trifluoromethanesulfonic acid, trichloroacetic acid, methanesulfonic acid, hydrochloric acid, acetic acid, and p-toluenesulfonic acid.

From the viewpoint of deprotection reactivity, the acid is preferably trifluoroacetic acid, dichloroacetic acid, trifluoromethanesulfonic acid, or trichloroacetic acid, more preferably trifluoroacetic acid, dichloroacetic acid, or trifluoromethanesulfonic acid, still more preferably trifluoroacetic acid or trifluoromethanesulfonic acid, and particularly preferably trifluoroacetic acid.

These acids may be used after dilution with a non-polar solvent described later. Further, the acidity may be appropriately adjusted and used in combination with the above-described acid and a specific base.

The using amount of the acid is preferably 1 mol to 100 mol, more preferably 1 mol to 40 mol, with respect to 1 mol of the nucleic acid compound to be deprotected.

The deprotection step is preferably carried out in a solvent that does not affect the reaction.

From the viewpoint of deprotection reactivity, the solvent that is used in the deprotection step is preferably a non-polar solvent in which the nucleic acid compound has high solubility.

Specific examples of the non-polar solvent include halogen-based solvents such as chloroform, dichloromethane, and 1,2-dichloroethane; aromatic solvents such as benzene, toluene, xylene, and mesitylene; ester-based solvents such as ethyl acetate and isopropyl acetate; aliphatic solvents such as hexane, pentane, heptane, octane, nonane, and cyclohexane; and non-polar ether-based solvents such as diethyl ether, cyclopentyl methyl ether, and tert-butyl methyl ether. Two or more of these solvents may be mixed in an appropriate ratio and used.

Further, a polar solvent such as a nitrile-based solvent such as acetonitrile or propionitrile or an amide-based solvent such as N,N-dimethylformamide, N,N-dimethylacetamide, or N-methylpiperidone may be mixed with the non-polar solvent in an appropriate ratio and used as long as the nucleic acid compound is capable of being dissolved.

Among the above, the non-polar solvent is preferably dichloromethane, chloroform, 1,2-dichloroethane, benzene, toluene, xylene, mesitylene, hexane, pentane, heptane, nonane, cyclohexane, ethyl acetate, isopropyl acetate, tert-butylmethyl ether, cyclopentyl methyl ether, or a combination thereof, and chloroform, dichloromethane, or toluene is particularly preferable.

In the deprotection step, the content of the nucleic acid compound in the solvent is not particularly limited as long as it is dissolved; however, it is preferably 1% by mass to 30% by mass with respect to the total mass of the solvent.

In the deprotection step, a cation scavenger is preferably used during the removal reaction or after the removal reaction of the terminal hydroxy protective group at the 5-position of the ribose structure from the viewpoint of continuously carrying out steps other than the deprotection step in the liquid phase.

The cation scavenger is not particularly limited as long as the reprotection (return to the raw material) by the removed protective group does not proceed.

In the deprotection step, the using amount of the cation scavenger is preferably 1 mol to 50 mol and more preferably 5 mol to 20 mol with respect to 1 mol of the nucleic acid compound.

The cation scavenger may be used alone, or two or more thereof may be used in combination.

The reaction temperature in the deprotection step is not particularly limited as long as the reaction proceeds; however, it is preferably −10° C. to 50° C. and more preferably 0° C. to 40° C.

The reaction time varies depending on the kind of nucleic acid compound, the kind of acid, the kind of solvent, the reaction temperature, or the like; however, it is preferably 5 minutes to 5 hours.

In the method of producing a nucleic acid compound according to the present disclosure, in a case where a condensation step is provided after the deprotection step, it is preferable to remove or neutralize the acid used for removing the hydroxy protective group, and it is more preferable to neutralize the acid used for removing the hydroxy protective group with an organic base, from the viewpoints that the 3-position of the ribose structure is subjected to phosphoramidation and the hydroxy group at the 5-position suppresses the deprotection of the nucleic acid compound protected by a protective group capable of being deprotected by a weak acid.

Suitable examples of the organic base compound that is used for neutralization include those capable of neutralizing the above-described acid, where an obtained salt is capable of functioning as a condensing agent.

From the viewpoint that the reaction proceeds well, the organic base is preferably pyridine, 2,4,6-trimethylpyridine, benzimidazole, 1,2,4-triazole, N-phenylimidazole, 2-amino-4,6-dimethylpyrimidine, 1,10-phenanthroline, imidazole, N-methylimidazole, 2-chlorobenzimidazole, 2-bromobenzimidazole, 2-methylimidazole, 2-phenylbenzimidazole, N-phenylbenzimidazole, or 5-nitrobenzimidazole, more preferably pyridine, 2,4,6-trimethylpyridine, benzimidazole, 1,2,4-triazole, N-phenylimidazole, N-methylimidazole, 2-amino-4,6-dimethylpyrimidine, or 1,10-phenanthroline, still more preferably pyridine, 2,4,6-trimethylpyridine, benzimidazole, 1,2,4-triazole, or N-phenylimidazole, particularly preferably pyridine, 2,4,6-trimethylpyridine, benzimidazole, or 1,2,4-triazole, and most preferably pyridine, 2,4,6-trimethylpyridine, or benzimidazole.

In the deprotection step, the using amount of the organic base is preferably 1 mol to 10 mol and more preferably 1 mol to 3 mol with respect to 1 mol of the acid.

In the deprotection step, the combination of the acid and the organic base is preferably trifluoroacetic acid and pyridine, trifluoroacetic acid and 2,4,6-trimethylpyridine, or trifluoromethanesulfonic acid and benzimidazole.

<<Step B; Nucleic Acid Extension Step>>

The nucleic acid extension step in the method of producing a nucleic acid compound according to the present disclosure is a step of reacting the nucleic acid compound in which the structure represented by Formula (1) is bonded to the terminal at the 3-position, and a nucleic acid compound in which a 3-position of a ribose structure is subjected to phosphoramidation and a hydroxy group at a 5-position of the ribose structure is protected by a protective group capable of being deprotected by a weak acid, to be condensed by a phosphite triester bond.

The nucleic acid compound that is used in the nucleic acid extension step, in which the 3-position of the ribose structure is subjected to phosphoramidation and the hydroxy group at the 5-position is protected by a protective group capable of being deprotected by a weak acid is preferably a compound represented by the following formula M-1.

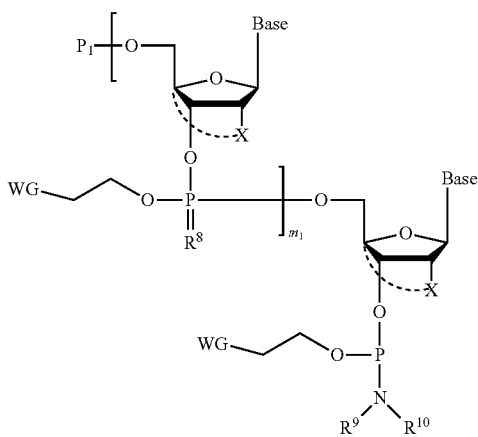

M-1

In Formula M-1, $P^1$ represents a hydroxy protective group, WG represents an electron-attracting group, X's each independently represent a hydrogen atom, a hydroxy group, a halogen atom, or an organic group that is crosslinked to a carbon atom at a 4-position of a ribose structure, $R^8$ represents an oxygen atom or a sulfur atom, $R^9$ and $R^{10}$ each independently represent an alkyl group or a 5-membered or 6-membered saturated cyclic amino group that is formed together with an adjacent nitrogen atom, and m1 represents an integer of 0 or more.

$P^1$, X, and m1 are respectively synonymous with $P^1$, X, and m1 in Formula (2), and the same applies to the preferred aspect thereof. Examples of the electron-attracting group include a cyano group and a nitro group.

The saturated cyclic amino group as $R^9$ and $R^{10}$ may have one oxygen atom or one sulfur atom as the ring-constituting atom in addition to the nitrogen atom.

That is, in a case where m1 is 1, the compound represented by Formula M-1 is a nucleoside in which the 5-position is protected by $P^1$ and the 3-position is subjected to phosphoramidation.

The nucleic acid compound that is used in the nucleic acid extension step, in which the 3-position of the ribose structure is subjected to phosphoramidation and the hydroxy group at the 5-position of the nucleic acid compound is protected by a protective group capable of being deprotected by a weak acid, can be produced according to a known method (M. H. Caruthers et al., Method in Enzymology 1987, 154, 287-313; S. L. Beaucage and M. H. Caruthers, Tetrahedron Letters 1981, 22, 1859-1862.) in which a phosphoramidation reagent represented by General Formula (c) or (d) is reacted with a polynucleoside obtained by polymerizing m1 pieces of nucleosides in which the 5-position of the ribose structure is protected by $P^1$ and the hydroxy group at the 3-position of the ribose structure is not protected by the hydroxy group.

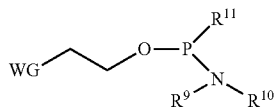

(c)

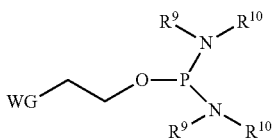

(d)

In Formulae (c) and (d), $R^{11}$ represents a halogen atom, and WG, $R^9$, and $R^{10}$ are synonymous with $R^9$, $R^{10}$, WG in Formula M-1.

The nucleic acid extension step is preferably carried out in a solvent that does not affect the reaction. Specific examples of the solvent include the non-polar solvents as those in the deprotection step (1) described above.

In addition, as long as the nucleic acid compound of which the hydroxy protective group $P^1$ at the 5-position of the ribose structure has been removed is capable of being dissolved, the non-polar solvent may be mixed in an appropriate ratio and used, by mixing with a nitrile-based solvent such as acetonitrile or propionitrile; a ketone-based solvent such as acetone or 2-butanone; amide-based solvent such as N,N-dimethylformamide, N,N-dimethylacetamide, or N-methylpyrrolidone; a polar ether-based solvent such as 1,4-dioxane or tetrahydrofuran; and a sulfoxide-based solvent such as dimethyl sulfoxide.

In this case, the polar solvent is preferably an amide-based solvent, a nitrile-based solvent, or a combination thereof, more preferably acetonitrile, N,N-dimethylformamide, N-methylpiperidone, or a combination thereof, and particularly preferably acetonitrile.

The polar solvent may be added as a solution of a nucleic acid or compound in which the ribose structure at the 3-position is subjected to phosphoramidation and the ribose structure at the 5-position is protected, or as a solution of a condensing agent or the like.

The using amount of the nucleic acid compound in which the 3-position of the ribose structure is subjected to phosphoramidation and the 5-position is protected by $P^1$ is preferably 1 mol to 10 mol and more preferably 1 mol to 5 mol with respect to 1 mol of the nucleic acid compound in which $P^1$, which has been obtained in the deprotection step, at the 5-position of the ribose structure has been removed.

The reaction temperature in the nucleic acid extension step is not particularly limited as long as the reaction proceeds; however, it is preferably 0° C. to 100° C. and more preferably 20° C. to 50° C.

The reaction time in the nucleic acid extension step can be appropriately set depending on the kind of nucleic acid compound to be condensed, the reaction temperature, and the like, and it is preferably 5 minutes to 24 hours.

<<Step C; Oxidation or Sulfurization Step>>

The oxidation or sulfurization step in the method of producing a nucleic acid compound according to the present disclosure is a step of reacting the nucleic acid compound obtained in the step before the oxidation or sulfurization step with an oxidizing agent or a sulfurizing agent to convert the phosphite triester bond of the nucleic acid compound into a phosphate triester bond or a thiophosphate triester bond.

The "oxidizing agent" that is used in the oxidation or sulfurization step is not particularly limited as long as it can oxidize the phosphite triester bond to a phosphate triester bond without oxidizing other moieties; however, it is preferable to use iodine, (1S)-(+)-(10-camphanylsulfonyl) oxaziridine, tert-butyl hydroperoxide (TBHP), 2-butanone peroxide, 1,1-dihydroperoxycyclododecane, bis(trimethylsilyl)peroxide, or m-chloroperbenzoic acid.

From the viewpoint that a good oxidation reaction can be achieved, iodine, (1S)-(+)-(10-camphanylsulfonyl)oxaziridine, tert-butyl hydroperoxide, 2-butanone peroxide, 1,1-dihydroperoxycyclododecane is more preferable, iodine, (1S)-(+)-(10-camphanylsulfonyl)oxaziridine, tert-butyl hydroperoxide, 2-butanone peroxide is still more preferable, iodine, tert-butyl hydroperoxide is even still more preferable, and iodine is particularly preferable.

The oxidizing agent can be diluted with an appropriate solvent to a concentration of 0.05 (mol/L) (hereinafter, may also be referred to as "M") to 2 M and used.

The diluting solvent is not particularly limited as long as it is a solvent inert to the reaction; however, examples thereof include pyridine, THF, dichloromethane, water, and any mixed solvent thereof.

Among them, for example, iodine/water/pyridine-THF or iodine/pyridine-acetic acid, a peroxidizing agent (TBHP)/dichloromethane, or tert-butyl hydroperoxide/nonane is preferably used.

The "sulfurizing agent" that is used in the oxidation or sulfurization step is not particularly limited as long as it can convert the phosphite triester bond into a thiophosphate triester bond; however, it is preferable to use 3-((N,N-dimethylaminomethylidene)amino)-3H-1,2,4-dithiazole-5-thione (DDTT), 3H-1,2-benzodithiol-3-one-1,1-dioxide (a Beaucage reagent), 3H-1,2-benzodithiol-3-one, phenylacetyldisulfide (PADS), tetraethylthiuram disulfide (TETD), 3-amino-1,2,4-dithiazole-5-thione (ADTT), or sulfur.

From the viewpoint that a good reaction is capable of proceeding, it is more preferably 3-((N,N-dimethylaminomethylidene)amino)-3H-1,2,4-dithiazole-5-thione (DDTT), 3H-1,2-benzodithiol-3-one-1,1-dioxide (a Beaucage reagent), 3H-1,2-benzodithiol-3-one, phenylacetyldisulfide (PADS), still more preferably 3-((N,N-dimethylaminomethylidene)amino)-3H-1,2,4-dithiazole-5-thione, 3H-1,2-benzodithiol-3-one-1,1-dioxide, and particularly preferably 3-((N,N-dimethylaminomethylidene)amino)-3H-1,2,4-dithiazole-5-thione.

The sulfurizing agent can be diluted with an appropriate solvent to a concentration of 0.05 M to 2 M and used.

The diluting solvent is not particularly limited as long as it is a solvent inert to the reaction; however, examples thereof include dichloromethane, acetonitrile, pyridine, and any mixed solvent thereof.

The using amount of the oxidizing agent or sulfurizing agent is preferably 1 mol to 50 mol and more preferably 1 mol to 5 mol with respect to 1 mol of the nucleic acid compound obtained in the nucleic acid extension step.

The reaction temperature in the oxidation or sulfurization step is not particularly limited as long as the reaction proceeds; however, it is preferably 0° C. to 100° C. and more preferably 20° C. to 50° C.

The reaction time can be appropriately set depending on the kind of the nucleic acid compound obtained in the nucleic acid extension step, the kind of the oxidizing agent or sulfurizing agent to be used, the reaction temperature, and the like, and it is preferably 1 minute to 3 hours.

<<Step D; Precipitation Step>>

The method of producing a nucleic acid compound according to the present disclosure includes a step of precipitating the nucleic acid compound obtained in the step before the precipitation step.

The method of precipitating the nucleic acid compound obtained in the step C in the precipitation step is preferably a method of carrying out precipitation using a polar solvent.

Examples of the polar solvent include alcohol-based solvents such as methanol, ethanol, and isopropanol; nitrile-based solvents such as acetonitrile and propionitrile; ketone-based solvents such as acetone and 2-butanone; polar ether-based solvents such as 1,4-dioxane and tetrahydrofuran; amide-based solvents such as dimethylformamide, dimethylacetamide, N-methylpiperidone; sulfoxide-based solvents such as dimethyl sulfoxide; water; and the like, and mixed solvents of two or more of these.

Among the above polar solvents, an alcohol-based solvent or a nitrile-based solvent is preferable, and methanol or acetonitrile is more preferable.

The polar solvent in the precipitation step is preferably methanol, particularly from the practical viewpoint. The polar solvent may contain water to minimize the loss of the target product into the polar solvent. In particular, in a case where acetonitrile is used as the polar solvent, the target product tends to be dissolved in the polar solvent and the loss thereof tends to increase, and the loss thereof can be minimized by using acetonitrile containing a small amount of water.

In this case, the content of the water in the polar solvent is preferably 1% by volume (v/v) to 10% by volume (v/v) and more preferably 3% by volume (v/v) to 8% by volume (v/v). In a case where the content of the water in the polar solvent is 1% by volume or more, the loss of the target product into the polar solvent can be suppressed, and in a case where the content of the water in the polar solvent is 10% by volume or less, it tends to be easy to remove unnecessary substances in the polar solvent.

In a case where iodine is used as the oxidizing agent, a solution obtained by saturating sodium thiosulfate (also referred to as hypo), which is a precipitation solvent, in methanol may be used. This makes it possible to remove the coloration due to iodine and to isolate with high purity a nucleic acid compound in which the 5-position of the ribose structure is protected.

In a case where a sulfurizing agent is used, a solution obtained by saturating a reducing agent such as a trivalent phosphorus reagent (for example, trimethylphosphite, triethylphosphite, or tris(2-carboxyethyl) phosphine), the hypo, or the like in methanol which is a precipitation solvent may be used. This makes it possible to isolate with high purity a nucleic acid compound in which the 5-position of the ribose structure is protected.

Examples of the method of producing a nucleic acid compound, the method including the above steps A to D, include the following scheme, which are not particularly limited.

It is noted that in the following scheme, $R^1$, $R^2$, X, m1, L, $Y^A$, n, the ring A, and $R^A$ are respectively synonymous with $R^1$, $R^2$, X, m1, L, $Y^A$, n, the ring A, and $R^A$ in Formula (2).

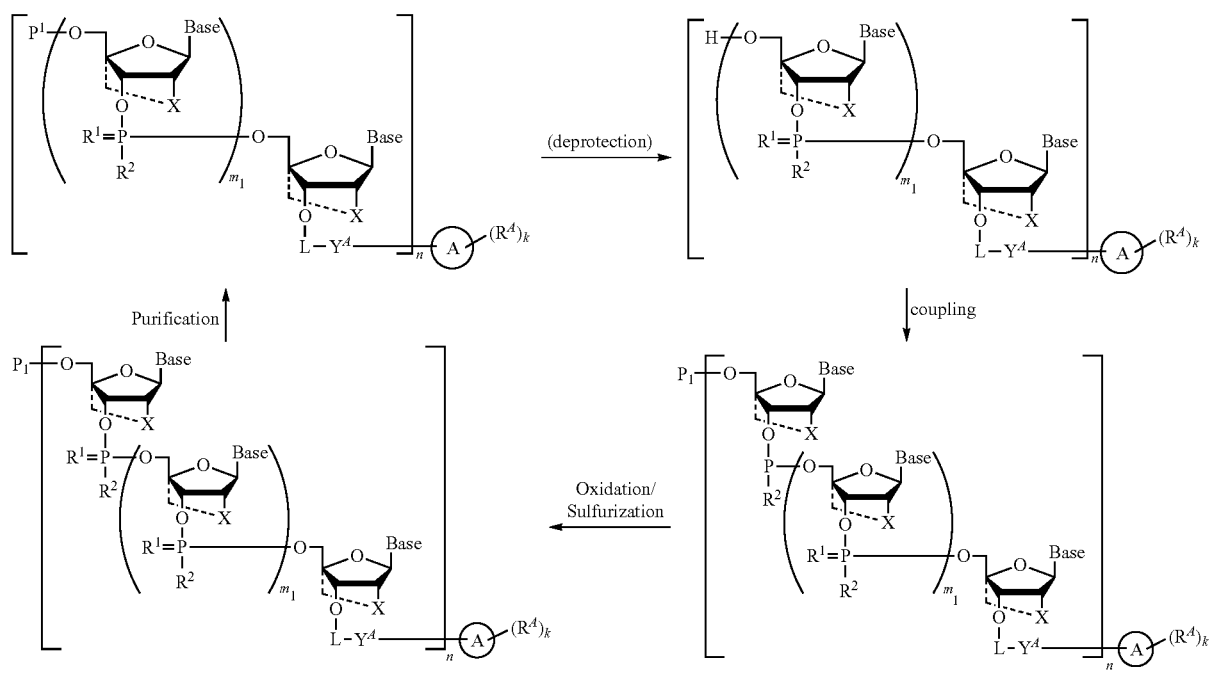

In the method of producing a nucleic acid compound according to the present disclosure, it is possible to obtain a target nucleic acid compound with high purity and high yield by repeating the desired number of times of the above steps A to D.

<<Step E; Nucleic Acid Compound Isolation Step>>

The method of producing a nucleic acid compound according to the present disclosure preferably includes a step of deprotecting each protective group in the nucleic acid compound obtained in step D and isolating the nucleic acid compound after the above steps A to D.

Examples of the method of deprotecting a protective group of a nucleic acid base may adopt a step of removing a protective group according to the deprotection method described in Protective Groups in Organic Synthesis, 3rd Edition, JOHNWILLY & SONS, Inc. (1999) or the like.

Specifically, the phenoxyacetyl group or acetyl group which is a protective group of the nucleic acid base, and the cyanoethyl group which protects the phosphate skeleton can be removed by being treated with aqueous ammonia, an aqueous ammonia/ethanol solution, or a mixed solution of aqueous ammonia and an aqueous methylamine solution.

Further, the terminal hydroxy protective group at the 5-terminal of the nucleotide can be removed by being treated with the acid that is used in the step A or a solution obtained by appropriately diluting it.

Since the nucleic acid compound or the like that does not have a protective group, that is, a nucleotide or the like in which $P^1$ at the 5-position of the ribose structure is a hydrogen atom is easily decomposed by an enzyme, it is preferable to isolate the nucleic acid compound under the control of air cleanliness.

Further, the conditions for deprotection of the structure represented by Formula (1) can be appropriately set depending on L in Formula (2).

As the structural condition of the compound represented by Formula (1), for example, in a case where L in Formula (1) is Formula (1L), a deprotection method using a basic compound is preferable, and the removal can be carried out by treating with aqueous ammonia, an ammonia/ethanol solution, or a mixed solution of aqueous ammonia and an aqueous methylamine solution.

The nucleic acid compound, which is the final target product obtained by the method of producing a nucleic acid compound according to the present disclosure, can be isolated and purified according to a method commonly used in the method of synthesizing a nucleic acid compound. For example, the nucleic acid compound which is the final target product can be isolated and purified by subjecting the reaction mixture to extraction and washing, crystallization, chromatography, or the like.

Regarding the checking of the progress of the reaction in each of the above steps, the same method as that for a general liquid phase organic synthesis reaction can be applied. That is, the reaction can be traced using thin layer silica gel chromatography, high performance liquid chromatography, or the like.

The nucleic acid compound obtained in the step (D) or the step (E) can be further subjected to a synthesis reaction to lead to a desired nucleic acid compound derivative.

The nucleic acid compound produced by the method of producing a nucleic acid compound according to the present disclosure can be used for various use applications such as various pharmaceutical products for humans or animals (RNA, DNA, oligonucleic acid medicine, and the like), functional foods, specified health foods, foods, chemical products, and biological or industrial macromolecular materials.

(Nucleic Acid Compound)

The nucleic acid compound according to the present disclosure is a nucleic acid compound in which a hydroxy group of any one of a 3-position or a 5-position of a ribose structure is protected by a structure represented by Formula (1a).

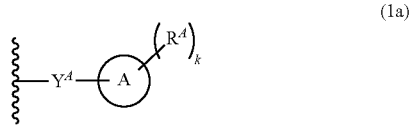
(1a)

In Formula (1), a ring A represents a condensed polycyclic aromatic hydrocarbon ring or an aromatic heterocyclic ring,
$Y^A$ represents *—$OCR_2$—**, *—$NRCR_2$—**, or *—$SCR_2$—**, where the R's each independently represent a hydrogen atom, an alkyl group, an aromatic group, or an aromatic group-substituted alkyl group,
k represents an integer of 1 to 5,
a wavy line portion and * represent a bonding position to a hydroxy group at a 3-position or 5-position of a ribose structure or a bonding position to another structure,
** represents a bonding position to a ring A,
$R^A$'s are each independently an aliphatic hydrocarbon group or an organic group having an aliphatic hydrocarbon group, where at least one aliphatic hydrocarbon group in k pieces of $R^A$'s has 12 or more carbon atoms, and
the ring A may further have a substituent in addition to $Y^A$ and $R^A$.

The nucleic acid compound according to the present disclosure, in which any one of the 3-position or the 5-position of the ribose structure is protected by the structure represented by Formula (1a) is a novel compound and can be suitably used for the production of a nucleic acid compound.

The structure represented by Formula (1a) in the compound according to the present disclosure is the same as the structure represented by Formula (1a) in the above-described method of producing a nucleic acid compound according to the present disclosure, and the same applies to the preferred aspect thereof except for the preferred aspect described later.

Further, the structure represented by Formula (1a) can be synthesized in the same manner as the structure represented by Formula (1a).

The nucleic acid compound protected by the structure represented by Formula (1a) is preferably a compound represented by Formula (2a).

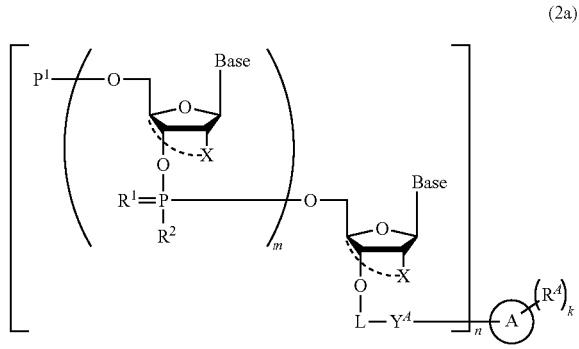
(2a)

In Formula (2a), m represents any integer of 0 or more,
n represents 1 to 6,
Bases each independently represent a nucleic acid base or a modified nucleic acid base,
$P^1$ represents a hydrogen atom or a protective group,
$R^1$ represents an oxygen atom, a sulfur atom, or a borano group,
$R^2$ represents a hydrogen atom, a substituted or unsubstituted hydroxy group, a substituted or unsubstituted mercapto group, a substituted or unsubstituted alkyl group, or a substituted or unsubstituted amino group,
X's each independently represent a hydrogen atom, a hydroxy group, a halogen atom, or an organic group that is crosslinked to the carbon atom at the 4'-position of the ribose structure,
L's each independently represent a single bond or a divalent linking group,
the ring A represents a condensed polycyclic aromatic hydrocarbon ring or an aromatic heterocyclic ring,
$Y^A$'s each independently represent a single bond, *—$OCR_2$—**, *—$NRCR_2$—**, or *—$SCR_2$—**,
where * represents a bonding position to L,
** represents a bonding position to a ring A,
R's each independently represent a hydrogen atom, an alkyl group, an aromatic group, or an aromatic group-substituted alkyl group,
k represents an integer of 1 to 5,
$R^A$'s are each independently an aliphatic hydrocarbon group or an organic group having an aliphatic hydrocarbon group, where at least one aliphatic hydrocarbon group in k pieces of $R^A$'s has 12 or more carbon atoms, and
the ring A may further have a substituent in addition to $Y^A$ and $R^A$.

In Formula (2a), m, n, Base, $P^1$, $R^2$, X, $R^1$, L, the ring A, $Y^A$, and $R^A$ are respectively synonymous with m, n, Base, $P^1$, $R^2$, X, $R^1$, L, the ring A, $Y^A$, and $R^A$, in Formula (2) described above, and the same applies to the preferred aspect thereof.

Further, the compound represented by Formula (2a) can be synthesized in the same manner as the compound represented by Formula (2).

EXAMPLES

Hereinafter, the embodiments of the present invention will be described more specifically with reference to Examples. The materials, using amounts, proportions, treatment content, treatment procedure, and the like disclosed in the following Examples can be modified as appropriate as long as the gist of the embodiments of the present invention is maintained. Therefore, the scope of the embodiments of the present invention is not limited to the specific examples described below. Unless otherwise specified, "parts" and "%" are based on mass.

Unless otherwise specified, the purification by column chromatography was carried out using an automatic purification device ISOLERA (manufactured by Biotage, LLC) or a medium pressure liquid chromatograph YFLC-Wprep 2XY. N (manufactured by Yamazen Corporation).

Unless otherwise specified, as the carrier in the silica gel column chromatography, SNAP KP-Sil Cartridge (manufactured by Biotage, LLC) and High-Flash column W001, W002, W003, W004, or W005 (manufactured by Yamazen Corporation were used.

The mixing ratio in the eluent used for column chromatography is based on the volume ratio. For example, the "gradient elution of hexane:ethyl acetate=50:50 to 0:100" means that the eluent of 50% hexane/50% ethyl acetate was changed to finally an eluent of 0% hexane/100% ethyl acetate.

Further, for example, the "gradient elution of hexane:ethyl acetate=50:50 to 0:100, and gradient elution of methanol:ethyl acetate=0:100 to 20:80" means that the eluent of 50% hexane/50% ethyl acetate was changed to an eluent of 0% hexane/100% ethyl acetate, and then the eluent was switched to an eluent of 0% methanol/100% ethyl acetate and finally changed to an eluent of 20% methanol/80% ethyl acetate.

The MS spectrum was measured using ACQUITY SQD LC/MS System (manufactured by Waters Corporation, ionization method: an electrospray Ionization (ESI) method).

The NMR spectrum was measured using Bruker AV300 (manufactured by Bruker, 300 MHz) or Bruker AV400 (manufactured by Bruker, 400 MHz) using tetramethylsilane as an internal reference, and all δ values were shown in terms of ppm.

The abbreviations used in Examples are as follows.
TFA: trifluoroacetic acid
NMP: N-methyl-2-pyrrolidone
THF: tetrahydrofuran
HBTU: 0-(benzotriazole-1-yl)-N,N,N',N'-tetramethyluronium hexafluorophosphate
DMAP: N,N-dimethyl-4-aminopyridine
DIPEA: N,N-diisopropylethylamine
EDC: 1,2-dichloroethane
DCM: dichloromethane (Compound (1); Synthesis of Nucleoside)

A compound (1) was synthesized according to the following scheme.

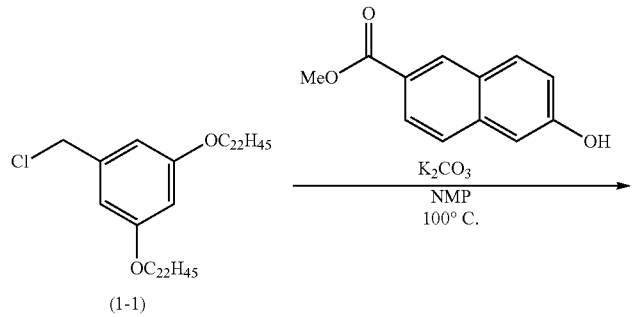

(1-1)

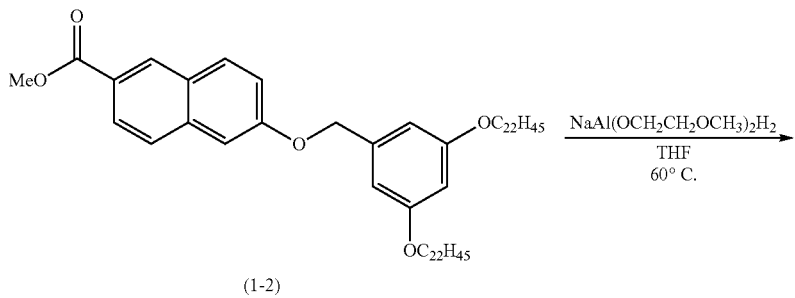

(1-2)

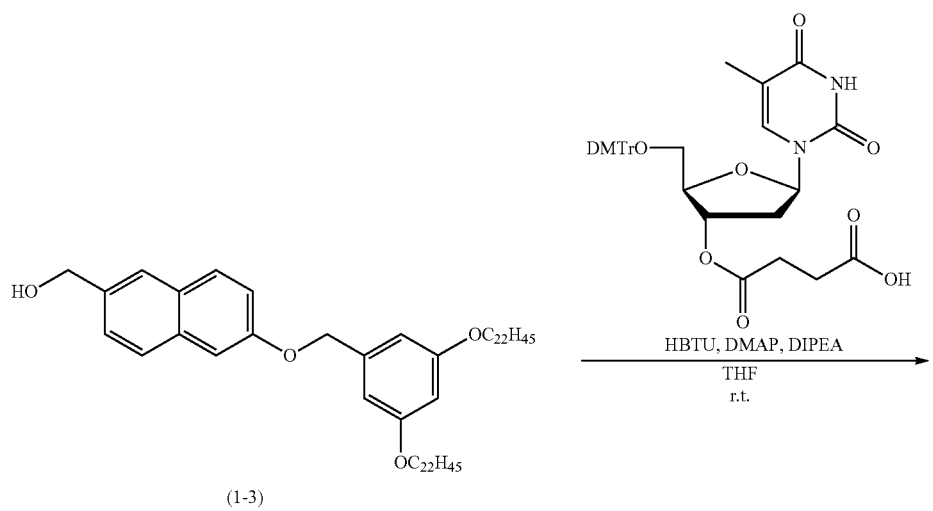

(1-3)

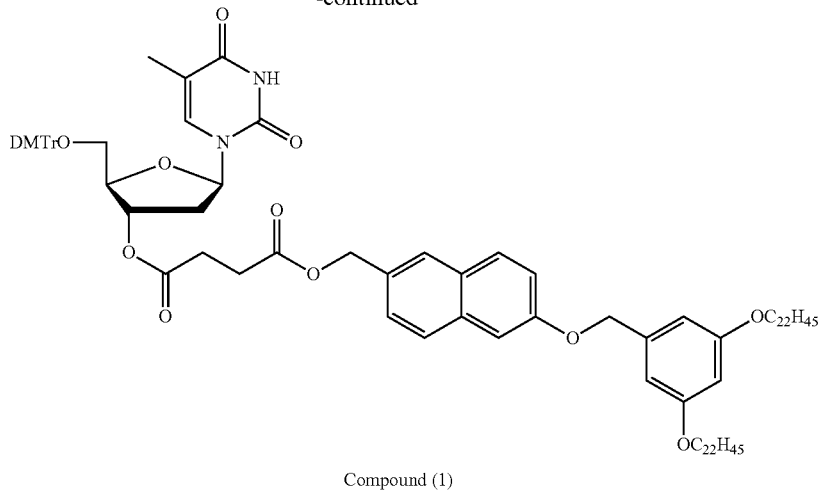

Compound (1)

An intermediate (1-1) was synthesized by the method described in paragraph 0216 of EP2518041A.

The intermediate (1-1) (12.00 g, 15.5 mmol), methyl 6-hydroxy-2-naphthoate (6.26 g, 30.9 mmol), potassium carbonate (8.55 g, 61.9 mmol), and N-methylpyrrolidone (155 mL) as a solvent were mixed to obtain a reaction solution. The obtained reaction solution was stirred at 100° C. under nitrogen for 4 hours. After completion of the reaction, the reaction solution was cooled to room temperature (25° C.), diluted with cyclopentyl methyl ether, and washed with water using a separatory funnel. The solid precipitated by adding methanol to the obtained organic layer was filtered and dried to obtain an intermediate (1-2) (13.8 g, yield: 95%).

The intermediate (1-2) (4.00 g, 4.25 mmol) and tetrahydrofuran (66 mL) as a solvent were mixed and stirred at 30° C., and then a hydrogenated bis(2-methoxyethoxy)aluminum sodium toluene solution (3.6 M) (3.5 mL, 12.8 mmol) was added dropwise thereto using a dropping funnel. After the dropwise addition, the reaction solution was stirred at 30° C. under nitrogen for 2 hours. After completion of the reaction, a saturated aqueous solution of potassium sodium tartrate (50 mL) was slowly added dropwise thereto at 30° C. with stirring. After the dropwise addition, the water phase was removed, and the solid precipitated by adding methanol to the obtained organic layer was filtered and dried to obtain an intermediate (1-3) (3.87 g, yield: 99%).

The intermediate (1-3) (190 mg, 0.21 mmol), the triethylamine salt of 5'-O-(4,4'-dimethoxytrityl)thymidine-3'-O-succinate (186 mg, 0.25 mmol), and dichloromethane (25 mL) as a solvent were mixed and stirred at room temperature (25° C.), and then N,N-dimethylaminopyridine (40 mg, 0.33 mmol), diisopropylethylamine (57 μL, 0.33 mmol), and 1-[bis(dimethylamino)methylene]-1H-benzotriazolium 3-oxide hexafluorophosphate (123 mg, 0.33 mmol) were added thereto. After the addition, the reaction solution was stirred under nitrogen overnight. After completion of the reaction, the solid precipitated by adding methanol was filtered and dried to obtain a compound (1) (379 mg, yield: 98%). ESI-MS: [M-H]$^-$=1,538

(Compound (2); Synthesis of Nucleoside)

A compound (2) was synthesized according to the following scheme.

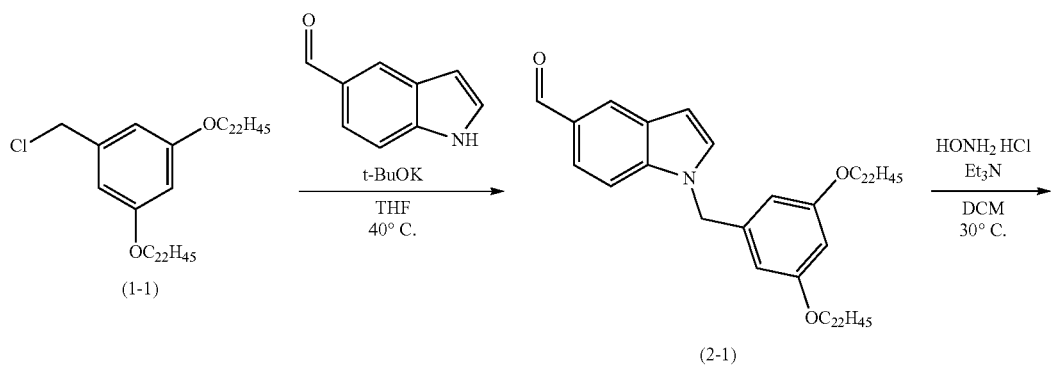

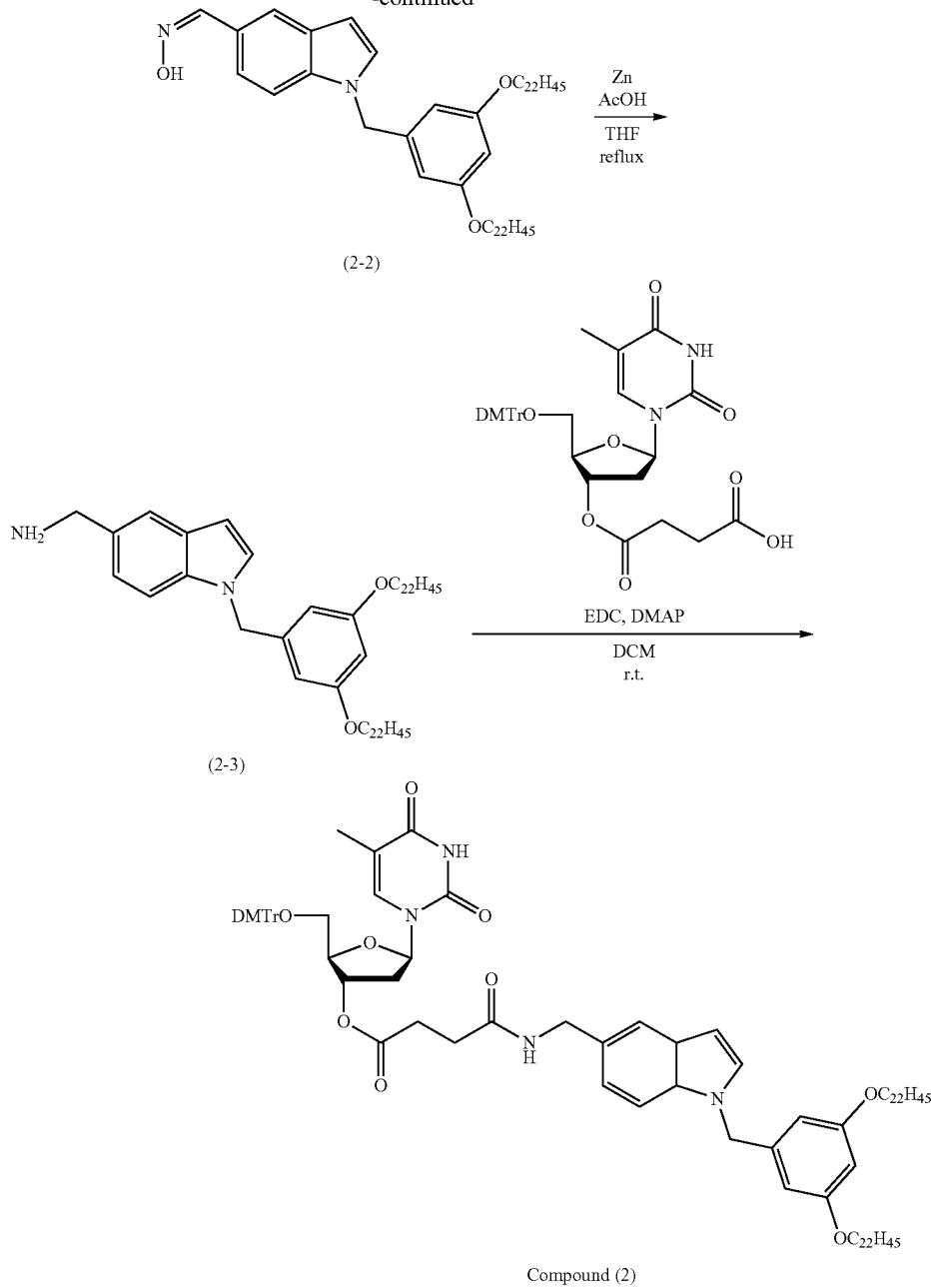

Compound (2)

The intermediate (1-1) (8.00 g, 10.3 mmol), indole-5-carboxyaldehyde (5.98 g, 41.2 mmol), potassium tert-butoxide (t-BuOK) (4.62 g, 41.2 mmol), and tetrahydrofuran (100 mL) as a solvent were mixed to obtain a reaction solution. The obtained reaction solution was stirred at 40° C. under nitrogen for 3 hours. After completion of the reaction, the reaction solution was cooled to room temperature (25° C.), diluted with cyclopentyl methyl ether, washed with water using a separatory funnel, and subjected to concentration under reduced pressure. The obtained crude product was dissolved in dichloromethane, and the solid precipitated by adding methanol was filtered and dried to obtain an intermediate (2-1) (9.11 g, yield: 95%).

After an intermediate (2-1) (5.0 g, 5.65 mmol) and methylene chloride (75 mL) as a solvent were mixed and dissolved at 30° C., hydroxylamine hydrochloride (2.36 g, 34 mmol) and triethylamine (7.88 mL, 56.5 mmol) were added thereto, and stirring was carried out for 2 hours at 30° C. The reaction solution was cooled to room temperature, methanol was added thereto, and the resulting precipitate was filtered and dried to obtain an intermediate (2-2) (4.9 g, yield: 97%).

After the intermediate (2-2) (2.00 g, 2.22 mmol), tetrahydrofuran (37 mL) as a solvent, and acetic acid (10 mL) were mixed at room temperature, and then zinc dust (1.75 g, 26.7 mmol) was added thereto. After refluxing for 1 hour, the zinc dust was removed with celite, and the obtained filtrate was concentrated under reduced pressure. Methanol (750 mL) was added to the obtained crude product, and the resulting precipitate was filtered and dried. The obtained solid was purified by column chromatography (NH silica gel, hexane:ethyl acetate=4:1 to 1:9) to obtain an intermediate (2-3) (1.01 g, yield: 51.3%).

The intermediate (2-3) (88.5 mg, 0.10 mmol), the triethylamine salt of 5'-O-(4,4'-dimethoxytrityl)thymidine-3'-O-succinate (111 mg, 0.15 mmol), and dichloromethane (1 mL) as a solvent were mixed and stirred at room temperature (25° C.), and then 4-dimethylaminopyridine (18.3 mg, 0.15 mmol) and 1-(3-dimethylaminopropyl)-3-ethylcarbodiimide hydrochloride (28.8 mg, 0.15 mmol) were added thereto. After the addition, the reaction solution was stirred at room temperature under nitrogen for 1 hour. After completion of the reaction, the solid precipitated by adding methanol was filtered and dried to obtain a compound (2) (138 mg, yield: 91%). ESI-MS: [M-H]$^-$=1,512

(Compound (3); Synthesis of Nucleotide)

A compound (3) was synthesized according to the following scheme.

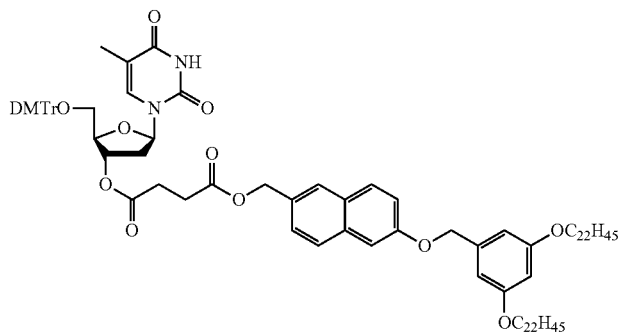
Compound (1)

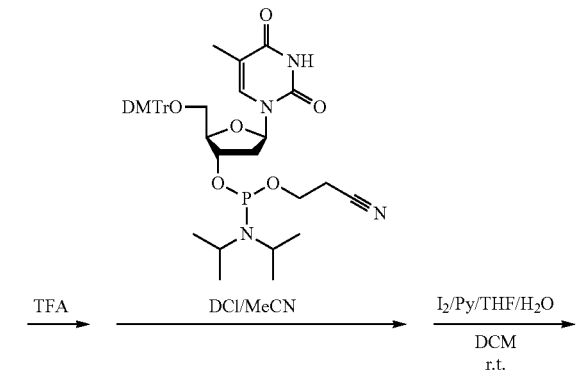

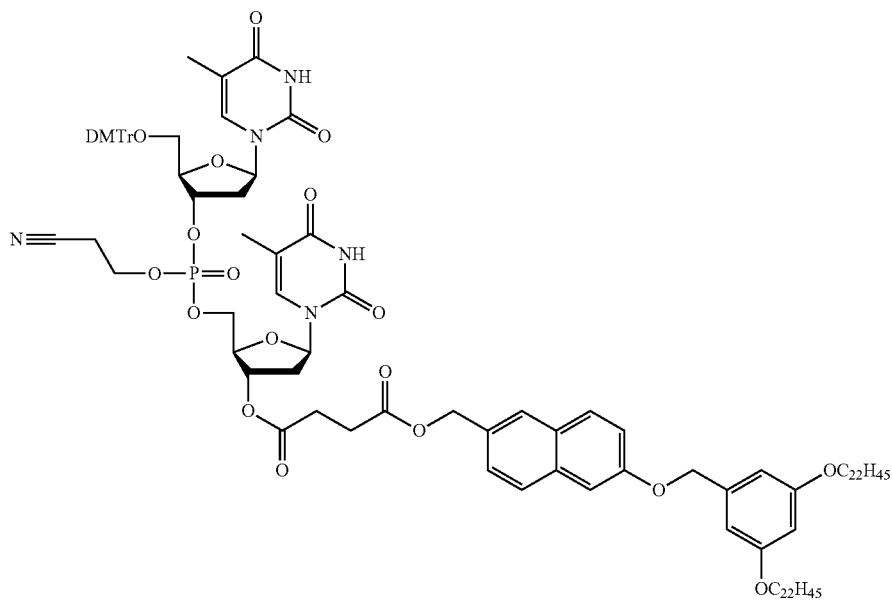
Compound (3)

The compound (1) (100 mg, 0.065 mmol), pyrrole (45 μL, 0.65 mmol), and dichloromethane (1.4 mL) as a solvent were mixed and stirred at room temperature (25° C.), and then trifluoroacetic acid (49 μL, 0.65 mmol) was added thereto and the reaction solution was stirred at room temperature and under nitrogen for 15 minutes to carry out the deprotection at the 5'-position. After the deprotection, pyridine (52 μL, 0.65 mmol) was added thereto, the reaction solution was neutralized by stirring at room temperature under nitrogen for 15 minutes, followed by the addition of an acetonitrile solution of 4,5-dicyanoimidazole (DCI) (0.25 M) (44 L, 0.18 mmol) and 5'-O-(4,4'-dimethoxytrityl)thymidine-3'-[O-(2-cyanoethyl)-(N,N-diisopropyl)]-phosphoramidite (193.4 mg, 0.26 mmol), and the reaction solution was stirred at room temperature and under nitrogen for 15 minutes to form a phosphite triester by condensation. After the condensation, an aqueous iodine/pyridine/tetrahydrofuran solution (1.8 mL) was added thereto, and the reaction solution was stirred at room temperature and under nitrogen for 1 hour to form a phosphate triester by oxidation. The solid precipitated by adding a saturated sodium thiosulfate methanol solution (14 mL) to the obtained reaction solution was filtered and dried to obtain a compound (3) (122 mg, yield: 99%). ESI-MS: [M-H]⁻=1,895

(Compound (4); Synthesis of Nucleotide)

A compound (4) was synthesized according to the following scheme.

The compound (4) was synthesized in the same manner as the compound (3).

The yield was 96%, and the ESI-MS was [M-H]⁻=1,867.

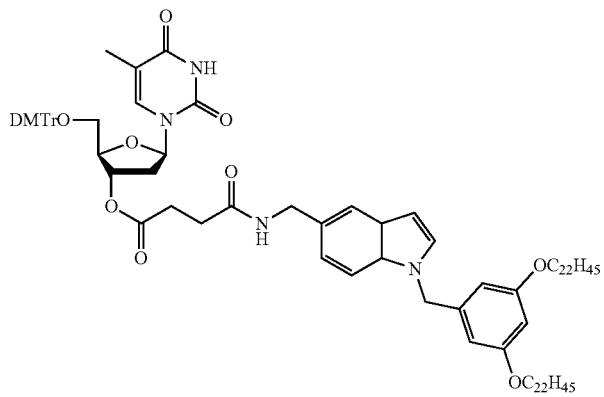

Compound (2)

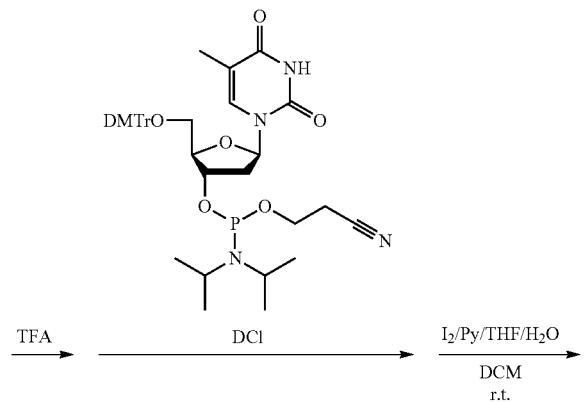

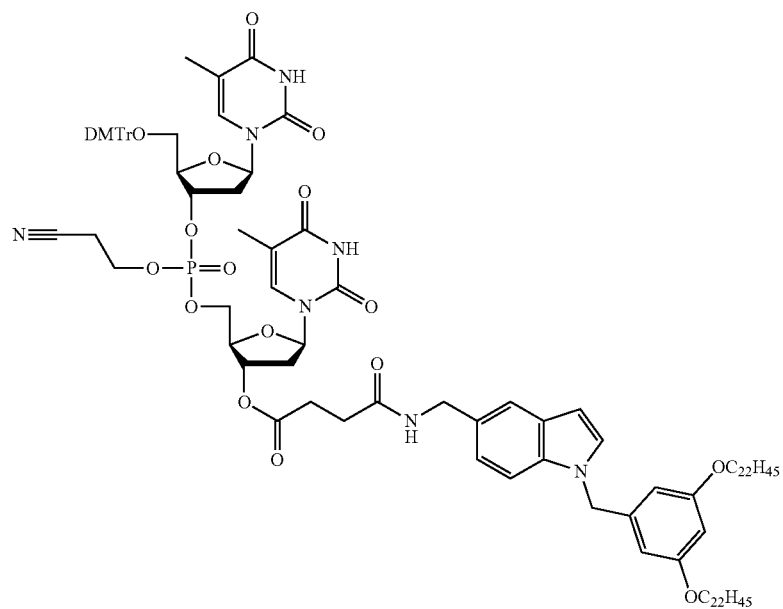

Compound (4)

(Synthesis of Comparative Compound)

A comparative compound (1-1) was synthesized according to the method described in paragraph 0205 of JP6281599B and synthesized by the same method as the compound (3). The yield was 83%, and the ESI-MS was [M-H]⁻=1,739.

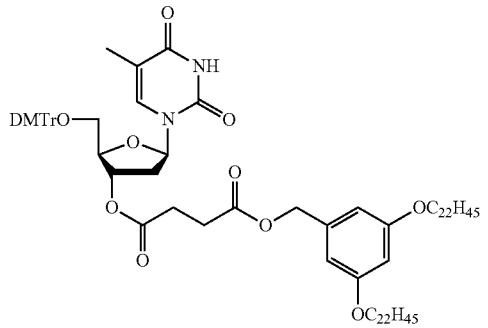
Comparative compound (1-1)

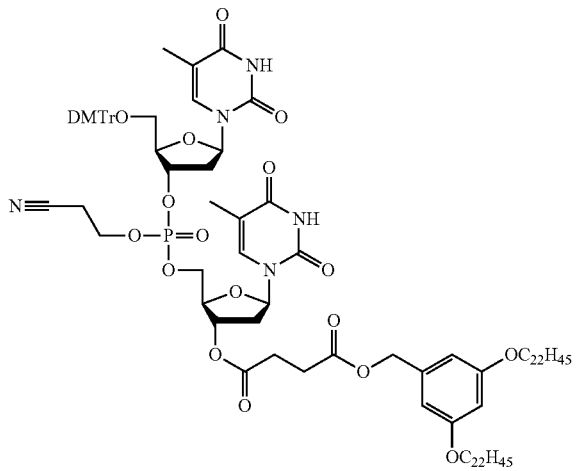
Comparative compound (1)

[Evaluation]

TABLE 1

|  | Kind | Yield |
| --- | --- | --- |
| Example 1 | Compound (3) | 99% |
| Example 2 | Compound (4) | 96% |
| Comparative Example 1 | Comparative compound (1) | 83% |

It can be seen that the method of producing a nucleic acid compound according to the present disclosure of Examples 1 and 2 is excellent in the yield of the obtained nucleic acid compound as compared with the method of producing a nucleic acid compound of Comparative Example 1.

Example 3

(Compound (5); Synthesis of Nucleotide)

A compound (5) was synthesized according to the following scheme.

The compound (5) was synthesized by the same method as the compound (3) except that 5'-O-(4,4'-dimethoxytrityl)thymidine-3'-[O-(2-cyanoethyl)-(N,N-diisopropyl)]-phosphoramidite, which had been used in the synthesis of the compound (3), was changed to 2'-O-methyl-5'-O-(4,4'-dimethoxytrityl)uridine-3'-[O-(2-cyanoethyl)-(N,N-diisopropyl)]-phosphoramidite.

The yield was 98%, the ESI-MS was [M-H]⁻=1,911.

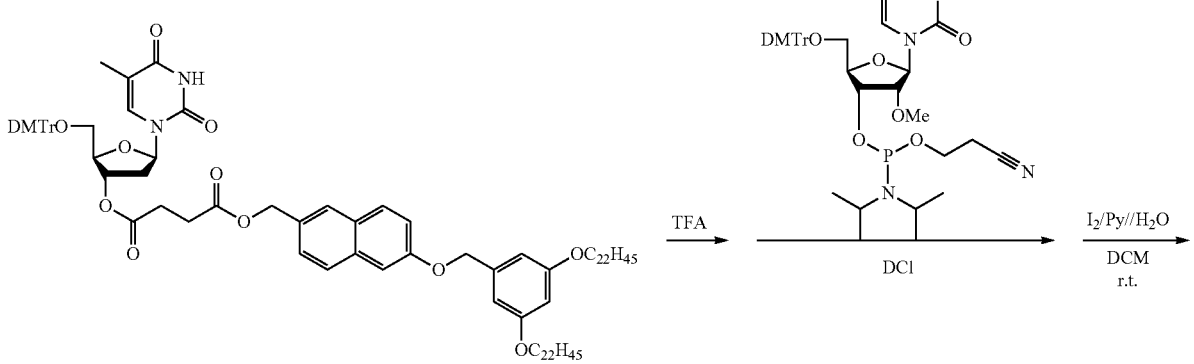
Compound (1)

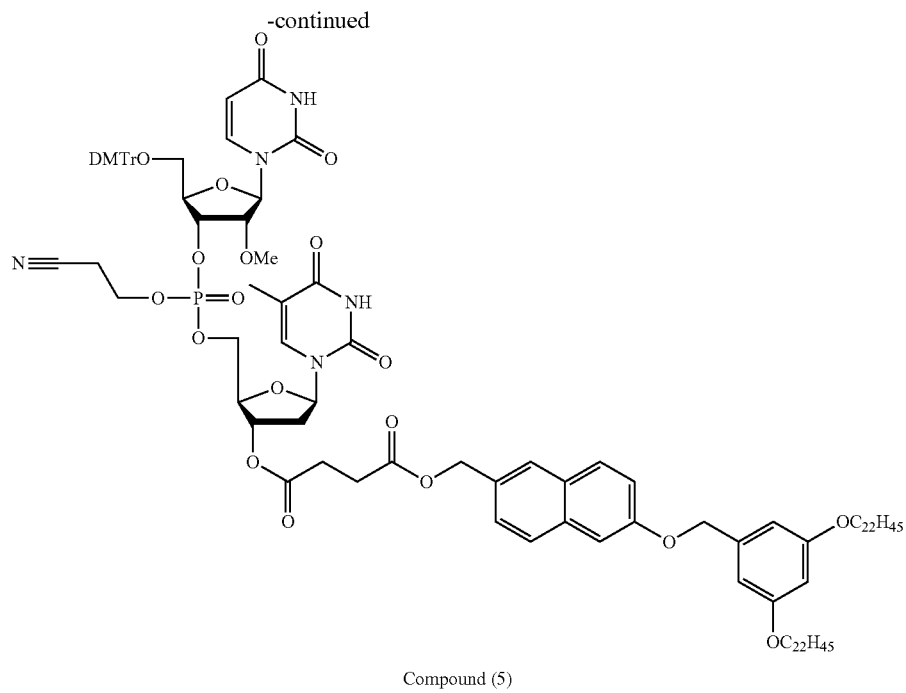

Compound (5)

Example 4

(Compound (6); Synthesis of Nucleotide)

A compound (6) was synthesized according to the following scheme.

The compound (6) was synthesized by the same method as the compound (3) except that 5'-O-(4,4'-dimethoxytrityl) thymidine-3'-[O-(2-cyanoethyl)-(N,N-diisopropyl)]-phosphoramidite, which had been used in the synthesis of the compound (3), was changed to LNA-T-CE-phosphoramidite.

The yield was 94%, and ESI-MS was [M-H]$^-$=1,923.

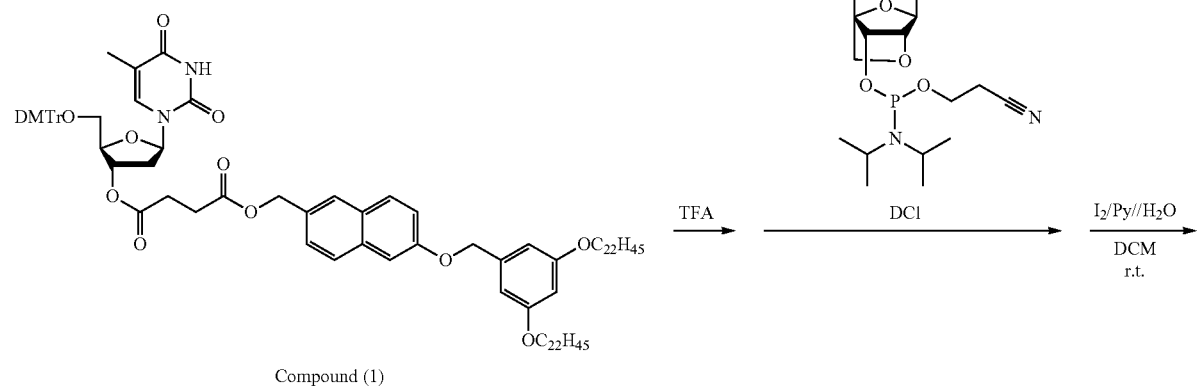

Compound (1)

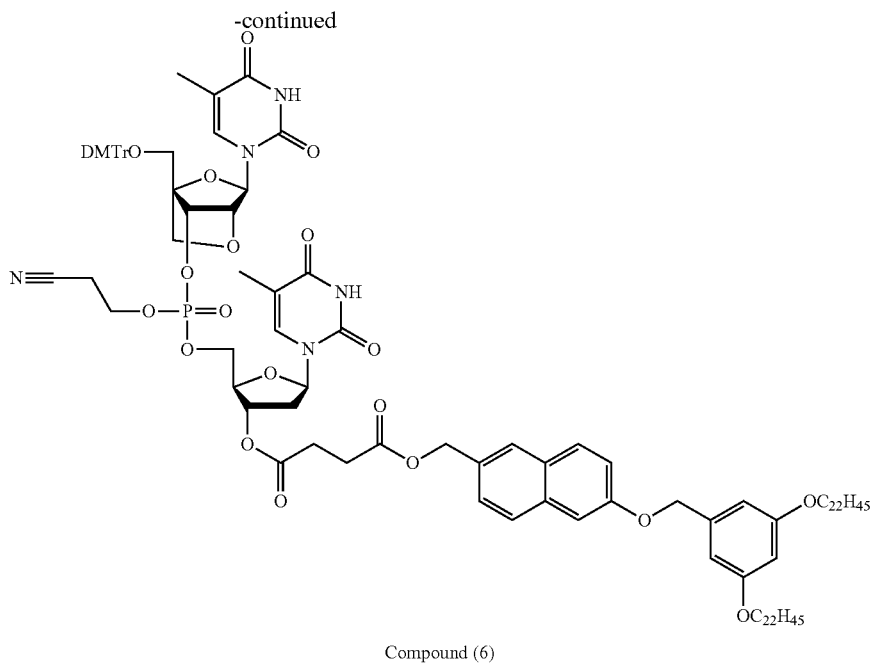

Compound (6)

Example 5

(Compound (7); Synthesis of Nucleotide)

A compound (7) was synthesized according to the following scheme.

The compound (7) was synthesized by the same method as the compound (4) except that 5'-O-(4,4'-dimethoxytrityl)thymidine-3'-[O-(2-cyanoethyl)-(N,N-diisopropyl)]-phosphoramidite, which had been used in the synthesis of the compound (4), was changed to 2'-O-methyl-5'-O-(4,4'-dimethoxytrityl)uridine-3'-[O-(2-cyanoethyl)-(N,N-diisopropyl)]-phosphoramidite.

The yield was 94%, and the ESI-MS was [M-H]r=1,883.

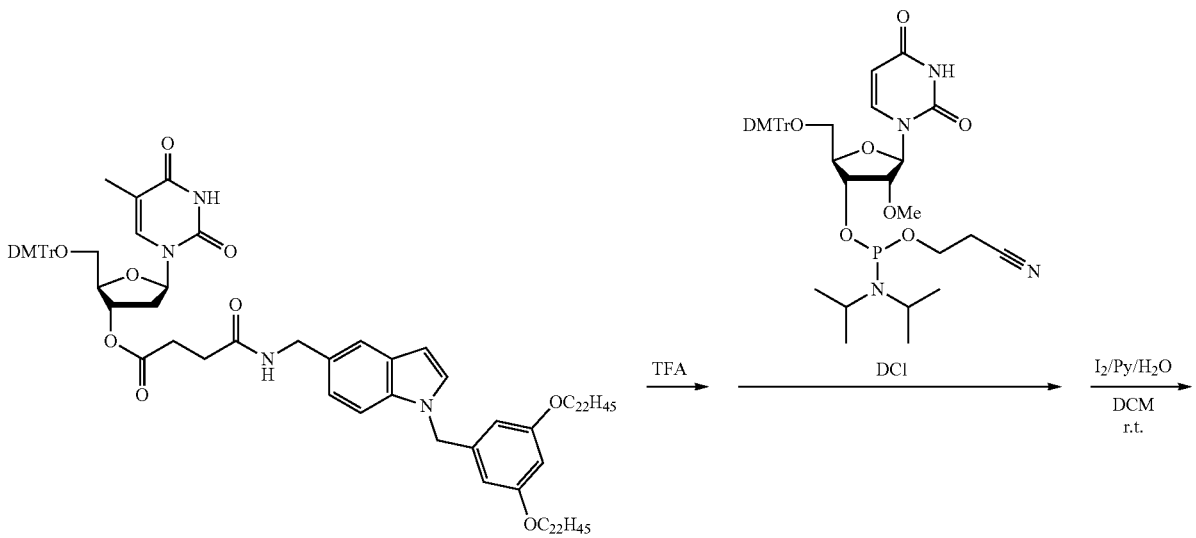

Compound (2)

-continued

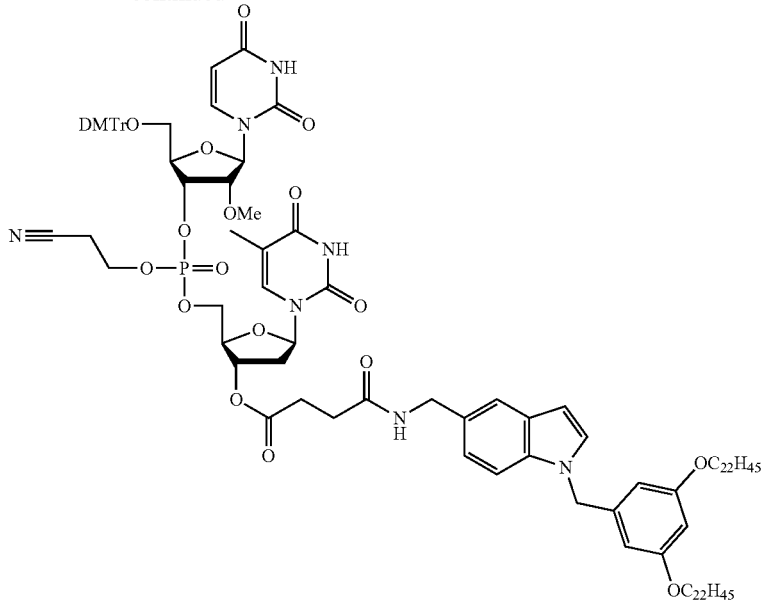
Compound (7)

Example 6

(Compound (8); Synthesis of Nucleotide)

A compound (8) was synthesized according to the following scheme.

The compound (8) was synthesized by the same method as the compound (4) except that 5'-O-(4,4'-dimethoxytrityl) thymidine-3'-[O-(2-cyanoethyl)-(N,N-diisopropyl)]-phosphoramidite, which had been used in the synthesis of the compound (4), was changed to LNA-T-CE-phosphoramidite.

The yield was 94%, and the ESI-MS was [M-H]=1,895.

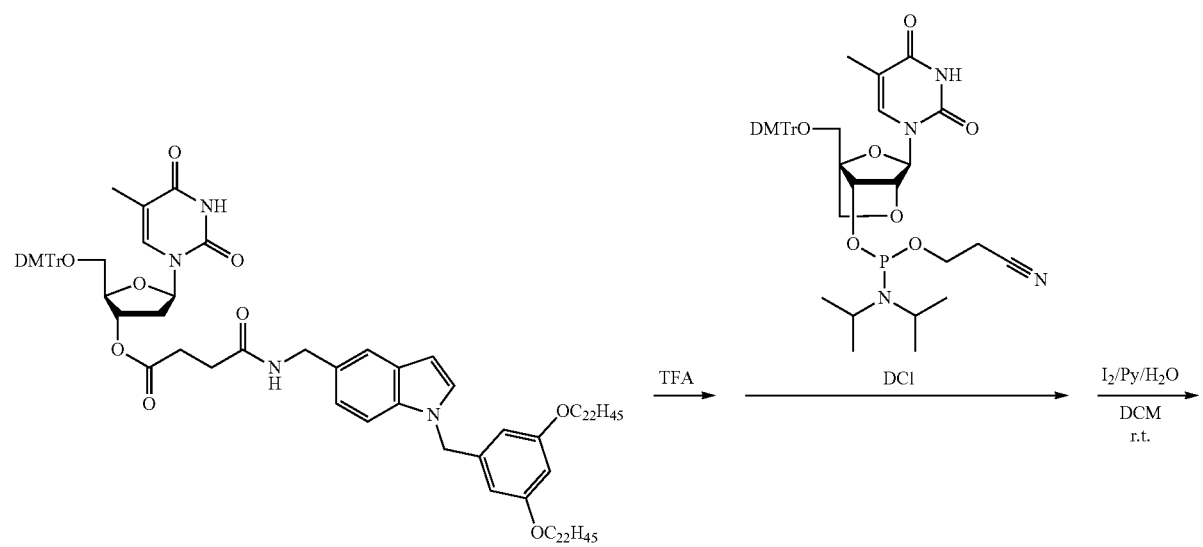
Compound (2)

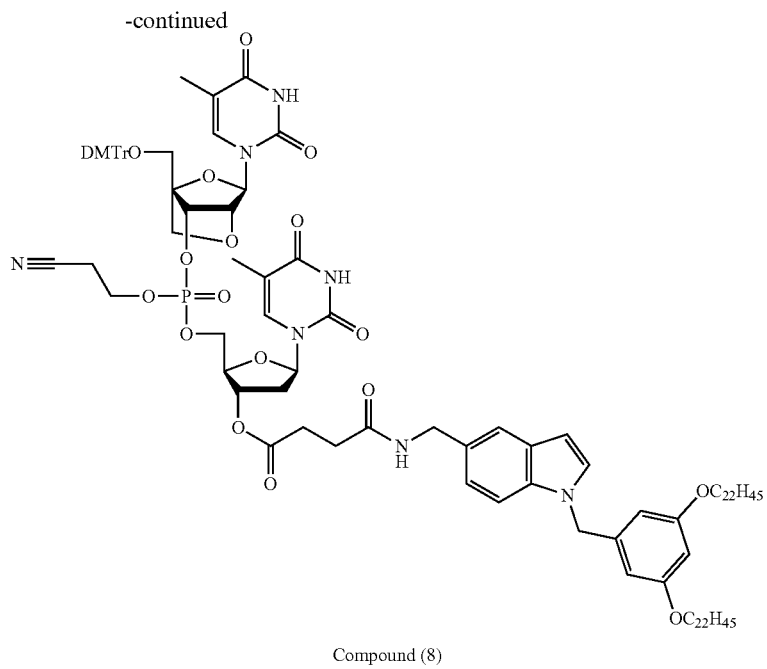

Compound (8)

Examples 7 and 8

(Compound (9) and Compound (10); Synthesis of Nucleotides)

A compound (9) and a compound (10) were synthesized according to the following scheme.

The compound (9) was synthesized by the same method as the compound (3) except that the raw material, which had been used in the synthesis of the compound (3), was changed to the compound (3) (100 mg, 0.053 mmol) and 5'-O-(4,4'-dimethoxytrityl)thymidine-3'-[O-(2-cyanoethyl)-(N,N-diisopropyl)]-phosphoramidite was changed to N6-benzoyl-5'-O-(4,4'-dimethoxytrityl)adenosine-3'-[O-(2-cyanoethyl)-(N,N-diisopropyl)]-phosphoramidite. The yield of the compound (9) was 96%.

Subsequently, the compound (9) was mixed with a 28% aqueous ammonia solution/ethanol (v/v=3/1) solution, and the mixture was stirred at 60° C. for 5 hours. After completion of the reaction, the solvent was distilled off with a centrifugal evaporator. An aqueous solution of 0.1 M ammonium acetate was added to the obtained crude product to remove insoluble matter, and then the crude product was adsorbed on a C18 cartridge column (manufactured by GL Sciences Inc.). After washing with an aqueous solution of 0.1 M ammonium acetate and water, the DMTr group at the 5-position was removed with an aqueous solution of 2% trifluoroacetic acid, and washing was carried out again with water. A compound (10) was obtained by being eluted from a C18 cartridge column with an aqueous solution of 20% acetonitrile. The yield was 84%, and the ESI-MS was [M-H]⁻=858.2.

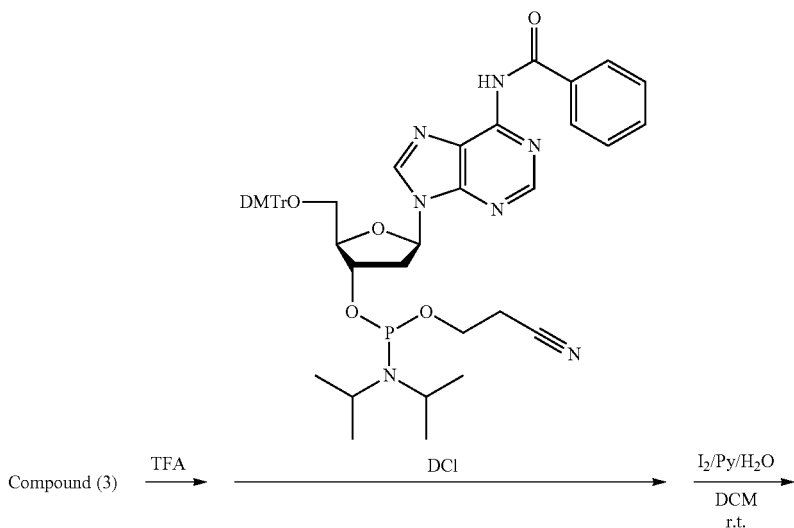

Compound (3) —TFA→ ——DCl—→ —I₂/Py/H₂O, DCM, r.t.→

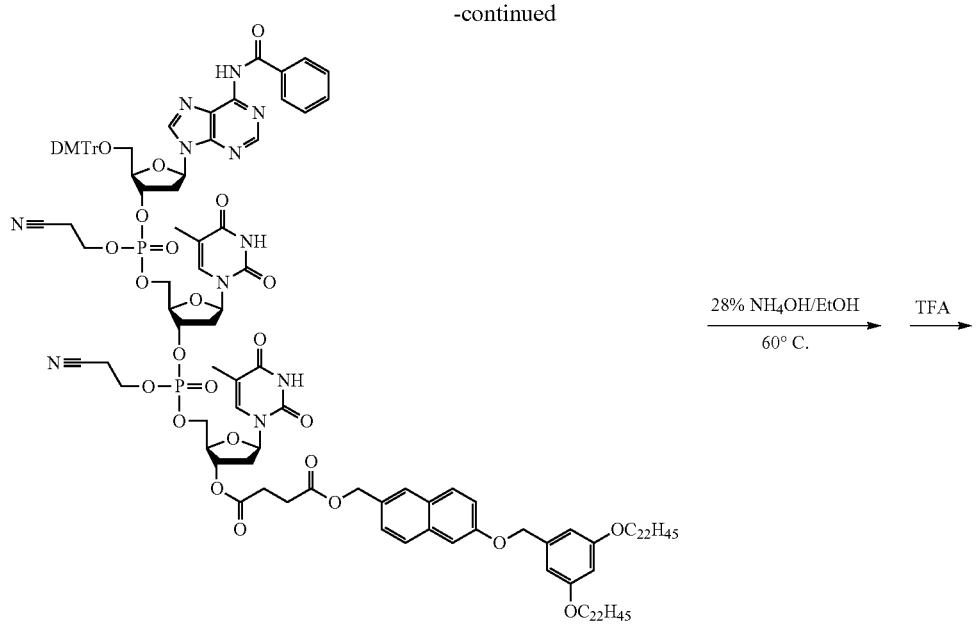

Compound (9)

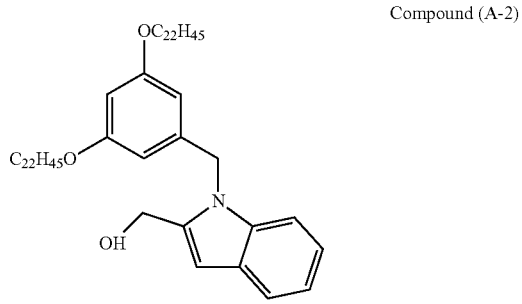

Compound (10)

It can be seen that the method of producing a nucleic acid compound according to the present disclosure, in which the compounds of Examples 3 to 8 are used, is excellent in the yield of the obtained nucleic acid compound as compared with the method of producing a nucleic acid compound, in which the comparative compound of Comparative Example 1 is used.

<Synthesis of Reagents for Forming Protective Group (Compound (A-2) to Compound (A-6))>

The following compound (A-2) to compound (A-6) were obtained by synthesizing in the same manner as the intermediate (1-1).

Compound (A-2)

-continued

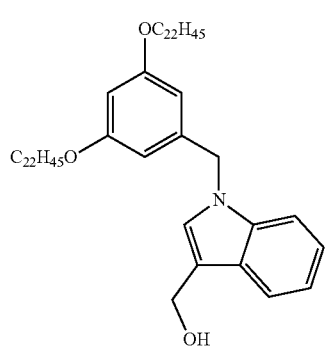
Compound (A-3)

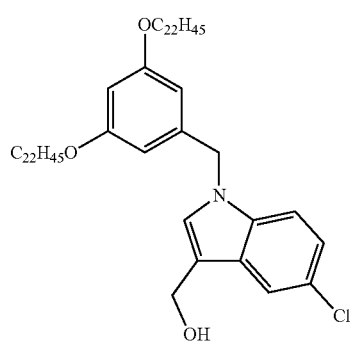
Compound (A-4)

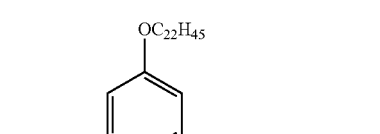
Compound (A-5)

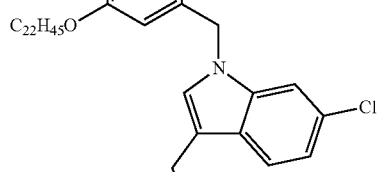
Compound (A-6)

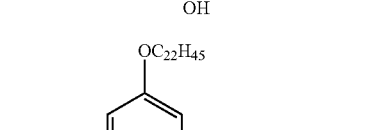

The ¹H NMR result of compound (A-2) is shown below.
¹H NMR (CDCl₃: 400 MHz) δ: 0.88 (6H, t), 1.20-1.74 (80H, m), 3.81 (4H, t), 4.74 (2H, d), 5.39 (2H, s), 6.14 (2H, d), 6.30 (1H, t), 6.53 (1H, s), 7.10 (1H, t), 7.16 (1H, t), 7.25-7.30 (1H, d), 7.61 (1H, d)

The ¹H NMR result of the compound (A-3) is shown below.
¹H NMR (CDCl₃: 400 MHz) δ: 0.88 (6H, t), 1.20-1.74 (80H, m), 3.84 (4H, t), 4.88 (2H, d), 5.18 (2H, s), 6.28 (2H, d), 6.35 (1H, t), 6.53 (1H, s), 7.13-7.28 (3H, m), 7.31 (1H, d), 7.75 (1H, d)

The ¹H NMR result of the compound (A-4) is shown below.
¹H NMR (CDCl₃: 400 MHz) δ: 0.88 (6H, t), 1.19-1.47 (76H, m), 1.66-1.76 (4H, m), 3.84 (4H, t), 4.83 (2H, d), 5.15 (2H, s), 6.23 (2H, d), 6.35 (1H, t), 7.12-7.16 (2H, m), 7.17-7.21 (1H, m), 7.69-7.72 (1H, m)

The ¹H NMR result of the compound (A-5) is shown below.
¹H NMR (CDCl₃, 400 MHz) δ: 0.88 (6H, t), 1.18-1.47 (76H, m), 1.66-1.77 (4H, m), 3.86 (4H, t), 4.84 (2H, d), 5.13 (2H, s), 6.24 (2H, d), 6.36 (1H, t), 7.08-7.13 (2H, m), 7.28 (1H, d), 7.64 (1H, d)

The ¹H NMR result of the compound (A-6) is shown below.
¹H NMR (CDCl₃, 400 MHz) δ: 0.88 (6H, t), 1.18-1.45 (76H, m), 1.48 (1H, t), 1.67-1.77 (4H, m), 3.86 (4H, t), 4.82 (2H, d), 5.12 (2H, s), 6.21 (2H, d), 6.36 (1H, t), 7.12 (1H, s), 7.37 (1H, s), 7.81 (1H, s)

<Synthesis of Reagent for Forming Protective Group (Compound (A-N-1))>

A compound (A-N-1) was synthesized according to the following scheme.

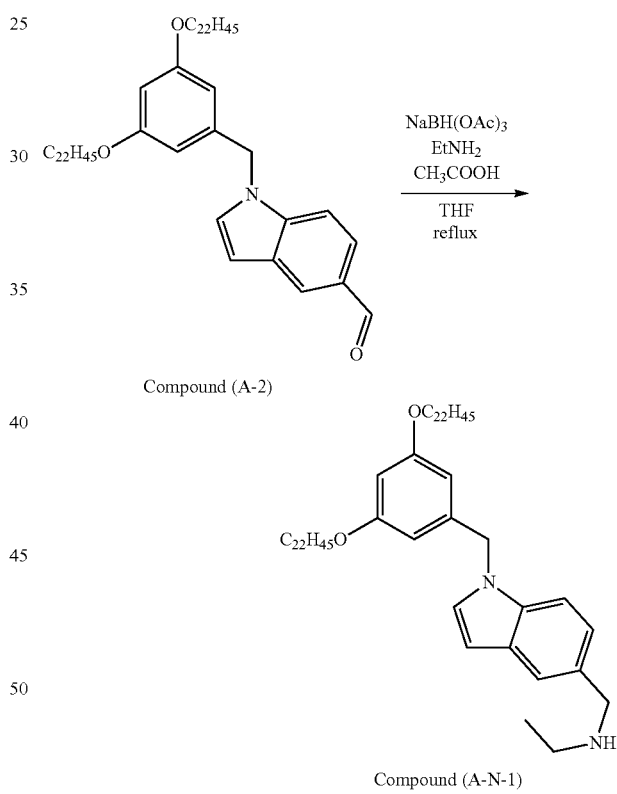

The compound (A-2) synthesized as described above (2.00 g, 2.26 mmol), sodium triacetoxyborohydride (0.96 g, 4.52 mmol), an ethylamine tetrahydrofuran solution (2M) (3.39 mL, 6.78 mmol), acetic acid (0.34 mL, 6.78 mmol), and tetrahydrofuran (25 mL) were mixed, and the mixture was stirred at 90° C. for 7 hours under a nitrogen atmosphere. The reaction solution was cooled to 0° C., water (10 mL) was slowly added dropwise thereto, and the reaction solution was quenched. The reaction solution was extracted with dichloromethane, and the obtained organic layer was washed with a saturated aqueous sodium hydrogen carbonate solution and concentrated under reduced pressure. The obtained crude product was dissolved in dichloromethane, and the solid precipitated by adding methanol was filtered and dried to obtain a compound (A-N-1) (1.90 g, yield: 94%).

It is noted that NaBH(OAc)$_3$ represents sodium triacetoxyborohydride, and EtNH$_2$ represents ethylamine.

$^1$H NMR (CDCl$_3$, 400 MHz) δ: 0.88 (6H, t), 1.15 (3H, t), 1.20-1.76 (80H, m), 2.72 (2H, q), 3.83 (4H, t), 3.89 (2H, s), 5.19 (2H, s), 6.24 (2H, d), 6.32 (1H, t), 6.49 (1H, dd), 7.11 (1H, d), 7.15 (1H, dd), 7.25 (2H, d), 7.57 (1H, d)

<Synthesis of Reagents for Forming Protective Group (Compound (A-N-2) to Compound (A-N-4))>

The following compounds (A-N-2) to compound (1-N-4) were obtained by synthesizing in the same manner as the compound (A-N-1).

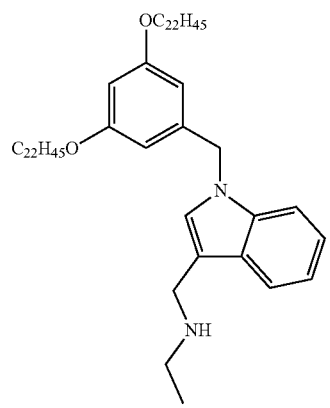

Compound (A-N-2)

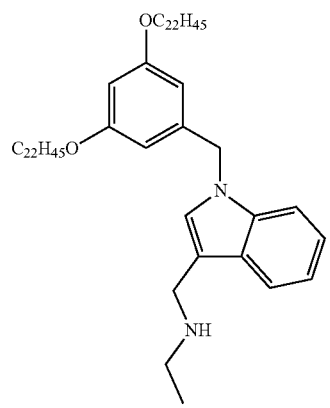

Compound (A-N-3)

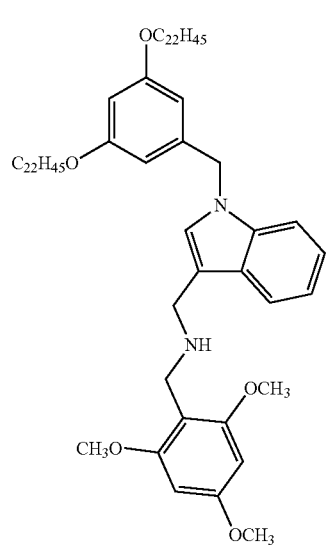

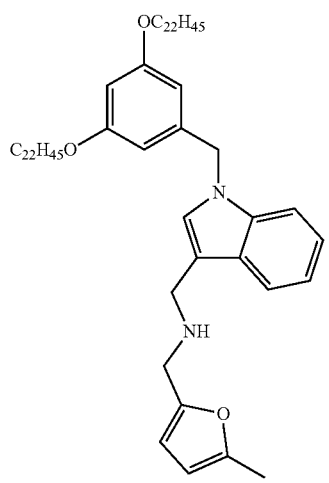

Compound (A-N-4)

The $^1$H NMR result of the compound (A-N-2) is shown below.

$^1$H NMR (CDCl$_3$: 400 MHz) δ: 0.88 (6H, t), 1.14 (3H, t), 1.18-1.44 (76H, m), 1.66-1.74 (4H, m), 2.75 (2H, q), 3.83 (4H, t), 3.99 (2H, s), 5.17 (2H, s), 6.26 (2H, d), 6.33 (1H, t), 7.07 (1H, s), 7.11 (1H, t), 7.17 (1H, t), 7.25-7.29 (1H, m), 7.65 (1H, d)

The $^1$H NMR result of the compound (A-N-3) is shown below.

$^1$H NMR (CDCl$_3$: 400 MHz) δ: 0.88 (6H, t), 1.22-1.43 (76H, m), 1.64-1.72 (4H, m), 3.74 (6H, s), 3.82 (4H, d), 3.82 (3H, s), 3.95 (4H, d), 5.16 (2H, s), 6.13 (2H, s), 6.26 (2H, d), 6.31 (1H, t), 7.07 (1H, td), 7.15 (1H, td), 7.15 (1H, s), 7.24-7.28 (1H, m), 7.50 (1H, d)

The $^1$H NMR result of the compound (A-N-4) is shown below.

$^1$H NMR (CDCl$_3$: 400 MHz) δ: 0.88 (6H, t), 1.21-1.44 (76H, m), 1.65-1.74 (4H, m), 2.28 (3H, s), 3.78 (2H, s), 3.83 (4H, t), 3.99 (2H, s), 5.17 (2H, s), 5.87-5.90 (1H, m), 6.05 (1H, d), 6.26 (2H, d), 6.33 (1H, t), 7.07 (1H, s), 7.10 (1H, td), 7.18 (1H, td), 7.24-7.29 (1H, m), 7.63 (1H, d)

<Synthesis of Reagent for Forming Protective Group (Compound (A-N-5))>

A compound (A-N-5) was synthesized according to the following scheme.

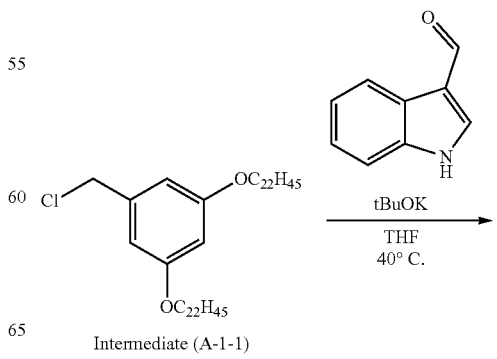

Intermediate (A-1-1)

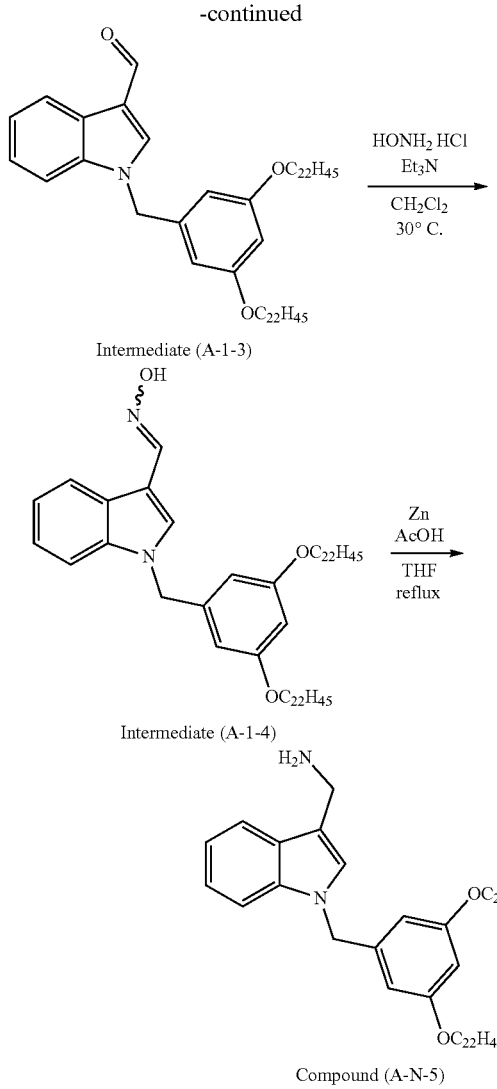

Intermediate (A-1-3)

Intermediate (A-1-4)

Compound (A-N-5)

Tertiary butoxy potassium (5.79 g, 51.6 mmol) was added to a mixture of the intermediate (A-1-1) (10.0 g, 12.9 mmol), indole-3-carbaldehyde (7.48 g, 51.6 mmol), tetrahydrofuran (129 mL), and stirring was carried out at 60° C. for 2.5 hours. Cyclopentyl methyl ether (250 mL) and water (250 mL) were added to the reaction solution, and after the separation of the solution, methanol (1 L) was added to the organic layer, the resulting precipitate was collected by filtration and dried to obtain an intermediate (A-1-3) (11.1 g, yield: 96.9%).

After a mixture of the intermediate (A-1-3) (20.0 g, 22.6 mmol) and methylene chloride (302 mL) was dissolved at 30° C., hydroxylamine hydrochloride (9.43 g, 136 mmol) and triethylamine (31.5 mL, 226 mmol) were added thereto, and stirring was carried out for 2 hours at 30° C. The reaction solution was cooled to room temperature, methanol (2 L) was added thereto, and the resulting precipitate was collected by filtration and dried to obtain an intermediate (A-1-4) (19.6 g, yield: 96.6%).

After the intermediate (A-1-4) (2.00 g, 2.22 mmol), tetrahydrofuran (37 mL), and acetic acid (10 mL) were mixed at room temperature, and then zinc dust (1.75 g, 26.7 mmol) was added thereto. After refluxing for 1 hour, the zinc dust was removed with celite, and the obtained filtrate was concentrated. Methanol (750 mL) was added to the obtained crude product, and the resulting precipitate was collected by filtration and dried. The obtained solid was purified by column chromatography (NH silica gel, hexane:ethyl acetate=4:1 to 1:9) to obtain a compound (A-N-5) (1.01 g, yield: 51.3%).

$^1$H NMR (CDCl$_3$, 400 MHz) δ: 0.88 (6H, t), 1.20-1.44 (76H, m), 1.66-1.75 (4H, m), 3.84 (4H, t), 4.06 (2H, d), 5.17 (2H, s), 6.27 (2H, d), 6.33 (1H, t), 7.04 (1H, s), 7.12 (1H, dt), 7.19 (1H, dt), 7.29 (1H, d), 7.65 (1H, d)

<Synthesis of Reagent for Forming Protective Group (Compound (B-1))>

A compound (B-1) was synthesized according to the following scheme.

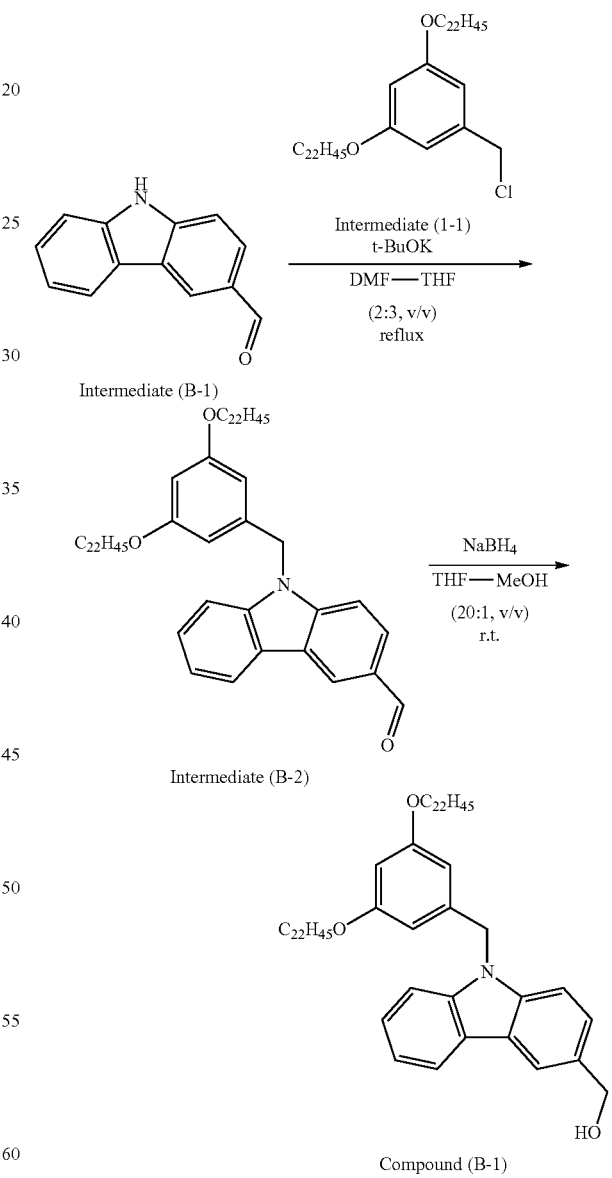

Intermediate (B-1)

Intermediate (B-2)

Compound (B-1)

The intermediate (B-1) was synthesized by the method described in Tetrahedron Lett., 2018, 59, 2145-2149.

The intermediate (1-1) (473 mg, 0.61 mmol), the intermediate (B-1) (149 mg, 0.76 mmol), potassium tert-butoxide (86.5 mg, 0.77 mmol), and tetrahydrofuran/N,N-dimethylformamide (⅔ (vol %/vol %), 25 mL) were mixed, and heated and refluxed for 4 hours. The reaction solution was cooled to room temperature, extracted with cyclopentyl methyl ether and water, and the organic layer was concentrated under reduced pressure. The obtained crude product was dissolved in dichloromethane, and the solid precipitated by adding methanol was filtered and dried to obtain an intermediate (B-2) (503 mg) (yield: 88%).

The intermediate (B-2) (149 mg, 0.16 mmol), sodium borohydride (12.1 mg, 0.32 mmol), and tetrahydrofuran/methanol (20/1 (vol %/vol %) were mixed under a nitrogen atmosphere, 2 mL), and stirring was carried out at room temperature for 2 hours. The reaction solution was cooled to 0° C., water (10 mL) was slowly added dropwise thereto, and the reaction solution was quenched. The reaction solution was extracted with dichloromethane, and the obtained organic layer was washed with water and saturated saline and concentrated under reduced pressure. The obtained crude product was dissolved in dichloromethane, and the solid precipitated by adding methanol was filtered and dried to obtain a compound (B-1) (115 mg) (yield: 77%).

It is noted that DMF indicates N,N-dimethylformamide.

$^1$H NMR (CDCl$_3$: 400 MHz) δ: 0.84-1.72 (86H, m), 3.80 (4H, t), 4.86 (2H, d), 5.42 (2H, s), 6.27 (2H, d), 6.31 (1H, t), 7.22-7.29 (2H, m), 7.33-7.39 (2H, m), 7.41-7.47 (2H, m), 8.10-8.14 (2H, m)

<Synthesis of Reagent for Forming Protective Group (Compound (B-2))>

Compound (B-2)

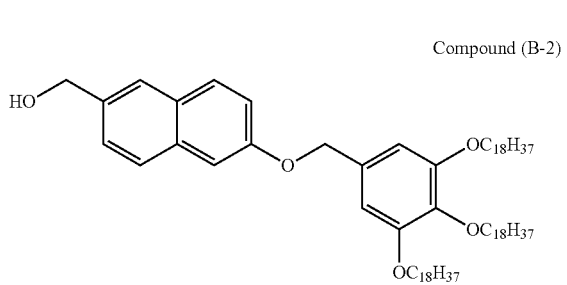

A compound (B-2) was obtained by carrying out synthesis in the same manner as the compound (B-1).

$^1$H-NMR (CDCl$_3$, 300 MHz) δ=0.88 (9H, t), 1.19-1.85 (96H, m), 3.93-4.01 (6H, m), 4.83 (2H, d), 5.06 (2H, s), 6.42 (1H, t), 6.67 (2H, d), 7.22-7.26 (2H, m), 7.46 (1H, dd), 7.72-7.77 (3H, m).

<Synthesis of Reagent for Forming Protective Group (Compound (B-3))>

Compound (B-3)

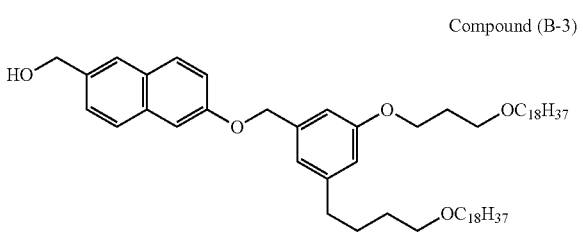

A compound (B-3) was obtained by carrying out synthesis in the same manner as the compound (B-1).

$^1$H-NMR (CDCl$_3$, 400 MHz) δ=0.88 (6H, t), 1.24-1.58 (64H, m), 2.04 (4H, m), 3.41 (4H, t), 3.58 (4H, t), 4.05 (4H, t), 4.83 (2H, d), 5.10 (2H, s), 6.44 (1H, t), 6.63 (2H, d), 7.20-7.26 (2H, m), 7.45 (1H, dd), 7.72-7.76 (3H, m).

<Synthesis of Reagent for Forming Protective Group (Compound (B-4))>

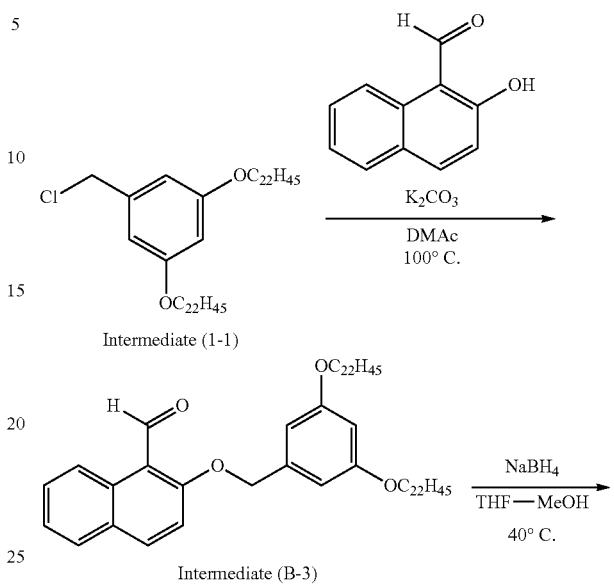

Compound (B-4)

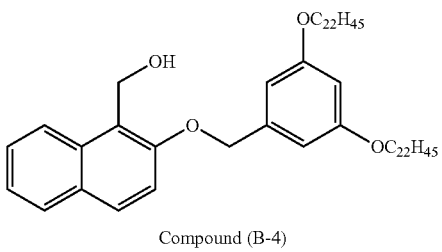

The intermediate (1-1) (3.00 g, 3.87 mmol), 2-hydroxy-1-naphthaldehyde (1.00 g, 3.87 mmol), potassium carbonate (1.07 g, 7.73 mmol), N,N-dimethylacetamide (DMAc, 30 mL) were mixed and stirred at 100° C. for 3 hours under a nitrogen atmosphere. The reaction solution was cooled to room temperature, and the solid precipitated by adding methanol was filtered and dried under reduced pressure to obtain an intermediate (B-3) (4.46 g).

Under a nitrogen atmosphere, the intermediate (B-3) (3.52 g, 3.86 mmol), tetrahydrofuran (154 mL), and methanol (7.7 mL) were mixed and stirred at room temperature, and then sodium borohydride (0.292 g, 7.72 mmol) was added thereto. The reaction solution was stirred at 40° C. for 30 minutes, and after confirming the disappearance of the raw materials, silica gel (50 g) was added little by little to the reaction solution to stop the reaction. After filtering the silica gel and concentrating the filtrate under reduced pressure, the obtained residue was dissolved in THF (15 mL), and the solid precipitated by adding methanol (100 mL) was filtered and dried to obtain a compound (B-4) (3.44 g, yield: 98%).

$^1$H-NMR (CDCl$_3$, 400 MHz) δ=0.88 (6H, t), 1.19-1.80 (80H, m), 3.92 (4H, t), 5.17 (2H, s), 5.22 (2H, d), 6.40 (1H, s), 6.58 (2H, d), 7.29 (1H, t), 7.37 (1H, t), 7.53 (1H, t), 7.80 (2H, dd), 8.14 (1H, d).

<Synthesis of Reagent for Forming Protective Group (Compound (B-5))>

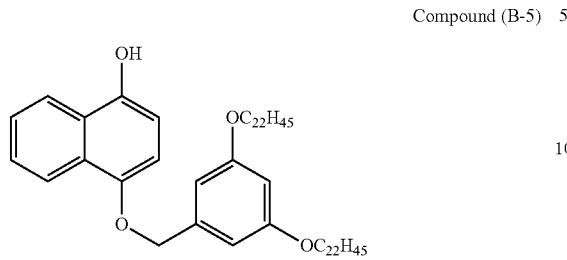

Compound (B-5)

A compound (1-5) was obtained by carrying out synthesis in the same manner as the compound (1-4).

$^1$H-NMR (CDCl$_3$, 400 MHz) δ=0.88 (6H, t), 1.19-1.85 (80H, m), 3.95 (4H, t), 5.06 (2H, d), 5.18 (2H, s), 6.42 (1H, t), 6.63 (2H, d), 6.82 (1H, d), 7.38 (1H, d), 7.48-7.65 (2H, m), 8.12 (1H, d), 8.41 (1H, d).

<Synthesis of Reagent for Forming Protective Group (Compound (C-1))>

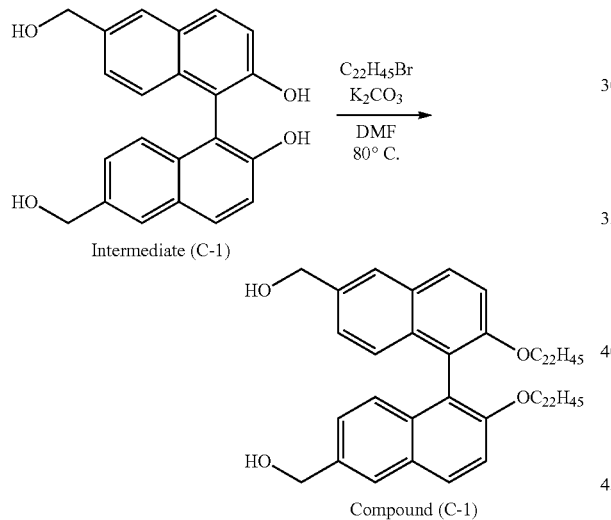

Compound (C-1)

An intermediate (C-1) was synthesized by the method described in the document, J. Am. Chem. Soc., 2010, 132, 14625-14637.

The intermediate (C-1) (346 mg, 1.00 mmol), 1-bromodocosane (1,166 mg, 3.00 mmol), potassium carbonate (897 mg, 6.5 mmol), N,N-dimethylformamide (DMF, 10 mL) were mixed and stirred at 80° C. for 2 hours under a nitrogen atmosphere. The reaction solution was cooled to room temperature and extracted with dichloromethane and water, and the organic phase was concentrated under reduced pressure. The obtained crude product was purified by being subjected to silica gel chromatography (eluent: hexane/ethyl acetate=1/9 to 3/7 (volume ratio)), and further recrystallized with acetonitrile, filtered, and dried to obtain a compound (C-1) (200 mg, yield: 21%).

$^1$H-NMR (CDCl$_3$, 400 MHz) δ=0.83-1.63 (86H, m), 3.86-3.92 (4H, m), 4.79 (4H, d), 7.12 (2H, d), 7.20 (2H, dd), 7.40 (2H, d), 7.82 (2H, d), 7.91 (2H, d).

<Synthesis of Reagent for Forming Protective Group (Compound (C-2))>

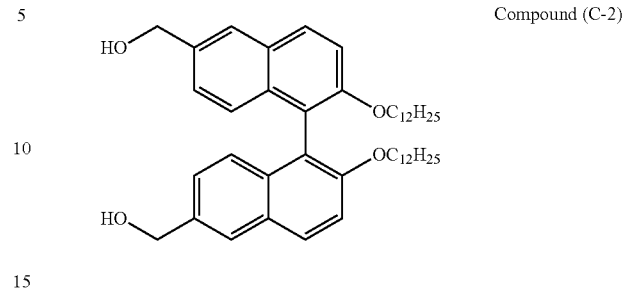

Compound (C-2)

A compound (C-2) was obtained by carrying out synthesis in the same manner as the compound (C-1) except that the length of the alkyl group in the bromide to be used was changed.

<Synthesis of Reagent for Forming Protective Group (Compound (D-1))>

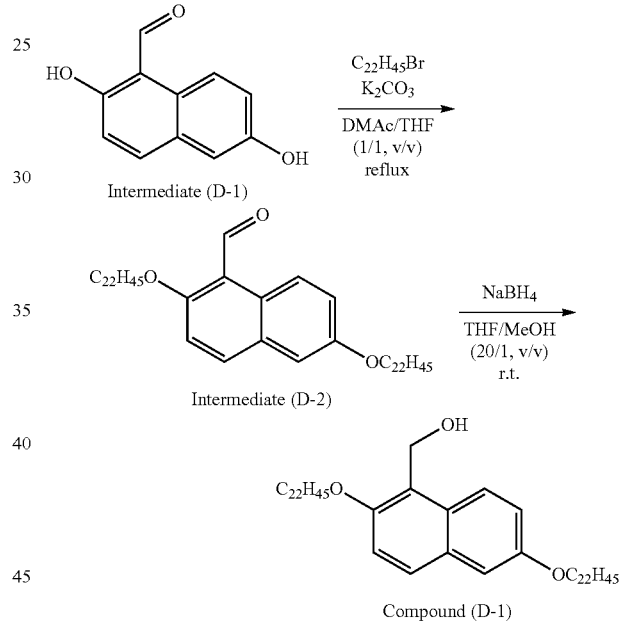

Compound (D-1)

The intermediate (D-1) was synthesized by the method described in Journal of Organic Chemistry, 2009, 74, 2, 520-529.

The intermediate (D-1) (132 mg, 0.7 mmol), 1-bromodocosane (601 mg, 1.54 mmol), potassium carbonate (388 mg, 2.8 mmol), N,N-dimethylacetamide (DMAc, 3.5 mL), tetrahydrofuran (3.5 mL) were mixed and stirred at 90° C. for 5 hours under a nitrogen atmosphere. The reaction solution was cooled to room temperature, the solid precipitated by adding methanol was collected by filtration, washed with water and methanol, respectively, and then dried under reduced pressure to obtain an intermediate (D-2) (480 mg, yield: 85%).

Under a nitrogen atmosphere, the intermediate (D-2) (480 mg, 0.6 mmol), tetrahydrofuran (90 mL), and methanol (4.5 mL) were mixed, and then sodium borohydride (68 mg, 1.8 mmol) was added thereto. The reaction solution was heated to 40° C., stirred for 2 hours, and then silica gel was added to quench the reaction. The reaction solution was filtered, the organic phase was concentrated under reduced pressure, and the obtained crude product was purified by being subjected to silica gel chromatography (eluent: hexane/dichloromethane=7/3 to 1/1 (volume ratio)), whereby a compound (D-1) (427 mg, yield: 89%) was obtained.

$^1$H-NMR (CDCl$_3$, 400 MHz) δ=0.88 (6H, t), 1.25-1.53 (76H, m), 1.80-1.87 (4H, m), 4.05 (2H, t), 4.11 (2H, t), 5.16 (2H, d), 7.10 (1H, d), 7.19-7.25 (2H, m), 7.68 (1H, d), 8.01 (1H, d).

Example 101

Instead of the intermediate (2-3) in Example 1, any one of the compounds (A-2) to (A-6), (A-N-1) to (A-N-5), (B-1) to (B-5), (C-1), (C-2), or (D-1) is used to prepare, in the same manner as in Example 1, a compound that matches with the compound (1) and a compound that matches with the compound (3), the yields of which are evaluated.

Regardless of which compound is used, the yield of the obtained nucleic acid compound is excellent.

The disclosure of JP2019-157402 filed on Aug. 29, 2019, is incorporated in the present specification by reference in its entirety.

All documents, patent applications, and technical standards described in the present specification are incorporated in the present specification by reference, to the same extent as in the case where each of the documents, patent applications, and technical standards is specifically and individually described.

What is claimed is:

1. A method of producing a nucleic acid compound, wherein a nucleic acid compound in which a 3-position of a ribose structure is protected by a structure represented by Formula (1) is used,

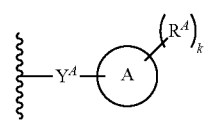

(1)

in Formula (1), a ring A represents a naphthalene ring, $Y^A$ represents *—OCR$_2$—**, *—NRCR$_2$—**, or *—SCR$_2$—**, where R's each independently represent a hydrogen atom, an alkyl group, an aromatic group, or an aromatic group-substituted alkyl group, k represents an integer of 1 to 5, a wavy line portion and * represent a bonding position to L in Formula (2), ** represents a bonding position to the ring A, $R^A$'s are each independently an aliphatic hydrocarbon group or an organic group having an aliphatic hydrocarbon group, where at least one aliphatic hydrocarbon group in k pieces of $R^A$'s has 12 or more carbon atoms, and the ring A may further have a substituent in addition to $Y^A$ and $R^A$, wherein the nucleic acid compound protected by the structure represented by Formula (1) is a compound represented by Formula (2),

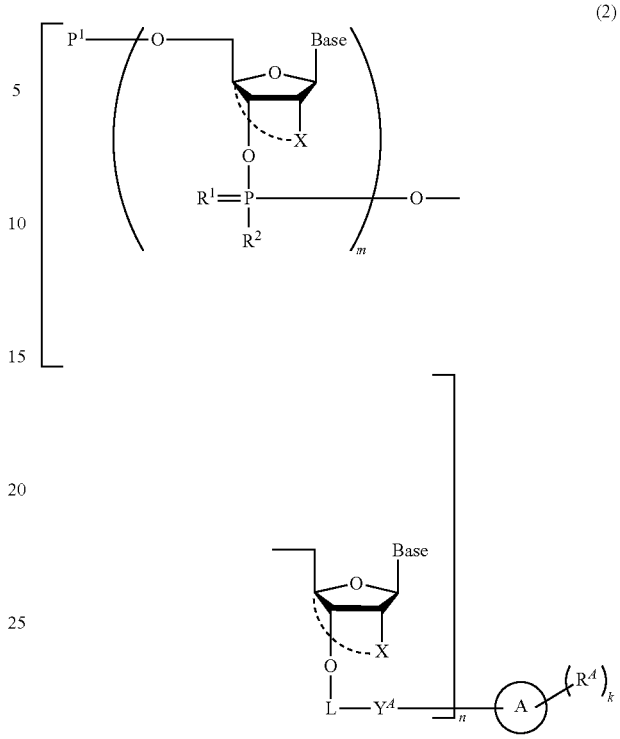

(2)

in Formula (2), m represents any integer of 0 or more, n represents 1 to 6,

Bases each independently represent a nucleic acid base or a modified nucleic acid base, $P^1$ represents a hydrogen atom or a hydroxy protective group, $R^1$ represents an oxygen atom, a sulfur atom, or a borano group, $R^2$ represents a hydrogen atom, a substituted or unsubstituted hydroxy group, a substituted or unsubstituted mercapto group, a substituted or unsubstituted alkyl group, or a substituted or unsubstituted amino group, X's each independently represent a hydrogen atom, a hydroxy group, a halogen atom, or an organic group that is crosslinked to a carbon atom at a 4'-position of a ribose structure, L's each independently represent a single bond or a divalent linking group, the ring A represents a naphthalene ring, $Y^A$'s each independently represent a single bond, *—OCR$_2$—**, *—NRCR$_2$—**, or *—SCR$_2$—**, where * represents a bonding position to L,

** represents a bonding position to the ring A,

R's each independently represent a hydrogen atom, an alkyl group, an aromatic group, or an aromatic group-substituted alkyl group, adjacent L and $Y^A$ do not simultaneously represent a single bond, k represents an integer of 1 to 5, $R^A$'s are each independently an aliphatic hydrocarbon group or an organic group having an aliphatic hydrocarbon group, where at least one aliphatic hydrocarbon group in k pieces of $R^A$'s has 12 or more carbon atoms, and the ring A may further have a substituent in addition to $Y^A$ and $R^A$, wherein P¹ represents a hydroxy protective group capable of being deprotected by a weak acid, and a liquid phase synthesis method is used, where the method includes in the following order;

a step A: a step of deprotecting a terminal protective group at a 5-position of a ribose structure in a nucleic acid compound in which the structure represented by Formula (1) is bonded to a terminal at a 3-position of the ribose structure, a step B: a step of reacting the nucleic acid compound obtained in the step A and a nucleic acid compound in which a 3-position of a ribose structure is subjected to phosphoramidation and a hydroxy group at a 5-position of the ribose structure is protected by a protective group capable of being deprotected by a weak acid, to be condensed by a phosphite triester bond, a step C: a step of reacting the nucleic acid compound obtained in the step B with an oxidizing agent or a sulfurizing agent to convert the phosphite triester bond of the nucleic acid compound into a phosphate triester bond or a thiophosphate triester bond, and a step D: a step of precipitating the nucleic acid compound obtained in the step C.

2. The method of producing a nucleic acid compound according to claim 1,
wherein R¹ in Formula (2) is an oxygen atom or a sulfur atom, and R² is a hydroxy group.

3. The method of producing a nucleic acid compound according to claim 1,
wherein L in Formula (2) is a group represented by Formula (1L),

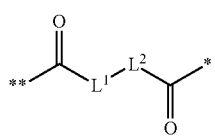
(1L)

in Formula (1L), * represents a bonding position to $Y^A$,
** represents a bonding position to an oxygen atom at a 3-position of a ribose structure,
$L^1$ represents an alkylene group having 1 to 22 carbon atoms,
$L^2$ represents a single bond or #—C(=O)N($R^{2L}$)—$R^{1L}$—N($R^{3L}$)—##,
# represents a bonding position to $L^1$,
represents a bonding position to C=O,
$R^{1L}$ represents an alkylene group having 1 to 22 carbon atoms,
$R^{2L}$ and $R^{3L}$ each independently represent a hydrogen atom or an alkyl group having 1 to 22 carbon atoms, and
$R^{2L}$ and $R^{3L}$ may be bonded to each other.

4. The method of producing a nucleic acid compound according to claim 1,
wherein the total number of carbon atoms of all aliphatic hydrocarbon groups contained in all $R^A$'s is 36 to 80.

5. The method of producing a nucleic acid compound according to claim 1,
wherein the structure represented by Formula (1) has a structure represented by any one of Formula (10), (20), or (30),

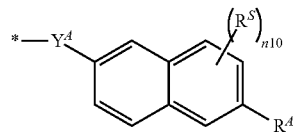
(10)

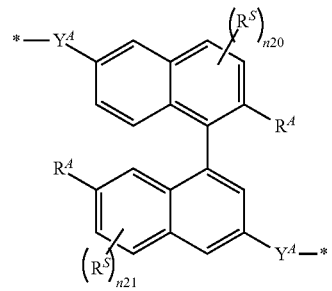
(20)

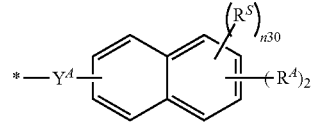
(30)

in Formula (10), Formula (20), or Formula (30), $Y^A$'s each independently represent *—OCR₂—**, *—NRCR₂—**, or *—SCR₂—,  represents a bonding position to a naphthalene ring, * represents a bonding position to L in Formula (2), R's each independently represent a hydrogen atom, an alkyl group, an aromatic group, or an aromatic group-substituted alkyl group, $R^A$'s are each independently an aliphatic hydrocarbon group or an organic group having an aliphatic hydrocarbon group, where at least one aliphatic hydrocarbon group in one $R^A$ or two $R^A$'s has 12 or more carbon atoms, $R^S$'s each independently represent a substituent, n10 represents an integer of 0 to 6, and n20, n21, and n30 each independently represent an integer of 0 to 5.

6. The method of producing a nucleic acid compound according to claim 5,
wherein $R^A$'s in Formula (10), Formula (20), or Formula (30) are each independently a group represented by Formula (f1) or Formula (a1),

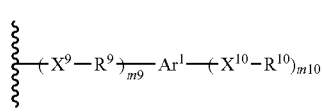
(f1)

in Formula (f1), a wavy line portion represents a bonding position to a naphthalene ring, m9 represents an integer of 1 to 3, $X^9$'s each independently represent a single bond, —O—, —S—, —COO—, —OCO—, —OCONH—, —NHCONH—, —NHCO—, or —CONH—, $R^9$'s each independently represent a divalent aliphatic hydrocarbon group, $Ar^1$ represents an (m10+1)-valent aromatic group or an (m10+1)-valent heteroaromatic group, where m10 represents an integer of 1 to 3, $X^{10}$'s each independently represent a single bond, —O—, —S—, —COO—, —OCO—, —OCONH—, —NHCONH—, —NHCO—, or —CONH—, and $R^{10}$'s each independently represent a monovalent aliphatic hydrocarbon group having 5 or more carbon atoms,

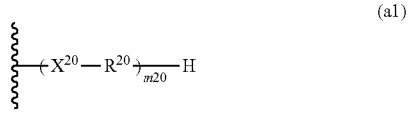
(a1)

in Formula (a1), a wavy line portion represents a bonding position to a naphthalene ring, m20 represents an integer of 1 to 10, $X^{20}$'s each independently represent a single bond, —O—, —S—, —COO—, —OCO—, —OCONH—, —NHCONH—, —NHCO—, or —CONH—, and $R^{20}$'s each independently represent a divalent aliphatic hydrocarbon group, where at least one $R^{20}$ is a divalent aliphatic hydrocarbon group having 5 or more carbon atoms.

7. The method of producing a nucleic acid compound according to claim 6,
wherein the group represented by Formula (f1) is a group represented by Formula (f2),

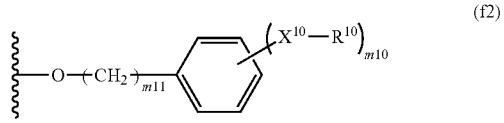
(f2)

in Formula (f2), a wavy line portion represents a bonding position to a naphthalene ring, m10 represents an integer of 1 to 3, m11 represents an integer of 1 to 3, $X^{10}$'s each independently represent a single bond, —O—, —S—, —COO—, —OCO—, —OCONH—, —NHCONH—, —NHCO—, or —CONH—, and $R^{10}$'s each independently represent a monovalent aliphatic hydrocarbon group having 5 or more carbon atoms.

8. The method of producing a nucleic acid compound according to claim 1,
wherein the at least one aliphatic hydrocarbon group in the one or more $R^A$'s has 14 or more carbon atoms.

9. The method of producing a nucleic acid compound according to claim 1,
wherein the total number of carbon atoms of all aliphatic hydrocarbon groups contained in all $R^A$'s is 40 or more.

10. A method of producing a nucleic acid compound,
wherein a nucleic acid compound in which a 3-position of a ribose structure is protected by a structure represented by Formula (1) is used,

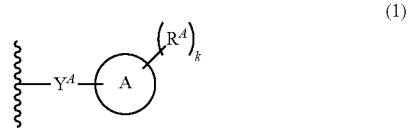
(1)

in Formula (1), a ring A represents a naphthalene ring,
$Y^A$ represents *—OCR$_2$—**, *—NRCR$_2$—**, or *—SCR$_2$—**, where R's each independently represent a hydrogen atom, an alkyl group, an aromatic group, or an aromatic group-substituted alkyl group,
k represents an integer of 1 to 5,
a wavy line portion and * represent a bonding position to L in Formula (2), ** represents a bonding position to the ring A, $R^A$'s are each independently an aliphatic hydrocarbon group or an organic group having an aliphatic hydrocarbon group, where at least one aliphatic hydrocarbon group in k pieces of $R^A$'s has 12 or more carbon atoms, and
the ring A may further have a substituent in addition to $Y^A$ and $R^A$,
wherein the nucleic acid compound protected by the structure represented by Formula (1) is a compound represented by Formula (2),

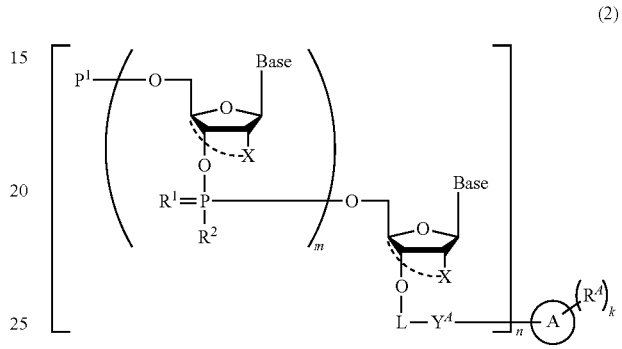
(2)

in Formula (2), m represents any integer of 0 or more,
n represents 1 to 6,
Bases each independently represent a nucleic acid base or a modified nucleic acid base,
$P^1$ represents a hydrogen atom or a hydroxy protective group,
$R^1$ represents an oxygen atom, a sulfur atom, or a borano group,
$R^2$ represents a hydrogen atom, a substituted or unsubstituted hydroxy group, a substituted or unsubstituted mercapto group, a substituted or unsubstituted alkyl group, or a substituted or unsubstituted amino group,
X's each independently represent a hydrogen atom, a hydroxy group, a halogen atom, or an organic group that is crosslinked to a carbon atom at a 4'-position of a ribose structure,
L's each independently represent a single bond or a divalent linking group,
the ring A represents a naphthalene ring,
$Y^A$'s each independently represent a single bond, *—OCR$_2$—**, *—NRCR$_2$—**, or *—SCR$_2$—**,
where * represents a bonding position to L,
** represents a bonding position to the ring A,
R's each independently represent a hydrogen atom, an alkyl group, an aromatic group, or an aromatic group-substituted alkyl group,
adjacent L and $Y^A$ do not simultaneously represent a single bond,
k represents an integer of 1 to 5,
$R^A$'s are each independently an aliphatic hydrocarbon group or an organic group having an aliphatic hydrocarbon group, where at least one aliphatic hydrocarbon group in k pieces of $R^A$'s has 12 or more carbon atoms, and
the ring A may further have a substituent in addition to $Y^A$ and $R^A$,
wherein P1 represents a hydrogen atom, and
a liquid phase synthesis method is used, where the method includes in the following order;

a step B: a step of reacting the nucleic acid compound in which the structure represented by Formula (1) is bonded to a terminal at a 3-position of a ribose structure, and a nucleic acid compound in which a 3-position of a ribose structure is subjected to phosphoramidation and a hydroxy group at a 5-position of the ribose structure is protected by a protective group capable of being deprotected by a weak acid, to be condensed by a phosphite triester bond, a step C: a step of reacting the nucleic acid compound obtained in the step B with an oxidizing agent or a sulfurizing agent to convert the phosphite triester bond of the nucleic acid compound into a phosphate triester bond or a thiophosphate triester bond, a step A: a step of deprotecting a terminal protective group at a 5-position of the nucleic acid compound obtained in the step C, and a step D: a step of precipitating the nucleic acid compound obtained in the step A.

11. A nucleic acid compound, wherein a hydroxy group of a 3-position of a ribose structure is protected by a structure represented by Formula (1a),

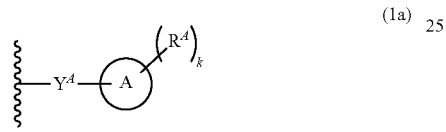

(1a)

in Formula (1a), a ring A represents a naphthalene ring, $Y^A$ represents *—$OCR_2$—**, *—$NRCR_2$—**, or *—$SCR_2$—**, R's each independently represent a hydrogen atom, an alkyl group, an aromatic group, or an aromatic group-substituted alkyl group, k represents an integer of 1 to 5, a wavy line portion and * represent a bonding position to a hydroxy group at a 3-position of a ribose structure,

** represents a bonding position to a ring A, $R^A$'s are each independently an aliphatic hydrocarbon group or an organic group having an aliphatic hydrocarbon group, where at least one aliphatic hydrocarbon group in k pieces of $R^A$'s has 12 or more carbon atoms, and the ring A may further have a substituent in addition to $Y^A$ and $R^A$.

12. The nucleic acid compound according to claim 11, wherein the nucleic acid compound protected by the structure represented by Formula (1a) is a compound represented by Formula (2),

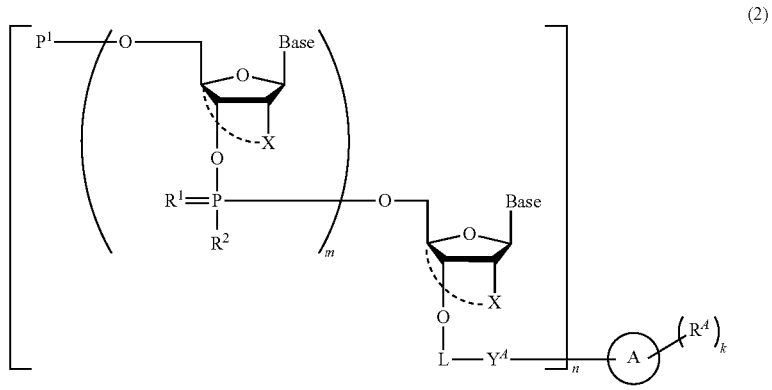

(2)

in Formula (2), m represents any integer of 0 or more,
n represents 1 to 6,
Bases each independently represent a nucleic acid base or a modified nucleic acid base,
$P^1$ represents a hydrogen atom or a hydroxy protective group,
$R^1$ represents an oxygen atom, a sulfur atom, or a borano group,
$R^2$ represents a hydrogen atom, a substituted or unsubstituted hydroxy group, a substituted or unsubstituted mercapto group, a substituted or unsubstituted alkyl group, or a substituted or unsubstituted amino group,
X's each independently represent a hydrogen atom, a hydroxy group, a halogen atom, or an organic group that is crosslinked to a carbon atom at a 4'-position of a ribose structure,
L's each independently represent a single bond or a divalent linking group,
the ring A represents a naphthalene ring,
$Y^A$'s each independently represent a single bond, *—$OCR_2$—**, *—$NRCR_2$—**, or *—$SCR_2$—**,
where * represents a bonding position to L,
** represents a bonding position to the ring A,
R's each independently represent a hydrogen atom, an alkyl group, an aromatic group, or an aromatic group-substituted alkyl group,
adjacent L and $Y^A$ do not simultaneously represent a single bond,
k represents an integer of 1 to 5,
$R^A$'s are each independently an aliphatic hydrocarbon group or an organic group having an aliphatic hydrocarbon group, where at least one aliphatic hydrocarbon group in k pieces of $R^A$'s has 12 or more carbon atoms, and
the ring A may further have a substituent in addition to $Y^A$ and $R^A$.

13. The nucleic acid compound according to claim 12,
wherein $R^1$ in Formula (2) is an oxygen atom or a sulfur atom, and $R^2$ is a hydroxy group.

14. The nucleic acid compound according to claim 12,
wherein L in Formula (2) is a group represented by Formula (1L),

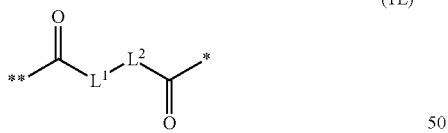

(1L)

in Formula (1L), * represents a bonding position to $Y^A$,
** represents a bonding position to an oxygen atom at a 3-position of a ribose structure,
$L^1$ represents an alkylene group having 1 to 22 carbon atoms,
$L^2$ represents a single bond or #—C(=O)N($R^{2L}$)—$R^{1L}$—N($R^{3L}$)—##,
# represents a bonding position to $L^1$,
represents a bonding position to C=O,
$R^{1L}$ represents an alkylene group having 1 to 22 carbon atoms,
$R^{2L}$ and $R^{3L}$ each independently represent a hydrogen atom or an alkyl group having 1 to 22 carbon atoms, and
$R^{2L}$ and $R^{3L}$ may be bonded to each other.

15. The nucleic acid compound according to claim 11,
wherein the structure represented by Formula (1a) has a structure represented by any one of Formula (10), (20), or (30),

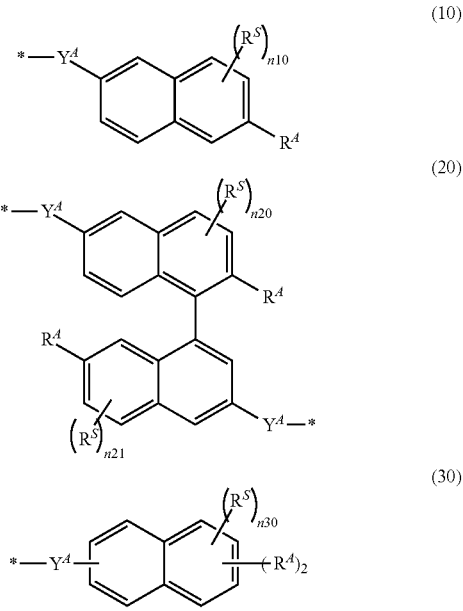

in Formula (10), Formula (20), or Formula (30), $Y^A$'s each independently represent *—$OCR_2$—**, *—$NRCR_2$—**, or *—$SCR_2$—,  represents a bonding position to a naphthalene ring, * represents a bonding position to a hydroxy group at a 3-position of a ribose structure, R's each independently represent a hydrogen atom, an alkyl group, an aromatic group, or an aromatic group-substituted alkyl group, $R^A$'s are each independently an aliphatic hydrocarbon group or an organic group having an aliphatic hydrocarbon group, where at least one aliphatic hydrocarbon group in one $R^A$ or two $R^A$'s has 12 or more carbon atoms, $R^S$'s each independently represent a substituent, n10 represents an integer of 0 to 6, and n20, n21, and n30 each independently represent an integer of 0 to 5.

* * * * *